US008886046B2

(12) United States Patent
Masarik

(10) Patent No.: US 8,886,046 B2
(45) Date of Patent: Nov. 11, 2014

(54) INTRAPERSONAL DATA COMMUNICATION SYSTEM

(71) Applicant: N2 Imaging Systems, LLC, Irvine, CA (US)

(72) Inventor: David Michael Masarik, Newport Beach, CA (US)

(73) Assignee: N2 Imaging Systems, LLC, Irvine, CA (US)

( * ) Notice: Subject to any disclaimer, the term of this patent is extended or adjusted under 35 U.S.C. 154(b) by 0 days.

(21) Appl. No.: 14/208,984

(22) Filed: Mar. 13, 2014

(65) Prior Publication Data

US 2014/0270800 A1    Sep. 18, 2014

Related U.S. Application Data

(60) Provisional application No. 61/783,640, filed on Mar. 14, 2013.

(51) Int. Cl.
*H04B 10/00* (2013.01)
*H04B 10/114* (2013.01)

(52) U.S. Cl.
CPC .................. *H04B 10/1141* (2013.01)
USPC ............................ 398/131; 398/113; 398/114

(58) Field of Classification Search
USPC .......... 398/107, 113, 115, 116, 117, 114, 131
See application file for complete search history.

(56) References Cited

U.S. PATENT DOCUMENTS

| 2,901,750 | A | 9/1959 | McMurry |
|---|---|---|---|
| 2,901,751 | A | 9/1959 | Gales et al. |
| 2,908,943 | A | 10/1959 | Miller |
| 3,320,619 | A | 5/1967 | Lastnik et al. |
| 3,413,656 | A | 12/1968 | Vogliano et al. |
| 4,044,399 | A | 8/1977 | Morton |
| 4,605,281 | A | 8/1986 | Hellewell |
| 4,786,966 | A | 11/1988 | Hanson et al. |
| 4,792,206 | A | 12/1988 | Skuratovsky |

(Continued)

FOREIGN PATENT DOCUMENTS

WO    WO 2013/119983    8/2013

OTHER PUBLICATIONS

Abei et al., *EBAPS: Next Generation, Low Power, Digital Night Vision*, Presented at the OPTRO 2005 International Symposium, pp. 1-10, May 10, 2005, Paris, France.

(Continued)

*Primary Examiner* — Dalzid Singh
(74) *Attorney, Agent, or Firm* — Knobbe, Martens, Olson & Bear LLP

(57) ABSTRACT

Intrapersonal communication systems and methods that provide an optical digital signal link between two or more local devices are disclosed. In some embodiments, the system includes a first signal converter disposed at a first end of the optical digital signal link and configured to convert between electrical digital signals from a first local device and optical digital signals from the optical digital signal link. The system can include an optical connector having a non-contact portion configured to couple optical digital signals between the first signal converter and the optical digital signal link across a gap. The system can include a second signal converter disposed at a second end of the optical digital signal link and configured to convert between electrical digital signals from the second local device and optical digital signals from the optical digital signal link.

20 Claims, 30 Drawing Sheets

(56) References Cited

U.S. PATENT DOCUMENTS

| | | | |
|---|---|---|---|
| 4,840,451 A | 6/1989 | Sampson et al. | |
| 5,005,213 A | 4/1991 | Hanson et al. | |
| 5,128,807 A | 7/1992 | Blackmon | |
| 5,359,675 A | 10/1994 | Siwoff | |
| 5,448,161 A | 9/1995 | Byerley, III et al. | |
| 5,535,053 A | 7/1996 | Baril et al. | |
| 5,668,904 A | 9/1997 | Sutherland et al. | |
| 5,687,271 A | 11/1997 | Rabinowitz | |
| 5,711,104 A | 1/1998 | Schmitz | |
| 5,847,753 A | 12/1998 | Gabello et al. | |
| 5,949,565 A | 9/1999 | Ishida | |
| 5,953,761 A | 9/1999 | Jurga et al. | |
| 5,956,444 A | 9/1999 | Duda et al. | |
| 6,057,966 A | 5/2000 | Carroll et al. | |
| 6,200,041 B1 | 3/2001 | Gaio et al. | |
| 6,272,692 B1 | 8/2001 | Abraham | |
| 6,327,381 B1 | 12/2001 | Rogina et al. | |
| 6,404,961 B1 | 6/2002 | Bonja et al. | |
| 6,690,866 B2 | 2/2004 | Bonja et al. | |
| 6,714,708 B2 | 3/2004 | McAlpine et al. | |
| 7,016,579 B2 | 3/2006 | Militaru et al. | |
| 7,096,512 B2 | 8/2006 | Blair | |
| 7,128,475 B2 | 10/2006 | Kesler | |
| 7,488,294 B2 | 2/2009 | Torch | |
| 7,690,849 B2 | 4/2010 | Scharf et al. | |
| 7,710,654 B2 | 5/2010 | Ashkenazi et al. | |
| 7,744,286 B2 | 6/2010 | Lu et al. | |
| 7,787,012 B2 | 8/2010 | Scales et al. | |
| 7,832,023 B2 | 11/2010 | Crisco | |
| 7,899,332 B2 | 3/2011 | Shindou et al. | |
| 7,952,059 B2 | 5/2011 | Vitale et al. | |
| 7,972,067 B2 | 7/2011 | Haley et al. | |
| 8,014,679 B2 | 9/2011 | Yamazaki | |
| 8,488,969 B1 * | 7/2013 | Masarik | 398/114 |
| 2004/0242976 A1 | 12/2004 | Abreu | |
| 2006/0048286 A1 | 3/2006 | Donato | |
| 2007/0026695 A1 | 2/2007 | Lee et al. | |
| 2007/0035626 A1 | 2/2007 | Randall et al. | |
| 2008/0309586 A1 | 12/2008 | Vitale | |
| 2008/0317474 A1 | 12/2008 | Wang et al. | |
| 2010/0149073 A1 | 6/2010 | Chaum et al. | |
| 2010/0308999 A1 | 12/2010 | Chornenky | |
| 2011/0187563 A1 | 8/2011 | Sanders-Reed | |
| 2011/0213664 A1 | 9/2011 | Osterhout et al. | |
| 2011/0214082 A1 | 9/2011 | Osterhout et al. | |
| 2014/0050485 A1 | 2/2014 | Masarik et al. | |

OTHER PUBLICATIONS

Tao et al., 10Gb/s CMOS Limiting Amplifier for Optical links, Proceedings of the 29$^{th}$ European Solid-State Circuits Conference, Sep. 16-18, 2013, pp. 285-287, Estoril, Portugal, in 3 pages.

PCT Application No. PCT/US2013/025385 Search Report and Written Opinion mailed Jun. 26, 2013, in 17 pages.

U.S. Appl. No. 13/674,895, filed Nov. 12, 2012, titled Intrapersonal Data Communications System, listing David Michael Masarik as an inventor, in 94 pages, and its entire prosecution history.

Sklarek, *High Data Rate Capabilities of Multicore Glass Optical Fiber Cables*, 22. FGT "Otische Polymerfasern", htt://www.pofac.de/downloads/itgfg/fgt2.2/FGT2.2_Munchen_Sklarek_GOF-Buendel, dated Oct. 25, 2006 in 19 pages.

Schott Glass Made of Ideas, GBPS-MC-GOF-Demo, Dated Jan. 2006 in 8 pages.

* cited by examiner

INTRAPERSONAL DATA COMMUNICATION SYSTEM

RELATED APPLICATIONS

This application claims the benefit of priority to U.S. Provisional Patent Application No. 61/783,640, filed Mar. 14, 2013, entitled "Intrapersonal Data Communication System". The entire contents of the application referenced in this paragraph are incorporated by reference herein and made a part of this specification.

BACKGROUND

1. Field

This disclosure relates generally to communication systems and to intrapersonal data communication systems and methods.

2. Description of Related Art

An intrapersonal data communication system can include a data connection that covers only a few feet or meters of personal space. Such a system can provide interconnection between two or more local devices. Local devices can include, for example, devices that are positioned near a person's body; attached to clothing, headgear, or other personal accessories; or held in a hand. A local device is local from the perspective of a user who is attempting to access services using the local device. Computers, telephones, cameras, goggles, sights, smartphones, battery packs, data processing systems, and other electrical devices can be local devices.

SUMMARY

Example embodiments described herein have innovative features, no single one of which is indispensable or solely responsible for their desirable attributes. Without limiting the scope of the claims, some of the advantageous features will now be summarized.

Some embodiments provide for a headgear system having an interference-resistant optical digital signal link configured to transmit optical digital signals between two or more local devices. The headgear system can include an exterior shell and a guide path adjacent to the exterior shell, the guide path being configured to direct the optical digital signal link between a first optical connector having a non-contact portion and a second optical connector having a non-contact portion. The headgear system can include a first signal converter having a first local device electrical data interface and a first optical data interface, wherein the first local device electrical data interface is configured to electrically connect to a first electrical data connector of a first local device, and wherein the first signal converter is configured to convert between electrical digital signals and optical digital signals. The first optical connector of the headgear system can have a non-contact portion configured to couple optical digital signals between the first optical data interface of the first signal converter and a first end of the interference-resistant optical digital signal link across a first gap. The headgear system can include a second signal converter having a second local device electrical data interface and a second optical data interface, wherein the second local device electrical data interface is configured to electrically connect to a second electrical data connector of a second local device, and wherein the second signal converter is configured to convert between electrical digital signals and optical digital signals. The second optical connector can have a non-contact portion configured to couple optical digital signals between the second optical data interface of the second signal converter and a second end of the interference-resistant optical digital signal link across a second gap.

In some implementations, the first signal converter further comprises an optical transceiver configured to send and receive the optical digital signals. In a further implementation, the headgear system can include a controller configured to direct electrical power to the optical transceiver. In a further implementation, the controller can be configured to direct less than or equal to about 500 mW of electrical power to the optical transceiver during transmission of the optical digital signals. In some implementations, the optical transceiver is configured to operate at a transmission rate that is less than or equal to about 10 Gbps. In some implementations, the controller is configured to direct less than or equal to about 50 mW of electrical power to the optical transceiver during transmission of information between the first and second local devices and the transmission of information occurs at a data rate that is less than or equal to about 2 Gbps.

In some implementations, the interference-resistant optical digital signal link includes a radiation shield comprising an elongate tube having a metallic material layer, one or more optical fibers disposed within the elongate tube with axes substantially parallel to an elongate axis of the shielding member, and one or more insulated wires disposed within the elongate tube with axes substantially parallel to the elongate axis of the shielding member configured to transmit an electrical signal. In some implementations, the first local device is a visualization system. In some implementations, the second local device is a data processing system. In some implementations, the guide path comprises a path between an interior surface of the exterior shell and an inner padding of the headgear system. In some implementations, the headgear system can include a mount interface configured to substantially secure the first local device to the headgear system.

Some embodiments provide for a method of providing a signal link between two or more local devices using an interference-resistant optical digital signal link coupled to a headgear system. The method can include directing an interference-resistant optical digital signal link along a guide path between a first optical connector having a non-contact portion and a second optical connector having a non-contact portion. The method can include using a first signal converter, converting a first electrical digital signal to an optical digital signal, wherein the first signal converter comprises a first local device electrical data interface and a first optical data interface, wherein the first local device electrical data interface is configured to electrically connect to a first electrical data connector of a first local device, and wherein the first optical data interface comprises the first optical connector having a non-contact portion. The method can include using the first optical connector having a non-contact portion, coupling the optical digital signal from the first optical data interface of the first signal converter to a first end of the interference-resistant optical digital signal link across a first gap. The method can include using a second signal converter, converting the output digital signal to a second electrical digital signal, wherein the second signal converter comprises a second local device electrical data interface and a second optical data interface, wherein the second local device electrical data interface is configured to electrically connect to a second electrical data connector of a second local device, and wherein the second optical data interface comprises the second optical connector having a non-contact portion. The method can include using the second optical connector having a non-contact portion, coupling the optical digital signal from the second optical data interface of the second signal converter and a second end of the interference-resistant optical digital signal link across a second gap.

In some implementations, the first and second signal converters consume less than or equal to about 500 mW of power during transmission of information between the first and second local devices. In a further implementation, the transmission of information occurs at a data rate that is less than or equal to about 10 Gbps. In some implementations, the first and second signal converters consume less than or equal to about 50 mW of power during transmission of information between the first and second local devices and the transmission of information occurs at a data rate that is less than or equal to about 2 Gbps.

In some implementations, the interference-resistant optical digital signal link includes a radiation shield comprising an elongate tube having a metallic material layer, one or more optical fibers disposed within the elongate tube with axes substantially parallel to an elongate axis of the shielding member, and one or more insulated wires disposed within the elongate tube with axes substantially parallel to the elongate axis of the shielding member configured to transmit an electrical signal. In some implementations, coupling the optical digital signal from the first optical data interface of the first signal converter to the first end of the interference-resistant optical digital signal link includes collimating the optical digital signal using a collimator in the first optical connector having a non-contact portion, transmitting the collimated optical digital signal across the first gap between the collimator and the interference-resistant optical digital signal link, and focusing the collimated optical digital signal to a region substantially within a fiber optic disposed within the interference-resistant optical digital signal link thereby coupling the optical digital signal to the interference-resistant optical digital signal link. In some implementations, the first local device is a visualization system. In some implementations, the second local device is a data processing system. In some implementations, the first digital electrical signal comprises video data.

BRIEF DESCRIPTION OF THE DRAWINGS

Various embodiments are depicted in the accompanying drawings for illustrative purposes, and should in no way be interpreted as limiting the scope of claimed embodiments. In addition, various features of different disclosed embodiments can be combined to form additional embodiments, which are part of this disclosure. Any feature or structure can be removed or omitted. Throughout the drawings, reference numbers can be reused to indicate correspondence between reference elements.

DETAILED DESCRIPTION

Figure 1A:
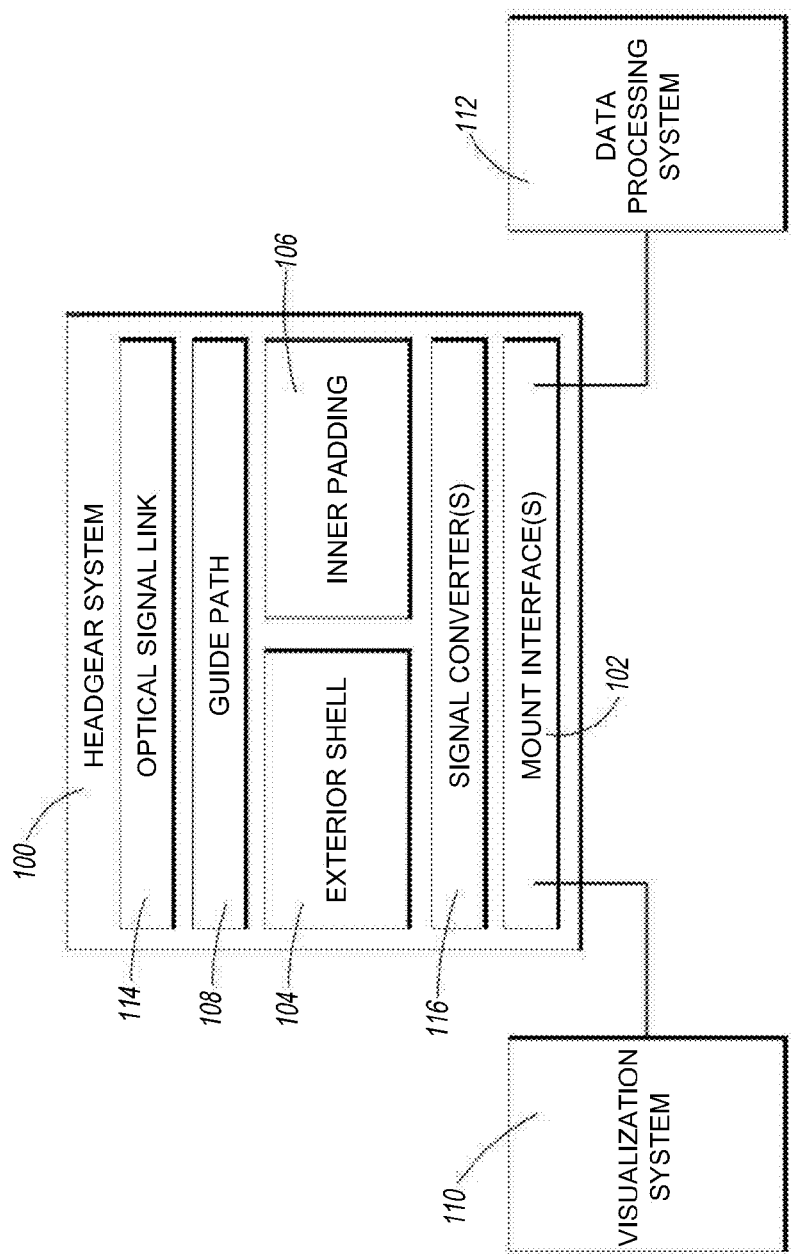
FIG. 1A illustrates a block diagram representation of a headgear system according to some embodiments.

Although certain embodiments and examples are disclosed herein, inventive subject matter extends beyond the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process can be performed in any suitable sequence and are not necessarily limited to any particular disclosed sequence. Various operations can be described as multiple discrete operations in turn, in a manner that can be helpful in understanding certain embodiments; however, the order of description should not be construed to imply that these operations are order dependent. Additionally, the structures described herein can be embodied as integrated components or as separate components. For purposes of comparing various embodiments, certain aspects and advantages of these embodiments are described. Not necessarily all such aspects or advantages are achieved by any particular embodiment. Thus, for example, various embodiments can be carried out in a manner that achieves or optimizes one advantage or group of advantages as taught herein without necessarily achieving other aspects or advantages as can also be taught or suggested herein.

It is contemplated that the particular features, structures, or characteristics of any embodiments discussed herein can be combined in any suitable manner in one or more separate embodiments not expressly illustrated or described. In many cases, structures that are described or illustrated as unitary or contiguous can be separated while still performing the function(s) of the unitary structure. In many instances, structures that are described or illustrated as separate can be joined or combined while still performing the function(s) of the separated structures.

Local devices and intrapersonal electrical systems can be configured to communicate with one another using an intrapersonal data communication system. Such communication can permit, for example, processing and display of real-time video feeds supplemented by relevant and appropriate information. The amount of information to be processed and displayed can be achieved by intrapersonal data communication systems that operate at a data rate suitable for transferring digital video. To be mobile and suited for practical use when away from convenient recharging stations, an intrapersonal data communication system that consumes a relatively low amount of power can be advantageous. Considering mobility, an intrapersonal data communication system advantageously can be relatively lightweight and of a small form factor, in addition to consuming a relatively low amount of power. In addition, traditional wired communications can be susceptible to electromagnetic interference in certain environments, rendering high-bandwidth communication difficult, unreliable, and/or impracticable. Wireless communications can also be susceptible to interference from electromagnetic sources and to surreptitious interception. Accordingly, some embodiments provided herein disclose an intrapersonal data communication system that is configured to operate at a data rate sufficient for digital video transmission, to use relatively low power, to be lightweight, to have a small form factor, to be resistant to electromagnetic interference ("EMI"), to be secure, to be resistant to damage, and/or to provide robust data connections in environments traditionally adverse to wired communication (e.g., outdoors, dusty environments, muddy environments, environments with excessive moisture, etc.).

Some embodiments disclosed herein provide a relatively high-bandwidth, low-power, light-weight intrapersonal data communication system that can incorporate data streams from lower bandwidth sources. For example, a lower bandwidth source can include sensors that are within or mounted on a headgear system, coupled to an external system such as a weapon or firearm, mounted or attached to clothing or a backpack, or other external but localized system. The lower bandwidth data streams can be delivered to the relatively high-bandwidth intrapersonal data communication system described herein by electrical wire, fiber optic connection, RF link, EMI-resistant wireless communication or other suitable intrapersonal link. In some implementations, the lower bandwidth data streams are delivered to the relatively high-bandwidth intrapersonal data communication system in such a way as to reduce, minimize, or eliminate cables that may be susceptible to snagging, catching, or otherwise incurring damage during use or operation.

Overview of Headgear Systems Having an Intrapersonal Data Communication System Some embodiments provide for a headgear system having an intrapersonal data communication system. The intrapersonal data communication system can be configured to transmit and/or propagate signals between local devices of the headgear system, between components of the intrapersonal data communication system, between local devices and external systems, and/or between components of the headgear system and external systems. The intrapersonal data communication system can include an optical signal cable that is configured to provide a communication link between devices, systems, and components wherein the optical signal cable transmits optical digital signals and/or electrical voltages. The intrapersonal data communication system can include components configured to couple signals across an interface between segments of the optical signal cable, an interface between the optical signal cable and a local device, and/or an interface between the optical signal cable and an external system. For example, the intrapersonal data communication system can include optical digital signal bridges and/or optical digital signal adapters configured to send and receive optical digital signals, electrical digital signals, and/or electrical voltages.

The headgear system can include one or more local devices coupled to the headgear system through one or more mount interfaces. For example, the headgear system can include a visualization system that can be configured to acquire image data and/or display information to a user. The visualization system can include, for example, a thermal camera and display, a night-vision goggle, an infrared imager and display, or the like. The visualization system can be coupled to the headgear system through a mount interface that is configured to move and to position the visualization system in a desired, defined, or suitable location relative to the user. The headgear system can include a data processing system configured to receive information from another local device, process the received information using one or more hardware processors and memory, and store the information and/or send the processed information back to the local device, to a different local device, or to an external system. Similarly, the data processing system can be coupled to the headgear system through a mount interface.

The headgear system can include an intrapersonal data communication system. The intrapersonal data communication system can be configured to provide communication between local devices and/or between a local device and an external system using an optical digital signal link. The optical digital signal link can include one or more elements configured to propagate optical digital signals and one or more elements configured to conduct electrical voltages. For example, the optical digital signal link can include optical fibers configured to propagate optical digital signals and electrical wire to conduct electrical voltages. The optical digital signal link can be configured to propagate signals between, for example, local devices, a local device and an external system, the visualization system and the data processing system, the visualization system and a component external to the headgear system, or the data processing system and a component external to the headgear system.

In some embodiments, the optical digital signal link includes a shielding member comprising an elongate tube having a metallic material layer and an insulation layer. The optical digital signal link can include one or more optical fibers disposed within the elongate tube. The fibers can have elongate axes substantially parallel to the axis of the shielding member. The optical digital signal link can also include one or more insulated wires disposed within the elongate tube with axes substantially parallel to the axis of the shielding member configured to transmit an electrical signal. The optical digital signal link can have a total length that is less than or equal to about 1 m, less than or equal to about 50 cm, or less than or equal to about 30 cm.

In some embodiments, the optical digital signal link comprises a plurality of segments or portions coupled to one another through optical digital signal bridges. The optical digital signal bridges can be configured to provide a communication bridge between segments of the optical digital signal link by providing electrical connectors that electrically couple corresponding elements in coupled segments of the optical digital signal link and optical signal connectors that optically couple corresponding elements in coupled segments of the optical digital signal link.

In some embodiments, the intrapersonal data communication system can include one or more optical digital signal adapters configured to convert electrical digital signals to optical digital signals and/or optical digital signals to electrical digital signals. An optical digital signal adapter can include a transmitter configured to produce an amount of radiation corresponding to an input level of electrical voltage or current. The optical digital signal adapter can include a receiver having a photosensitive element configured to produce an electrical voltage or current corresponding to a detected level of radiation. In some embodiments, the optical digital signal adapter can include electrically conductive elements configured to conduct electrical currents and/or voltages across the adapter. For example, the optical digital signal adapter can be configured to receive an electrical digital signal and convert it to an optical digital signal as well as to receive an electrical voltage and transmit a corresponding electrical voltage. Thus, the optical digital signal adapter receives electrical digital signals and electrical voltages and transmits optical digital signals and electrical voltages that correspond to the respective input signals and voltages. Similarly, the optical digital signal adapter can be configured to receive optical digital signals and convert the received signals into electrical digital signals as well as transmit received electrical voltages. Thus, the optical digital signal adapter receives optical digital signals and electrical voltages and transmits electrical digital signals and electrical voltages that correspond to the respective input signals and voltages. In some embodiments, a local device can include a signal converter that is configured to send and receive optical digital signals and therefore such local device uses an optical digital signal bridge to couple to the optical digital signal link rather than an optical digital signal adapter.

An optical digital signal can be transmitted between elements and/or segments of the intrapersonal data communication system, including local devices, using non-contact optical connectors. For example, an optical digital signal bridge can include a non-contact optical connector that is configured to transmit an optical digital signal from a first segment of the optical digital signal link across a gap to a second segment of the optical digital signal link. A local device can include a non-contact optical connector that is configured to couple an optical digital signal to a corresponding non-contact optical connector that is coupled to the optical digital signal link. Similarly, an optical digital signal adapter can include a non-contact optical connector that is configured to transmit an optical digital signal produced by the adapter to a corresponding non-contact optical connector that is coupled to the optical digital signal link.

The intrapersonal data communication system can include optical signal communication links which can include optical digital signal bridges and/or optical digital signal adapters. An optical signal communication link can be configured to couple electrical voltages and optical digital signals between segments of the optical digital signal link, between a local device and a segment of the optical digital signal link, or between other components of the intrapersonal data communication system. In some embodiments, the optical signal communication link can include a connector having a first surface that is configured to releasably mate with or couple to a first surface on a complementary connector that is part of a local device, an optical digital signal bridge, an optical digital signal adapter, or other component of the intrapersonal data communication system. The optical signal communication link can include a plurality of connector elements disposed on the first surface of the connector that are configured to couple to complementary elements on the first surface of the complementary connector. For an optical digital signal adapter or local device, for example, the plurality of connector elements can include a power connector element configured to transmit an electrical voltage, a return connector element configured to transmit an electrical voltage, and a digital signal pin configured to transmit an electrical digital signal. For an optical digital signal adapter or local device, for example, the plurality of connector elements can include the power connector element and the return connector element, as above, and can include a non-contact optical connector configured to transmit an optical digital signal. In some embodiments, the plurality of connector pins can include a redundant power connector element configured to transmit an electrical voltage, a redundant return connector element configured to transmit an electrical voltage, additional digital signal pins configured to transmit electrical digital signals, and/or additional non-contact optical connectors configured to transmit optical digital signals.

The optical digital signal adapter or local device can include a fiber optic transmitter which includes a radiation source and an integrated circuit configured to control a radiation output from the radiation source, the radiation output corresponding to a transmitter input signal. The transmitter input signal can include signals such as, for example, an electrical digital signal from the visualization system, an electrical digital signal from the data processing system, a multiplexed electrical digital signal, or any combination of these. In some embodiments, the optical signal adapter or local device can include a fiber optic receiver configured to receive an optical digital signal and produce an electrical digital signal. The fiber optic receiver can be configured to produce an electrical signal corresponding to an amount of input radiation using a photodetector, a transimpedance amplifier, and a limiting amplifier.

In some embodiments, a non-contact optical connector on an optical signal communication link can include an optical system for substantially collimating output radiation or focusing input radiation for transmission between optical fibers or waveguides in a corresponding optical signal communication link. The optical system of the non-contact optical connector can include a collimating or focusing lens that is disposed in a cavity of the connector wherein the lens is positioned less than or equal to about 1 mm from a surface of the connector, less than or equal to about 0.5 mm from the surface of the connector, or less than or equal to about 0.25 mm from the surface of the connector. In some embodiments, a non-contact optical connector on a first optical signal communication link can include a tightly bundled group of optical fibers configured to receive an optical digital signal after transmission through the optical system. The optical system and/or tightly bundled group of optical fibers can be configured to reduce optical signal losses between optical signal communication links caused by angular misalignment and/or position displacement between coupled non-contact optical connectors. In some embodiments, the non-contact optical connector includes a transparent window configured to have a surface that is substantially co-planar with the surface of the optical signal communication link to provide protection to the optical system or fiber bundle and/or provide a surface that is accessible for cleaning.

In some embodiments, the intrapersonal data communication system can include a multiplexor configured to create an output multiplexed digital signal from multiple digital signals. In some embodiments, the intrapersonal data communication system includes a demultiplexor that can be configured to create multiple output demultiplexed digital signals from an input digital signal. The intrapersonal data communication system can include a single- or dual-spectral band, bi-directional or duplex communication system that uses optical systems, collimating elements, focusing elements, splitters, and/or optical filters for bi-directional optical communication across the optical digital signal link.

Some embodiments provide for an optical signal cable that includes an optical digital signal bridge at a distal end. The optical signal cable can comprise an elongate tube having an insulating member and a shielding member, wherein the optical signal includes, disposed within the elongate tube, a power line configured to transmit an electrical voltage or current, a return line configured to transmit an electrical voltage or current, and fiber optic cable configured to transmit an optical digital signal. The optical digital signal bridge includes a connector interface having a connector surface wherein the connector surface includes a plurality of connector elements including a power connector element electrically coupled to the power line, a return connector element electrically coupled to the return line, and a non-contact optical connector optically coupled to the fiber optic cable. In some embodiments, the optical signal cable can include additional power lines, return lines, and/or fiber optic cables with corresponding connector elements on the optical digital signal bridge. In some embodiments, the optical digital signal bridge can include an alignment mechanism configured to align the connector surface with a corresponding connector interface of a local device, optical digital signal adapter, optical digital signal bridge, or other component of the intrapersonal data communication system to establish a functional signal link. For example, a first optical signal cable having an optical digital signal bridge at a distal end can be coupled to a second optical signal cable having an optical digital signal bridge at a proximal end so that a functional signal link is provided between the first and second optical signal cables. As another example, an optical signal cable having an optical digital signal bridge can be coupled to an optical digital signal adapter configured to convert optical digital signals into electrical digital signals and vice versa. In turn, the adapter can be coupled to a local device that is configured to transmit and receive electrical digital signals, thereby creating a link between the local device and the optical signal cable. As another example, an optical signal cable having an optical digital signal bridge can be coupled to a local device that is configured to send and/or receive optical digital signals, thereby creating a link between the local device and the optical digital signal cable. Thus, according to some embodiments, the intrapersonal data communication system can establish communication and power links between local devices and across interfaces using optical signal cables, optical digital signal bridges, and/or optical digital signal adapters.

The headgear system can include a power source configured to supply power to local devices such as the data processing system and the visualization system, to optical digital signal adapters, and/or signal converters. The power source can be any device or system configured to provide power which includes, without limitation, a battery or series of batteries, a fuel cell, a photovoltaic panel, or any combination of these. In some embodiments, the power source provides less than or equal to about 500 mW of electric power, less than or equal to about 200 mW, less than or equal to about 100 mW, or less than or equal to about 50 mW. Some embodiments provide a headgear system where the transmission rate of digital information is based on the situation, and can be less than or equal to about 10 Gbps in situations where real-time, low-latency processing is desired, and can be less than or equal to about 5 kbps in active standby situations, wherein the power source provides in either situation less than or equal to about 500 mW of power, less than or equal to about 200 mW of power, less than or equal to about 100 mW of power, or less than or equal to about 50 mW of power.

Some embodiments provide for a method of transmitting information between local devices, such as between a visualization system and a data processing system, wherein the method includes encoding information from a first local device into an electrical digital signal. The electrical digital signal can be converted to an optical digital signal on the first local device using a signal converter that is part of the first local device or using a first optical digital signal adapter that is coupled to the first local device. The resulting optical digital signal can be coupled to an optical digital signal link and transmitted over the optical digital signal link. The optical digital signal can then be coupled to a second optical digital signal adapter or a second local device having a signal converter where it is converted to a second electrical digital signal that contains substantially the same information as the first electrical digital signal. If the optical digital signal is converted in the second digital signal adapter, the second electrical digital signal can then be coupled to the second local device. The second local device can then decode the second electrical digital signal and process the decoded information. In some embodiments, the intrapersonal data communication system can include a power source and a controller configured to control an amount of power delivered to components of the intrapersonal data communication system. In some embodiments, the controller can be configured to direct an amount of power to the components for transmission of the information between the local devices wherein the average amount of power is less than or equal to about 500 mW with average peak data transmission rates less than or equal to about 10 Gbps. In some embodiments, the controller is configured to direct an average amount of power that is less than or equal to about 200 mW, less than or equal to about 100 mW, less than or equal to about 60 mW, or less than or equal to about 50 mW. In some embodiments, the peak rate of data transmission of the information is less than or equal to about 4 Gbps, less than or equal to about 2 Gbps, less than or equal to about 1 Gbps, or less than or equal to about 5 kbps in active standby situations. In some embodiments, the transmitted information can include, for example, uncompressed video data, compressed video data, thermal data, GPS data, compass data, inertial or rate sensor data, sensor synchronization signals, object location data, or any combination of these or other data.

Some embodiments provide for a method for connecting an interference-resistant cable to a headgear system including a visualization system and a data processing system. The method can include modifying the headgear system such that a path is created between the visualization system and the data processing system for the interference-resistant cable, and putting the interference-resistant cable in the headgear system to create a communication link between the visualization system and the data processing system. In some embodiments, the interference-resistant cable includes an elongate tube having a metallic layer and an insulation layer, and an optical fiber disposed within the elongate tube. The headgear system can include a helmet that has an exterior shell. The modifying step of the method can include creating a path from the visualization system to the data processing system wherein the path is disposed adjacent to the exterior shell.

Example Headgear Systems

FIG. 1A illustrates a block diagram representing an example headgear system 100 having an intrapersonal data communication system. The headgear system 100 can include items such as, for example, a helmet, cap, eyewear system with ear stems with resilient member, facemask, hat, head band, or any combination of these. The headgear system 100 includes a mount interface 102 configured to couple with a local device, such as a visualization system 110 and/or a data processing system 112. The headgear system 100 includes an exterior shell 104 and an inner padding 106. The exterior shell 104 and the inner padding 106 can be integrally formed or be separate components of the headgear system 100. The headgear system 100 includes a guide path 108 configured to provide support, guidance, and/or protection for an optical digital signal link 114. The guide path 108 can be integrally formed with the headgear system 100; a separate component in the headgear system 100; integrally formed with the exterior shell 104; integrally formed with the inner padding 106; or a cavity adjacent to the inner padding 106, adjacent to the exterior shell 104, or between the exterior shell 104 and the inner padding 106. The optical digital signal link 114 of the headgear system 100 can be configured to transmit or propagate signals between local devices, such as between the visualization system 110 and the data processing system 112, between a local device and a component external to the intrapersonal data communication system or headgear system, and/or between any components of the intrapersonal data communication system.

Mount Interfaces

The mount interface 102 of the headgear system 100 can be configured to couple with a local device, such as the visualization system 110 and/or the data processing system 112. There may be one or more mount interfaces configured to couple with one or more visualization systems and/or one or more data processing systems. The mount interface 102 can be configured to releasably couple with the visualization system 110 and/or the data processing system 112. The mount interface 102 can be configured to non-releasably couple with the visualization system 110 and/or the data processing system 112.

The coupling between the mount interface 102 and the visualization system 110 or the data processing system 112 can be accomplished through any appropriate technique. For example, the visualization system 110 or the data processing system 112 can have a mount interface structure that releasably mates with the mount interface 102 such that the visualization system 110 or the data processing system 112 can snap into place and secured in place using clips, latches, friction mounts, springs, and the like. As another example, the visualization system 110 or the data processing system 112 can couple to the mount interface 102 by utilizing corresponding fasteners and mating components. The mount interface 102 can include one or more holes that correspond to one or more threaded members on the visualization system 110 or data processing system 112 through which screws may pass and mate to the corresponding threaded members on the corresponding system. The visualization system 110 or data processing system 112 can include one or more holes corresponding to one or more holes on the mount interface 102 through which bolts may pass and mated with nuts to secure the corresponding system to the mount interface. In some embodiments, adhesives can be used to couple the mount interface 102 and the visualization system 110 or the data processing system 112. In some embodiments, magnets or electromagnets can be used to couple the mount interface 102 and the visualization system 110 or the data processing system 112. In some embodiments, the mount interface includes a clamp ring, band clamp, a sleeve, or another type of clamp configured to substantially secure the visualization system 110 and/or the data processing system 112. In some embodiments, the mount interface 102 and the visualization system 110 and/or the data processing system 112 include components configured to releasably mate with one another using a locking element, a friction fit element, another suitable element, or a combination of elements. For example, the mount interface 102 includes a substantially planar member including a relatively narrow protruding member extending at least partially along its edges. The relatively narrow protruding member includes a lip member extending along at least a portion of one edge of the relatively narrow protruding member, the lip member being orthogonal to the relatively narrow protruding member and configured to extend towards the interior of the substantially planar member. The visualization system 110 and/or the data processing system 112 include corresponding members that are configured to mate with the substantially planar member of the mount interface 102. The mount interface 102 may include a locking member or friction member such that when the visualization system 110 and/or the data processing system 112 is positioned to mate with the substantially planar member of the mount interface 102, the locking member or friction member can be engaged to substantially secure the mount interface 102 to the corresponding system 110 and/or 112.

In some embodiments, the mount interface 102 can be integrally formed with the headgear system 100. In some embodiments, the mount interface 102 can be a separate component attachable to the headgear system 100. In some embodiments, the mount interface 102 includes multiple pieces. In some embodiments, the mount interface 102 includes a single, unitary piece. In some embodiments, the mount interface 102 can be attached to the exterior shell 104. In some embodiments, the mount interface 102 can be integrally formed with the exterior shell 104. In some embodiments, the mount interface 102 can be attached to the inner padding 106. In some embodiments, the mount interface 102 can be integrally formed with the inner padding 106.

The mount interface 102 can be attached to the headgear system 100 through any appropriate technique. In some embodiments, the mount interface 102 includes a strap and substantially rigid members on the proximal and distal ends of the strap configured to conform to the shape of a portion of the headgear system 100. The length of the strap can be adjusted such that when the length of the strap has been reduced sufficiently the substantially rigid members apply a force on the headgear system 100 such that the mount interface 102 becomes substantially affixed to the headgear system 100 through the friction between the substantially rigid members and the portions of the headgear system with which they are in contact. In some embodiments, the mount interface 102 is attached to the headgear system 100 by either drilling holes in the headgear system or utilizing pre-existing holes in the headgear system; inserting one or more bolts, screws, or other fasteners through the hole; or mating a nut or other component configured to mate with the bolt, screw, or other fastener to the distal end of the fastener such that the mount interface 102 is substantially affixed to the headgear system 100. In some embodiments, the mount interface 102 can be attached to the headgear system 100 by utilizing an adhesive suitable for affixing the mount interface 102 to the headgear system 100. In some embodiments, the mount interface 102 can be attached to the headgear system 100 utilizing friction. For example, in certain embodiments the mount interface 102 includes a clamping member configured to apply forces on the headgear system 100 such that the mount interface is substantially affixed to the headgear system 100 through the friction between the clamping member and the portions of the headgear system 100 that are in contact with the clamping member. Examples of clamping members include spring clamps, toggle clamps, band clamps, screw or threaded clamps, or the like.

The mount interface 102 can be configured to substantially secure the visualization system 110 and/or the data processing system 112 in one or more different orientations and/or positions relative to the headgear system 100. For example, the mount interface 102 can include one or more jointed rods and/or plates configured to allow the visualization system 110 and/or data processing system 112 to be pivotally moved to, and substantially secured in, a variety of orientations relative to the headgear system 100. In some embodiments, the mount interface 102 is configured to permit the visualization system 110 and/or the data processing system 112 to be moved translationally and/or rotationally utilizing any appropriate mechanism such as, for example, threaded adjuster screws, friction-based slide mounts, or the like.

Exterior Shell

In some embodiments, the exterior shell 104 of the headgear system 100 includes a single, unitary piece. In some embodiments, the exterior shell 104 includes a plurality of components. The exterior shell 104 can be configured to cover at least a portion of a person's skull when in use. The exterior shell 104 can be configured to provide protection to the user by absorbing, redirecting, and/or distributing the force of an impact to lessen the trauma to the user. The exterior shell 104 can be configured to deflect projectiles. The exterior shell 104 may be of a traditional shape and configuration for each of a variety of sports or hazardous activities. The exterior shell 104 can be made of plastic, polyethylene, carbon fiber, reinforced fibers such as an aramid (e.g., KEVLAR® or Twaron®), epoxy fiber materials, polycarbonate plastic, or any type of metal, or any combination of these materials. The exterior shell 104 can be of an injection-molded construction of polymeric/copolymeric material.

Inner Padding

The inner padding 106 of the headgear system 100, if included, can be made of a single, unitary piece or a plurality of components. In some embodiments, the inner padding 106 can be configured to substantially conform to the general shape of a portion of a user's skull. In some embodiments, the inner padding 106 can be configured to absorb the force of an impact to the skull of the user thereby reducing the impulse imparted to the user. In some embodiments, the inner padding 106 includes a deformable headpiece, interior padding affixed to an interior surface of the exterior shell 104, an inner layer of foam material, and a padding layer. The inner padding 106 can be made of a high density foam such as, for example, expanded polystyrene (EPS), high density polyethylene (HDPE), expanded polypropylene (EPP), vinyl nitril, an air management system, or any combination of these.

Guide Path

The guide path 108 of the headgear system 100 can be configured to provide support, guidance, and/or protection for the optical digital signal link 114. In some embodiments, the guide path 108 includes a lumen through which the optical digital signal link 114 passes. The lumen can be made of a substantially rigid material which provides protection to the optical digital signal link 114 from potentially damaging forces. The lumen can be adjacent to an interior or exterior surface of the exterior shell 104. In some embodiments, the guide path 108 includes a region between the inner padding 106 and the exterior shell 104 sufficient to house the optical digital signal link 114. In some embodiments, the guide path 108 includes a cavity within or along the inner padding 106 sufficient to allow at least a portion of the optical digital signal link 114 to be housed within the cavity. The cavity can be formed in the inner padding 106 after the headgear system 100 has been manufactured or it can be manufactured with a cavity suitable to act as the guide path 108. The guide path 108 can be formed as an integral part of the interior padding 106 and/or the exterior shell 104. In some embodiments, the guide path 108 includes a separate component secured to the surface of the inner padding 106, the exterior shell 104, or both. In some embodiments, the guide path 108 includes a plurality of rigid members configured to substantially secure a portion of the optical digital signal link 114. The plurality of rigid members can be attached to the exterior shell 104, the inner padding 106, or both the exterior shell 104 and the inner padding 106. The plurality of rigid members can be affixed to the headgear system using adhesives, clamps, friction mounts, magnets, electromagnets, or fasteners. In certain embodiments, one or more of the rigid members include clips which are configured to receive the optical digital signal link 114 and substantially secure it in place by the use of friction. In certain embodiments, one or more of the rigid members include hooks configured to receive the optical digital signal link 114. The guide path 108 can include an elongate tube configured to allow the optical digital signal link 114 to fit within the elongate tube. The guide path 108 can be a path between an interior portion of the exterior shell 104 and a portion of the inner padding 106 adjacent to the interior portion of the exterior shell 104.

Visualization System

The visualization system 110 includes one or more components configured to acquire image data and/or display information to a user. The visualization system 110 can be configured to communication imagery data across the intrapersonal data communication system to other local devices or to external systems. The visualization system 110 can be configured to receive information from other local devices or external systems using the intrapersonal data communication system, and to display the received information to a user. Example visualization systems are described in greater detail herein with reference to FIGS. 2A and 2C.

Data Processing System

The data processing system 112 includes one or more hardware processors, controllers, and/or memory. The data processing system 112 can be configured to process information received over the intrapersonal data communication system wherein the information originates in a local device, an external system, sensors, or the like. The data processing system 112 can receive the information, process it, and send the processed information to local devices using the intrapersonal data communication system. Example data processing systems are described in greater detail herein with reference to FIGS. 3A and 3C.

Optical Digital Signal Link

The intrapersonal data communication system of the headgear system 100 can include optical digital signal link 114 configured to transmit and/or propagate electrical voltages and/or optical digital signals between elements or components of the headgear system 110 and the intrapersonal communication system. To propagate the optical digital signals, the optical digital signal link 114 includes one or more optical waveguides. The optical waveguides can be rectangular waveguides, optical fibers, fiber optic cables, and the like. For example, the optical digital signal link 114 can include one or more optical fibers that have a silica-based core that is configured to transmit radiation and that is surrounded by a silica-based cladding having a lower index of refraction than the silica-based core. The silica-based cladding can be surrounded by one or more coatings. The one or more optical fibers can be, for example, single-mode or multi-mode optical fiber. To propagate electrical voltages, the optical digital signal link 114 can include one or more conductive electrical wires configured to carry electrical current or voltage.

In some embodiments, the optical digital signal link 114 includes a protective sheath of tubing made of metal or a metallic braided material surrounding the one or more wires and the one or more optical waveguides. The protective sheath can be configured to provide structural support to the optical digital signal link 114, to reduce the effects of electromagnetic interference within the optical digital signal link 114, and/or to protect the optical digital signal link 114 from damage from external forces, pressures, or environmental elements.

In some embodiments, the optical digital signal link 114 can be configured to carry information between local devices, such as between the visualization system 110 and the data processing system 112. Information can be digitized and converted into an optical digital signal to be introduced to the optical digital signal link 114. In some embodiments, the optical digital signal link 114 includes at least one optical fiber per direction of communication, such as, for example, at least one optical fiber carries communication from the visualization system 110 to the data processing system 112 and at least one optical fiber carries communication from the data processing system 112 to the visualization system 110. In some embodiments, the optical digital signal link 114 includes the ability to support duplex or bi-directional dual-spectral band communication on the fibers, thereby enabling communication redundancy when two or more fibers are used, as described with greater detail herein with reference to FIGS. 4C and 6B. In some embodiments, the optical digital signal link 114 can be configured to support real-time video and digital communication with a bandwidth of less than or equal to about 10 Gbps, less than or equal to about 4 Gbps, less than or equal to about 2 Gbps, or less than or equal to about 1 Gbps, and in lower-demand or standby modes the bandwidth can be decreased to about a 5 kbps.

In some embodiments, the optical digital signal link 114 includes a segment coupled to the visualization system 110 and another segment coupled to the data processing system 112. In some embodiments, the optical digital signal link 114 can include a plurality of segments being operatively coupled through one or more optical digital signal bridges or connectors. In some embodiments, the optical digital signal link 114 couples with a first signal converter 116 (e.g., an optical digital signal bridge, an optical digital signal adapter, a signal converter within a local device, etc.) at a first end and a second signal converter 116 at a second end. In some embodiments, the optical digital signal link 114 can be coupled to a signal converter 116 at a first end and an optical digital signal bridge at a second end.

Some embodiments provide an optical digital signal link 114 that has a total length that is at least about 10 cm and/or less than or equal to about 1 m, at least about 20 cm and/or less than or equal to about 50 cm, or at least about 25 cm and/or less than or equal to about 45 cm.

Signal Converter

In some embodiments, information from the visualization system 110 or data processing system 112 can be digitized by the corresponding system 110 or 112 and converted by a signal converter 116 into an optical digital signal suitable for transmission over the optical digital signal link 114. The signal converter 116 can be integrated into the local device or it can be a separate component, such as an optical digital signal adapter, as described herein. Examples of signal converters are described with greater detail herein with reference to FIGS. 4A, 4B, and 4C.

The signal converter 116 can convert the electrical digital signal from a local device, such as the visualization system 110 or data processing system 112, to an optical digital signal. The signal converter 116 can include an integrated circuit that controls a radiation source, such as, for example, a light-emitting diode (LED), a laser diode, or a vertical cavity surface emitting laser (VCSEL). The radiation source of the signal converter 116 emits radiation corresponding to the input electrical digital signal which can be coupled to an optical waveguide within the signal converter 116 before transmission to the optical digital signal link 114 or it can be directly coupled to an the optical digital signal link 114. The signal converter 116 can be coupled to the optical digital signal link 114 using an optical digital signal bridge or other similar connector.

The optical digital signal being carried by the optical digital signal link 114 can be converted into an electrical digital signal by the signal converter 116. For example, the optical digital signal can be coupled to the signal converter 116 which includes a photodetector, transimpedance amplifier (TIA), and limiting amplifier (LIA) configured to produce an electrical digital signal that corresponds to the received optical digital signal. In some embodiments, the electrical digital signal output from the signal converter 116 can be transmitted to a local device, such as the visualization system 110 or data processing system 112, through an optical digital signal bridge. In some embodiments, the signal converter 116 is integrated into the local device receiving the optical digital signal.

In some embodiments, power from a power source, such as a power source within the data processing system 112, can be provided to local devices on the intrapersonal data communication system, such as the visualization system 110, through wires in the optical digital signal link 114. A voltage can be applied to at least one of the wires in the optical digital signal link 114 and transmitted to other components through electrical connectors at interfaces between components. For example, power can be delivered to the visualization system 110 through the signal converter 116, wherein the signal converter 116 includes an electrical connection between the optical digital signal link 114 and a corresponding interface on the visualization system 110.

Example Headgear Systems Having an Intrapersonal Data Communication System

Figure 1B:
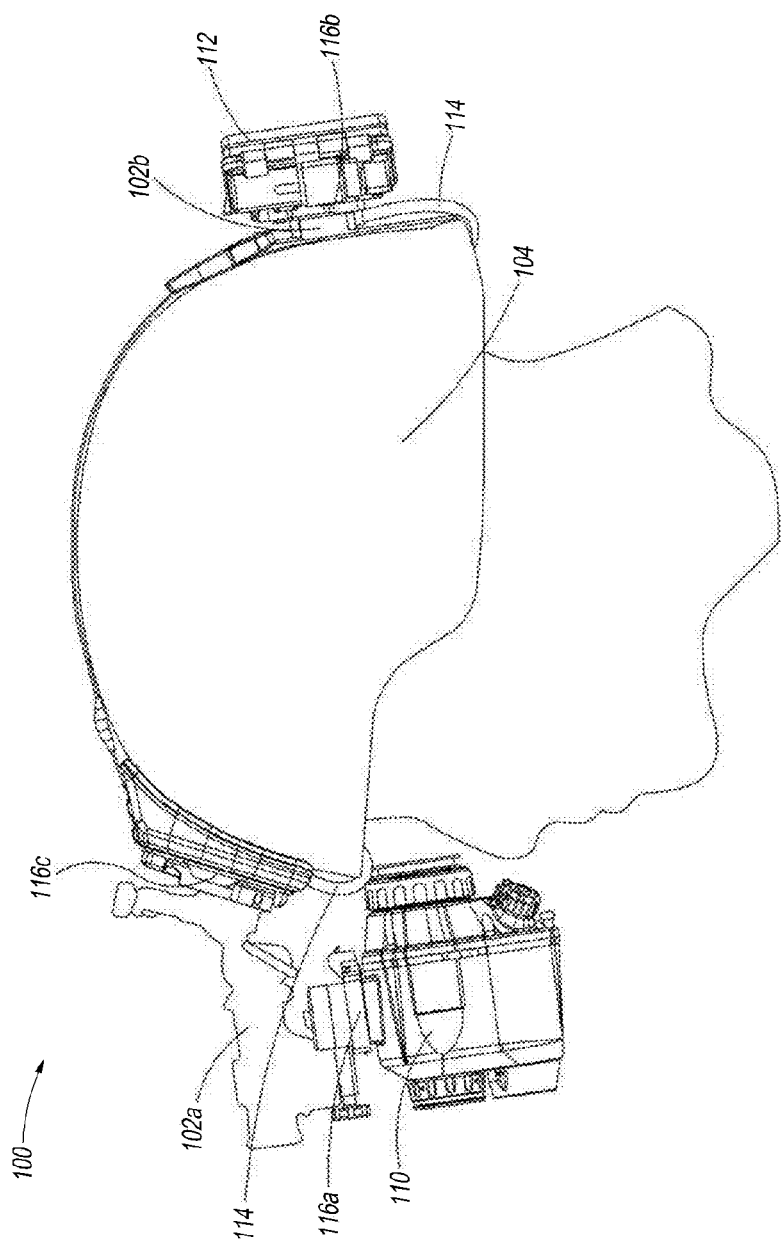
FIGS. 1B, 1C, and 1D are illustrations of some embodiments of a headgear system with an optical digital signal link between a visualization system and a data processing system.
Figure 1C:
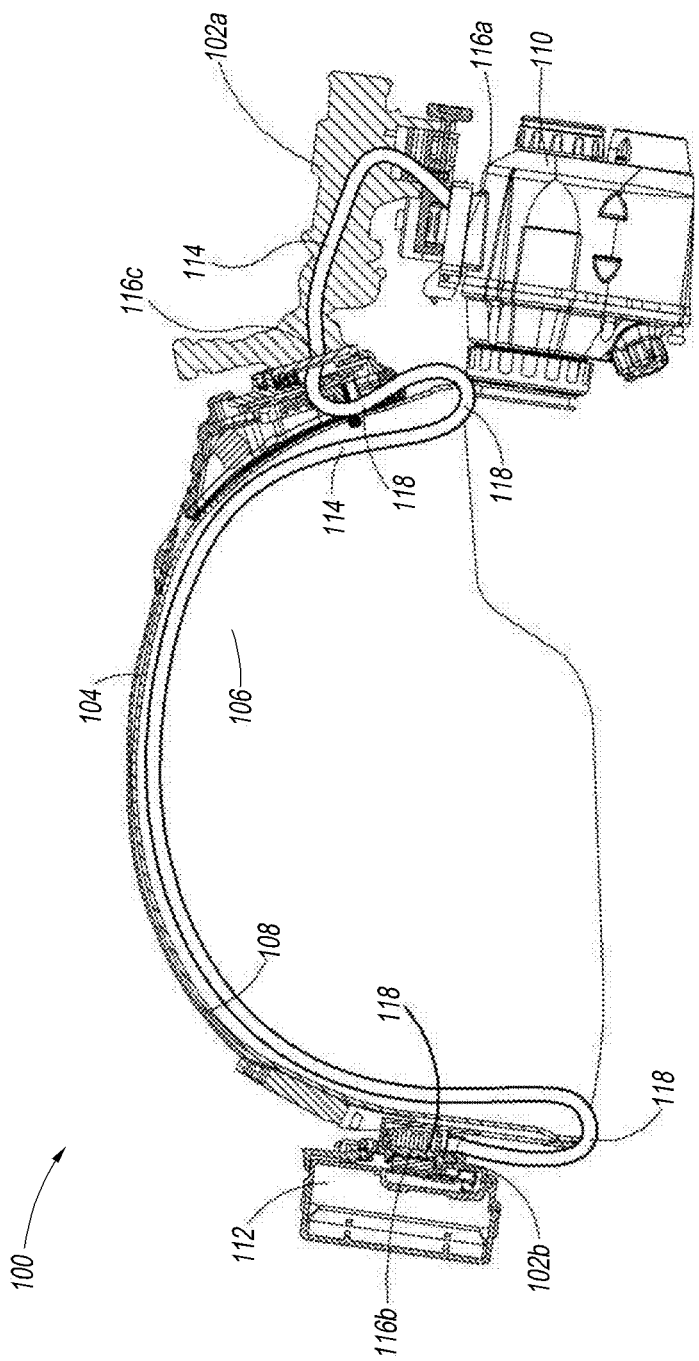
Figure 1D:
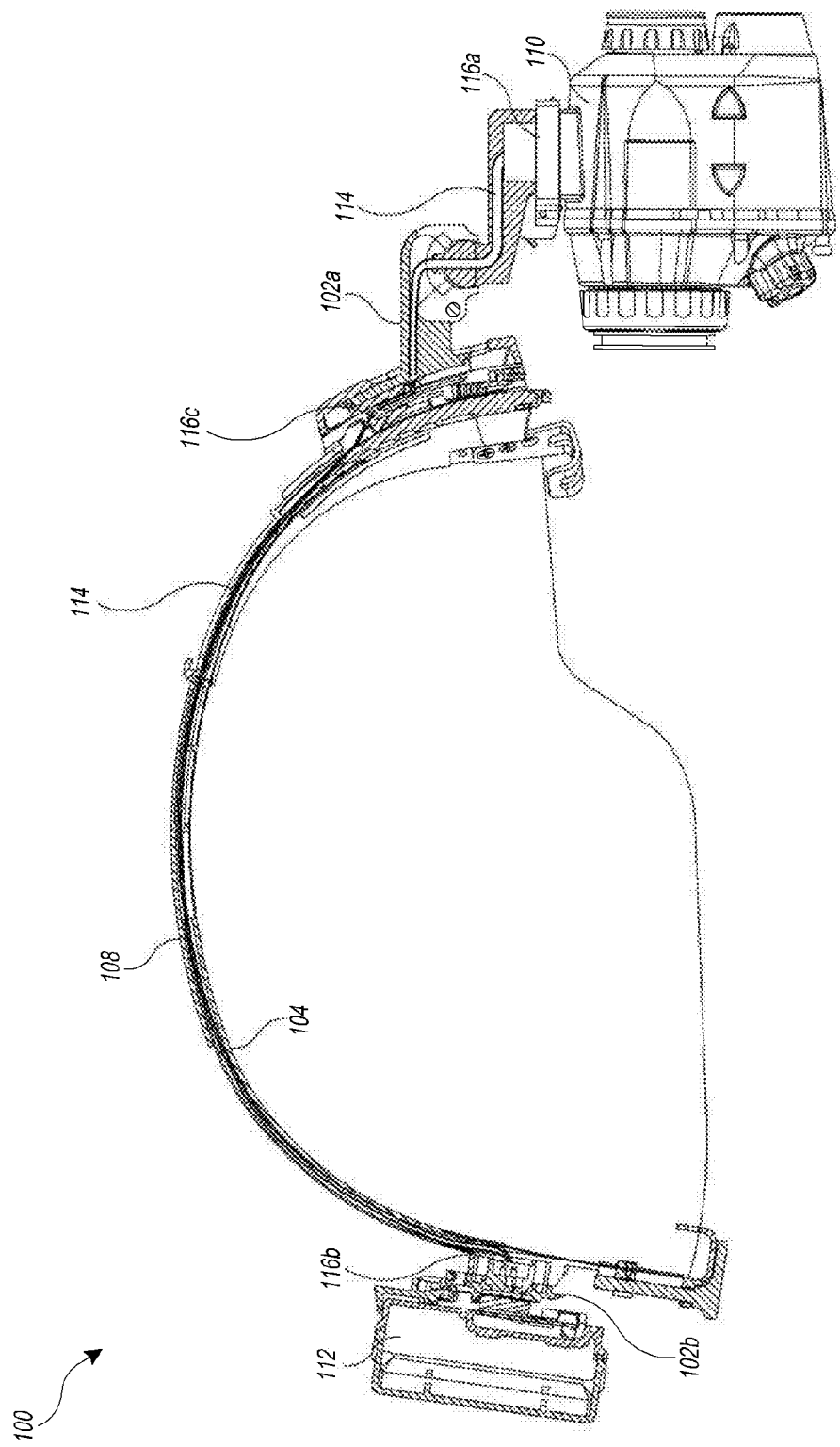

FIGS. 1B, 1C and 1D illustrate example embodiments of a headgear system 100 having an intrapersonal data communication system. The headgear system 100 can be a helmet such as, for example, an Advanced Combat Helmet, a Modular Integrated Communications Helmet, a Mk. 7 Helmet, a SPECTRA Helmet, a Max Pro Police RD-Tac Tactical Helmet, or the like. The exterior shell 104 can be made of ballistic fiber such as Kevlar® or Twaron®. The inner padding 106 can be made of a high-density foam material which substantially conforms to a portion of the user's skull.

The mount interface 102a is releasably coupled to the visualization system 110. The coupling can be accomplished by any appropriate technique, including, for example, the techniques disclosed herein. The mount interface 102a is also releasably coupled to the exterior shell 104 of the helmet. The coupling can be accomplished by any appropriate technique, including, for example, the techniques disclosed herein. The visualization system 110 includes a monocular goggle, such as, for example, a thermal goggle, a night-vision goggle, a multi-imaging sensor goggle, or the like. Two mount interfaces 102a are shown in FIGS. 1B and 1D, but both have similar functionality. The mount interface 102a is configured to move the visualization system 110 into and out of the user's direct line of sight. The mount interface 102a includes a mechanism configured to translate and/or rotate the visualization system 110 according to a user's desired location. The mount interface 102a includes a vertical translation and/or rotation mechanism configured to move the visualization system 110 up and out of the user's direct line of sight. The mount interface 102a can include a strap that is connected to the mount interface 102b and configured to conform to the shape of the exterior shell 104 and secure the mount interfaces 102a and 102b to the helmet 100.

The mount interface 102b is releasably coupled to the data processing system 112. The mount interface 102b is also releasably coupled to the exterior shell 104 of the helmet. The mount interface 102b includes a rigid member configured to support the body of the data processing system and conform to the surface of the exterior shell 104 and extend in a curved fashion under the exterior shell 104 and conform to the surface of the inner padding 106 (as more clearly shown in FIG. 1D). The mount interface 102b is configured in this manner such that when the strap connecting mount interfaces 102a and 102b is contracted in length, the rigid member of mount interface 102b applies a pressure to the helmet sufficient to substantially secure the data processing system 112 in place. The data processing system 112 can include a hardware processor and memory. The data processing system 112 can include a power source such as, for example, one or more batteries.

The optical digital signal link 114 is configured to provide a communication link between the visualization system 110 and the data processing system 112. The transmission rate across the optical digital signal link can be less than or equal to about 10 Gbps, less than or equal to about 4 Gbps, less than or equal to about 2 Gbps, less than or equal to about 1 Gbps, with rates down to a few kbps in active standby modes. The optical digital signal link can be configured to transmit digital information including information, such as, for example, compressed video data, compressed image data, uncompressed video data, uncompressed image data, textual data, location data, cartographic data, audio data, angular rate or tilt data, weapon pointing data, compass data, synchronization data, digital commands, or any combination of these. The optical digital signal link 114 includes at least one optical fiber configured to transmit an optical digital signal between the visualization system 110 and the data processing system 112. In some embodiments, the at least one optical fiber includes a multi-mode fiber. In some embodiments, the optical digital signal link 114 includes a power wire and a return wire. In some embodiments, the optical digital signal link 114 includes a metallic tubing to provide protection, support, and resistance to electromagnetic interference. The optical digital signal link 114 can include an insulation layer, to provide mechanical support, thermal stability, electromagnetic insulation, and the like. In some embodiments, the optical digital signal link 114 includes two or more sets of power and return wires to provide redundancy in the power supply system. In some embodiments, the optical digital signal link 114 conveys power from the data processing system 112 to the visualization system 110.

The signal converter 116a can be part of the visualization system 110 or it can be a separate component (e.g., an optical digital signal adapter) that receives an electrical digital signal from the visualization system 110. The signal converter 116a can be configured to convert the electrical digital signal of the visualization system 110 into an optical digital signal for transmission over the optical digital signal link 114. In some embodiments, the signal converter 116a is configured to convert an optical digital signal received from the data processing system 110 over the optical digital signal link 114 to an electrical digital signal for the visualization system 110. In some embodiments, the signal converter 116a connects power and return lines from the optical digital signal link 114 to the visualization system 110.

Similarly, signal converter 116b can be configured to convert an electrical digital signal supplied by the data processing system 110 into an optical digital signal for transmission over the optical digital signal link 114. In some embodiments, the signal converter 116b is configured to convert an optical digital signal received from the visualization system 110 over the optical digital signal link 114 to an electrical digital signal for the data processing system 110. In some embodiments, the signal converter 116b connects power and return lines from the data processing system 110 to the optical digital signal link 114.

As illustrated in FIGS. 1C and 1D, the optical digital signal link 114 can comprise a plurality of segments. For example, the optical digital signal link 114 can have a mount interface segment that is associated with the mount interface 102a and a helmet segment that is associated with the helmet 100. The mount interface segment of the optical digital signal link 114 can be internal to the mount interface 102a as shown, or it can be external to it.

The intrapersonal data communication system can include signal converter 116c, or optical digital signal bridge, that acts to couple electrical voltages and optical digital signals from the mount interface segment of the optical digital signal link 114 to the helmet segment of the optical digital signal link 114. In some embodiments, a mount interface-side of the signal converter 116c receives optical digital signals and uses a non-contact optical connector to couple the received optical digital signals to a corresponding non-contact optical connector on a helmet-side of the signal converter 116c. When the mount interface 102a is removed from the helmet 100, the signal converter 116c is divided into two separate parts and a segment of the optical digital signal link 114 that is associated with the mount interface 102a separates from the other segments of the optical digital signal link 114. When the mount interface 102a is attached to the helmet 100, the two separate parts of the signal converter 116c are aligned and coupled so that electrical voltages and optical digital signals can be transmitted between the mount interface segment of the optical digital signal link 114 and the helmet segment of the optical digital signal link 114.

In some embodiments, as illustrated in FIG. 1C, the guide path 108 comprises a path that is adjacent to an interior side of the exterior shell 104 or that is adjacent to the inner padding 106. In some embodiments, as illustrated in FIG. 1D, the guide path 108 comprises a structure forming a lumen adjacent to the exterior shell 104 through which the optical digital signal link 114 passes.

In some embodiments, as illustrated in FIG. 1C, the optical digital signal link 114 is configured to bend in bend locations 118 wherein the bend locations 118 can have a relatively small radius. The small radius of the bend locations 118 can be desirable so that the optical digital signal link 114 stays relatively close to the headgear system 100, reducing or minimizing exposure to outside forces that may damage the cable. The small radius may be desirable to change directions in a small space to maintain a small profile on the headgear system 100, such as when the optical digital signal cable 114 leaves or enters the signal converter 116b for the mount interface 102b. For some embodiments of the optical digital signal cable 114, bending the cable 114 can increase signal loss across the cable at the area of the bend 118. If the bend is too small, the signal loss may become high enough such that signals no longer propagate satisfactorily across the optical digital signal link 114 unless power is increased in the optical communication system. Increasing the power can be undesirable where mobility and longevity of power sources is of concern.

Therefore, in some embodiments, the optical digital signal link 114 includes a fiber optic cable comprising a bundle of optical fibers relatively tightly packaged and surrounded by a fairly robust jacket. By utilizing such a fiber optic cable relatively tight bends can be achieved while maintaining acceptable signal levels across the bent fiber optic cable. In addition, the fiber optic cable can maintain suitable transmission across the cable even where an optical fiber breaks. In some embodiments, the fiber optic cable can have an optical surface diameter that is between about 0.5 mm and about 1.2 mm and can be made up of a relatively large number of optical fibers (e.g., above 300) each having a diameter of between about 30 um and about 70 um. The fiber optic cable can have a numerical aperture that is between about 0.45 and about 0.55. The fiber optic cable can have a long term bend radius that is less than or equal to about 6 mm. The fiber optic cable can have a length between about 0.4 m and about 10 m and can be configured to sustain a relatively high data transmission rate of at least about 1 Gbps. An example of such a fiber optic cable is the glass optical fiber cable named G2 manufactured by SCHOTT of North America Inc.

Example Visualization System

Figure 2B:
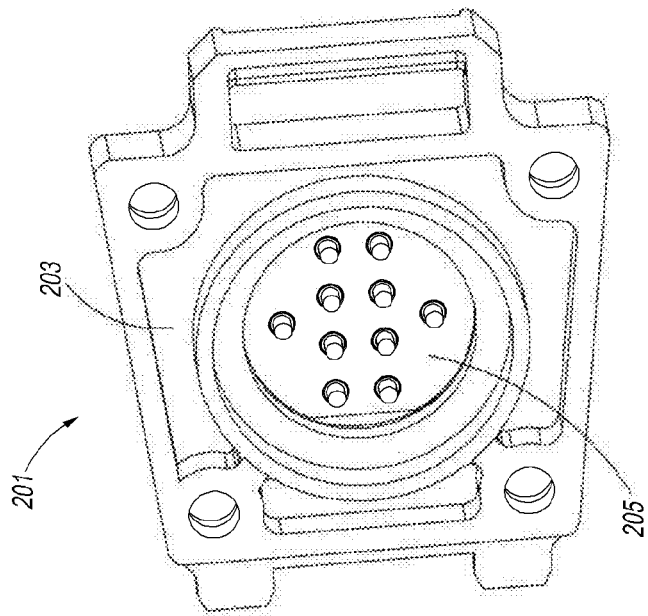
FIG. 2B illustrates a perspective view of an example optical digital signal adapter that mates with an example visualization system having an optical digital signal adapter interface.
Figure 2A:
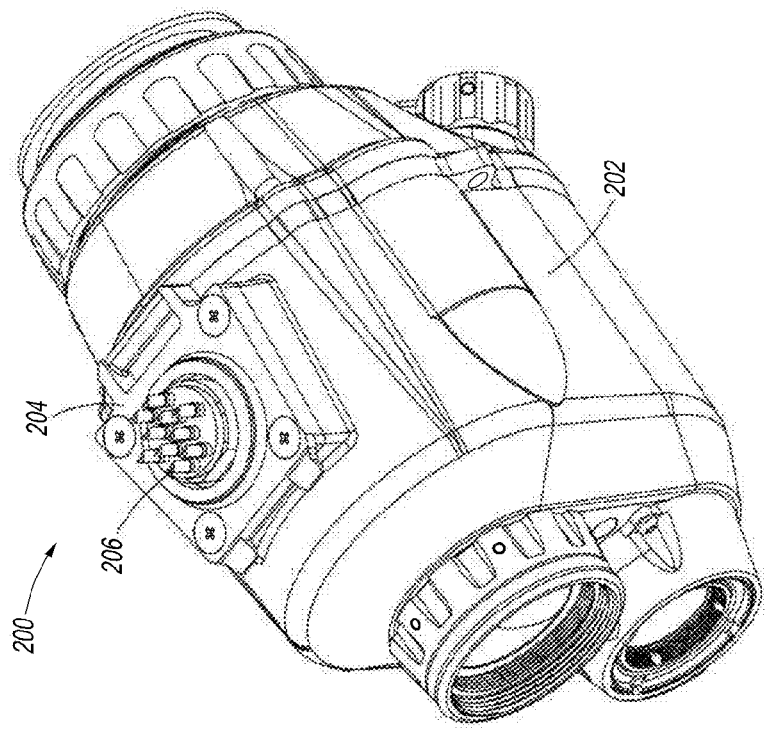
FIG. 2A illustrates a perspective view of an example visualization system having an optical digital signal adapter interface.

FIG. 2A illustrates a perspective view of an example visualization system 200 having an optical digital signal adapter interface 206. The visualization system 200 includes a body 202, a mounting surface 204, and the optical digital signal adapter interface 206 comprising a plurality of electrical connectors. The body 202 of the visualization system can be configured to house optical components, imaging sensors, display, electricals, buttons for interacting with the user, and the like. The visualization system 200 can include one or more hardware processors and/or memory housed within the body 202. The mounting surface 204 can be configured to couple with a corresponding mount interface on the headgear system. In some embodiments, the mounting surface 204 includes one or more holes configured to receive screws, bolts, rivets, or the like. In some embodiments, the holes are threaded. In some embodiments, the mounting surface 204 includes one or more structures which releasably mate with a corresponding structure on the mount interface of the headgear system. For example, the mounting surface 204 can include rails which mate with corresponding protrusions on the mount interface of the headgear system such that the mounting surface can slide into the protrusions and be substantially secured in place using one or more fiction fitting elements configured to apply pressure to the mounting surface and substantially reduce or eliminate slippage.

The visualization system 200 includes one or more components configured to acquire image data. In some embodiments, the visualization system 200 includes a thermal camera or thermal goggle. The thermal camera or thermal goggle can be configured to display a visual image corresponding to the quantity of infrared radiation emanating from objects and background within the line of sight of the thermal camera or thermal goggle, as imaged by the camera optics onto an infrared-sensing detector. The infrared radiation falling on the detector is converted to a corresponding electrical signal that can be converted to a corrected and image-processed digital value via video processing electronics, which can be passed to a display system configured to display information to a user. In some embodiments, the display system produces an intensity of visible radiation corresponding to the digital value of the infrared radiation. In some embodiments, the display system produces a color within the visible spectrum corresponding to the digital value of the infrared radiation. Examples of infrared detectors include those based on pyroelectric sensors, ferroelectric materials, photovoltaic or photoconductive devices, or microbolometer devices.

In some embodiments, the visualization system 200 includes a goggle or camera configured to display visual information corresponding to amplified radiation signals in the line of sight of the optical components of the goggle. For example, the visualization system 110 can include a night-vision goggle. The night-vision goggle can include an adjustable objective lens assembly, an image intensifier tube assembly or an Electron Bombarded Active Pixel Sensor (EBAPS) and display, and an adjustable ocular lens assembly. The amplified radiation signals from the image intensifier tube can be presented for direct viewing on the phosphor display of the image intensifier tube, or the direct view image can be converted to a digital value via an image sensor, such as, for example, a CCD or CMOS imaging sensor. The image sensor can be configured to be sensitive to radiation falling within the ultraviolet, visible, near infrared, and/or short-wave infrared spectra. The image sensor can be configured to be sensitive to radiation having a wavelength falling between about 0.3 and 1.7 microns, between about 0.3 and 0.4 microns, between about 0.4 and 0.75 microns, between about 0.75 and 1.4 microns, or between about 0.9 to about 1.7 microns. The output of the image sensor can be passed to a display system that produces, in some embodiments, an intensity of visible radiation corresponding to the digital value of the amplified radiation signal, and in some embodiments, a frequency of visible radiation corresponding to the digital value of the amplified radiation signal. The EBAPS can include a CMOS Active Pixel Sensor as its readout which can convert the amplified radiation signal to a video electrical signal. The low-noise amplification mechanism of the photon generated electrons in the intensifier tube or EBAPS based camera or goggle allows the units to deliver high image signals for relatively low levels of light falling within the visible spectrum such that the camera or goggle can assist a user to detect an object that the bare human eye would be relatively incapable of distinguishing without the assistance of a device that amplifies radiation signals.

In some embodiments, the visualization system 200 includes a system configured to display information to the user. For example, the display system can include a liquid crystal display (LCD), LED display, or organic LED (OLED) display. The information displayed to the user can include image information derived from an image sensor system or infrared sensor system, textual information, maps, positions of objects or persons, augmented reality information, computer generated images and/or video, location data, weapon pointing data, compass data, all of the preceding, or any combination of these. For example, the information may be derived from the environment of the user, may be supplied by the user, may be supplied by a person or entity besides the user, or may be computer-generated, or any combination of these.

In some embodiments, the visualization system 200 can include a wireless communication system. The wireless communication system can include a system, such as, for example, an ultra-wide band communication system, radio frequency communication, Bluetooth communication, or any combination of these.

Example Optical Digital Signal Adapter for a Visualization System

FIG. 2B illustrates a perspective view of an example optical digital signal adapter 201 that mates with an example visualization system 200 having an optical digital signal adapter interface 206. The optical digital signal adapter 201 can be configured to releasably mate with the visualization system 200. Mount interface 203 can be configured to couple with corresponding mount interface 204 on the visualization system 200.

The optical digital signal adapter 201 is configured to receive electrical digital signals from the visualization system 200 through connectors on the adapter interface 206. The electrical digital signals are electrically coupled to the optical digital signal adapter 201 through connector elements 205 that mate with corresponding connectors on the adapter interface 206. The optical digital signal adapter 201 is configured to convert the electrical digital signals into optical digital signals. The converted optical digital signals can be transmitted using an optical digital signal link (not shown) coupled to the optical digital signal adapter 201. In some embodiments, the adapter 201 is configured to convert electrical digital signals to optical digital signals and to convert optical digital signals to electrical digital signals that are electrically coupled to the visualization system 200 through the adapter interface 206. In some embodiments, the adapter interface 206 is configured to couple power and return lines between the visualization system 200 and the optical digital signal link. The adapter interface 206 can include a plurality of male or female connector pins that mate with the compatible connector elements 205 on the adapter 201. The adapter interface 206 and connector elements 205 shown in the figures include ten connector elements. In some embodiments, the adapter interface 206 and adapter connector elements 205 include less than 10 connector elements, more than 10 connector elements. For example, the adapter interface 206 can include a connector element to couple to a power line, a connector element to couple to a return line, and a connector element to couple to an electrical digital signal. The adapter interface 206 can include a connector element to couple to a redundant power line and a connector element to couple to a redundant return line. The adapter interface 206 can include connector elements for multiple electrical digital signals. The adapter interface 206 can be a circular connector, a square connector, a rectangular connector, or any other suitably shaped connector. The adapter interface 206 can include male or female connector elements aligned in columns, in rows, in concentric circles, in clusters, or any other suitable configuration.

Example Visualization System Having an Integrated Signal Converter

Figure 2D:
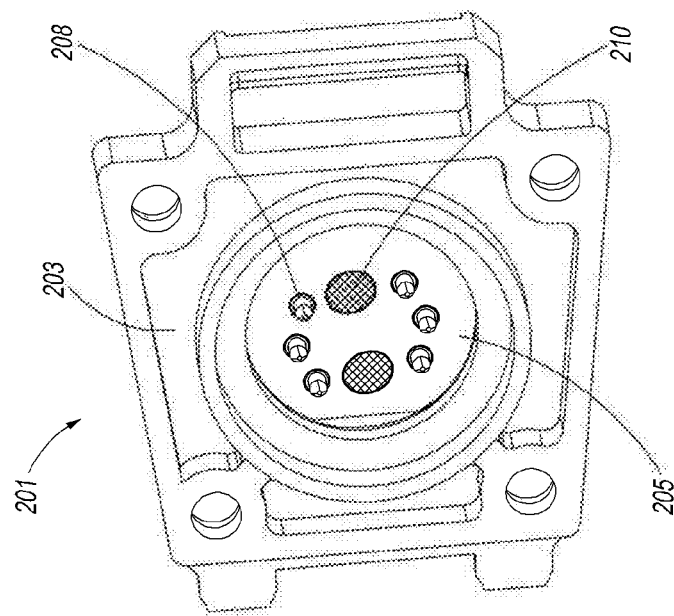
FIG. 2D illustrates a perspective view of an example optical digital signal bridge that mates with an example visualization system having an optical digital signal bridge interface.
Figure 2C:
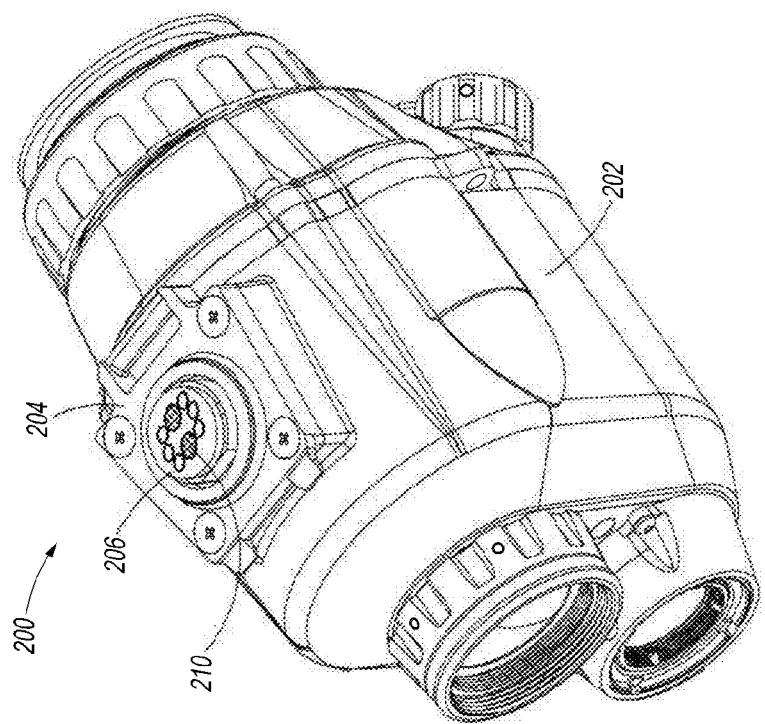
FIG. 2C illustrates a perspective view of an example visualization system having an optical digital signal bridge interface comprising electrical and non-contact optical connectors.

FIG. 2C illustrates a perspective view of an example visualization system 200 having an optical digital signal bridge interface 206 comprising electrical and non-contact optical connectors. The visualization system 200 has the same or similar functionality as the visualization system described herein with reference to FIG. 2A except that the visualization system 200 includes a signal converter. The visualization system 200 signal converter is configured to convert between electrical digital signals and optical digital signals, as described herein. The bridge interface 206 can include electrical connector elements and non-contact optical connectors 210. In some embodiments, the electrical connector elements can be conductive pads on a surface of a connector of the bridge interface 206. In some embodiments, the non-contact optical connectors 210 can include transparent windows that have a surface that is even with the surface of the connector of the bridge interface 206. The connector elements of the bridge interface 206 can be configured to couple to corresponding connector elements on an optical digital signal bridge 201, as described with reference to FIG. 2D.

Example Optical Digital Signal Bridge for a Visualization System

FIG. 2D illustrates a perspective view of an example optical digital signal bridge 201 that mates with an example visualization system 200 having an optical digital signal bridge interface 206. The optical digital signal bridge 201 can be configured to receive an optical digital signal from the non-contact optical connectors 210 on the visualization system 200 and couple them to an optical digital signal link (not shown). Similarly, the optical digital signal bridge 201 can be configured to couple optical digital signals from the optical digital signal link to the visualization system 200 through corresponding non-contact optical connectors 210 on the optical digital signal bridge 201 and the bridge interface 206 of the visualization system 200. The optical digital signal bridge 201 has similar mounting features 203 as the optical digital signal adapter 201 described herein with reference to FIG. 2B.

The optical digital signal bridge 201 can include electrical connectors 208 that are configured to electrically couple to corresponding conductive elements on the bridge interface 206 of the visualization system 200. The electrical connectors 208 can have a plunger-type design wherein they are configured to recess into the bridge 201 when a force is applied and return to a default position when no force is applied. This can allow the electrical connectors 208 to remain electrically coupled to the bridge interface 206 during use.

The optical digital signal bridge 201 can include non-contact optical connectors 210 that are configured to optically couple optical digital signals between the bridge 201 and the visualization system 200. As described herein, the non-contact optical connectors 210 can include elements configured to collimate and/or focus optical signals for transmission across a gap. Furthermore, the non-contact optical connectors 210 can include transparent windows that have an exterior surface that is level with a surface of the connector interface 205. In this way, the interior optical components can be protected and the surface of the connector can be cleaned with relative ease.

Example Data Processing System

Figure 3B:
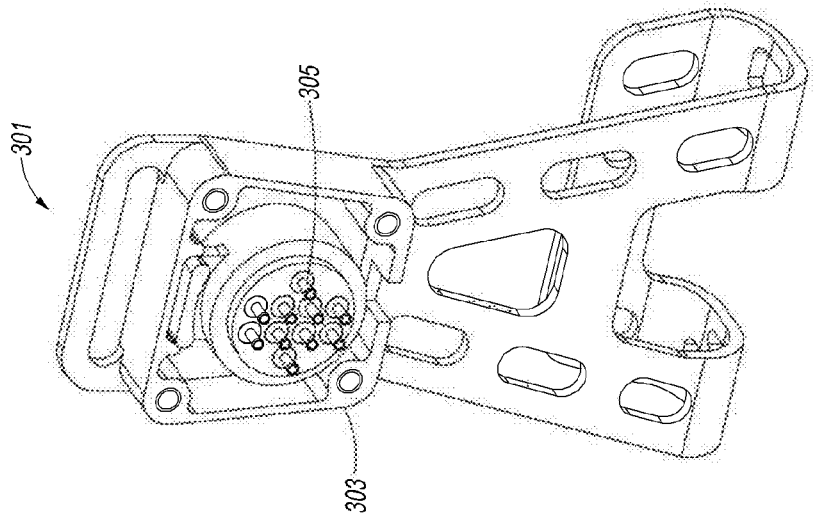
FIG. 3B illustrates a perspective view of an example optical digital signal adapter that mates with an example data processing system having an optical digital signal adapter interface.
Figure 3A:
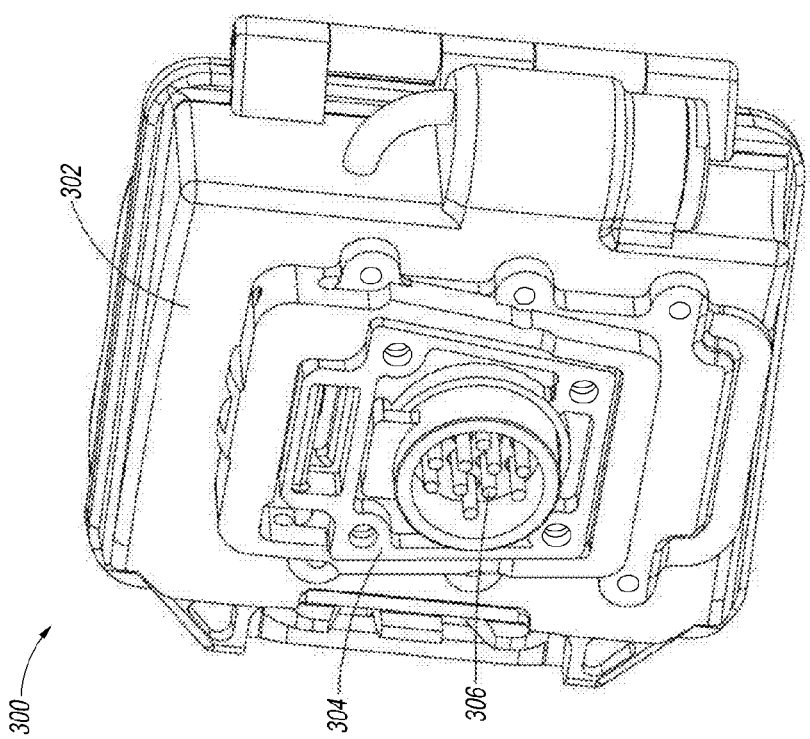
FIG. 3A illustrates a perspective view of an example data processing system having an optical digital signal adapter interface.

FIG. 3A illustrates a perspective view of an example data processing system 300 having an optical digital signal adapter interface 306. The data processing system 300 includes a body 302, a mounting surface 304, and the optical digital signal interface 306. The body 302 is configured to house the components of the data processing system 300 such as one or more hardware processors and memory. The mounting surface 304 can be configured to releasably couple with a mount interface on a headgear system. The coupling can be accomplished by any suitable mechanism, including those described herein.

The data processing system 300 can include a power source. The power source can include sources such as, for example, a battery or series of batteries, photovoltaic material, a solar panel, or any combination of these. The power source can be configured to provide sufficient power to the data processing system 300 and/or other local devices or components of the intrapersonal data communication system. The data processing system 300 can include computer readable storage, one or more internal communications interlinks (such as, for example, internal buses), and one or more external communications interlinks. In some embodiments, the data processing system 300 includes a transceiver element configured to send and receive information to and from devices through radio frequency signals, ultra-wideband technology, fiber optics, wired communication, or the like.

The data processing system 300 can be configured to process signals from other data sources. Data sources can include, for example, sensors mounted on a headgear system, sensors incorporated with the data processing system 300, sensors or controls external to the headgear system, or any combination of these. The data sources can be delivered to the data processing system 300 via electrical wire, optical fiber, or wireless link.

In some embodiments, the data processing system 300 can be configured to process image information, textual information, communication, instructions, or the like. For example, the data processing system 300 can be configured to receive image information from a visualization system, process the image information according to software or user instructions, and send information back to the visualization system where the information can be displayed to a user. In some embodiments, the data processing system 300 receives information via wireless communication from a device or external system that the data processing system 300 can then relay to another local device through the intrapersonal data communication system. In some embodiments, the data processing system 300 generates information based on internal instructions which it can send to other local devices.

Example Optical Digital Signal Adapter for a Data Processing System

FIG. 3B illustrates a perspective view of an example optical digital signal adapter 301 that mates with an example data processing system 300 having an optical digital signal adapter interface 306. The optical digital signal adapter 301 can be configured to releasably mate with the data processing system 300. Mount interface 303 can be configured to couple with corresponding mount interface 304 on the data processing system 300.

The optical digital signal adapter 301 is configured to receive electrical digital signals from the data processing system 300 through connectors on the adapter interface 306. The electrical digital signals are electrically coupled to the optical digital signal adapter 301 through connector elements 305 that mate with corresponding connectors on the adapter interface 306. The optical digital signal adapter 301 is configured to convert the electrical digital signals into optical digital signals. The converted optical digital signals can be transmitted using an optical digital signal link (not shown) coupled to the optical digital signal adapter 301. In some embodiments, the adapter 301 is configured to convert electrical digital signals to optical digital signals and to convert optical digital signals to electrical digital signals that are electrically coupled to the data processing system 300 through the adapter interface 306. In some embodiments, the adapter interface 306 is configured to couple power and return lines between the data processing system 300 and the optical digital signal link. The adapter interface 306 can include a plurality of male or female connector pins that mate with the compatible connector elements 305 on the adapter 301. The adapter interface 306 and connector elements 305 shown in the figures include ten connector elements. In some embodiments, the adapter interface 306 and adapter connector elements 305 include less than 10 connector elements, more than 10 connector elements. For example, the adapter interface 306 can include a connector element to couple to a power line, a connector element to couple to a return line, and a connector element to couple to an electrical digital signal. The adapter interface 306 can include a connector element to couple to a redundant power line and a connector element to couple to a redundant return line. The adapter interface 306 can include connector elements for multiple electrical digital signals. The adapter interface 306 can be a circular connector, a square connector, a rectangular connector, or any other suitably shaped connector. The adapter interface 306 can include male or female connector elements aligned in columns, in rows, in concentric circles, in clusters, or any other suitable configuration.

Example Data Processing System Having an Integrated Signal Converter

Figure 3D:
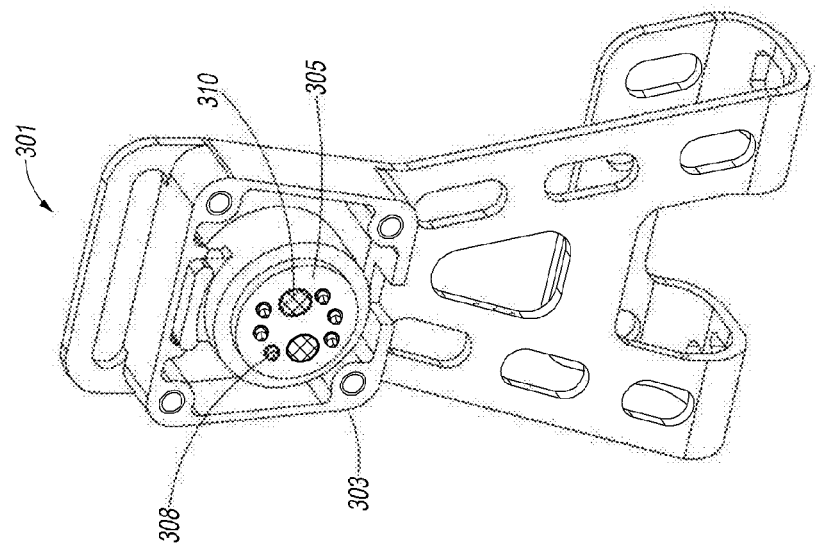
FIG. 3D illustrates a perspective view of an example optical digital signal bridge that mates with an example data processing system having an optical digital signal bridge interface.
Figure 3C:
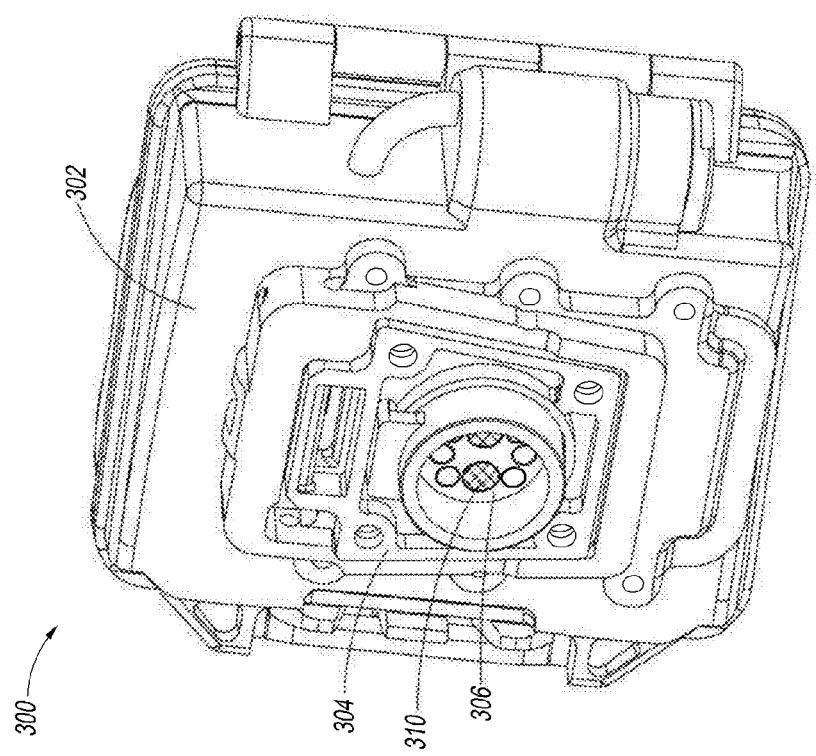
FIG. 3C illustrates a perspective view of an example data processing system having an optical digital signal bridge interface comprising electrical and non-contact optical connectors.

FIG. 3C illustrates a perspective view of an example data processing system 300 having an optical digital signal bridge interface 306 comprising electrical and non-contact optical connectors. The data processing system 300 has the same or similar functionality as the data processing system described herein with reference to FIG. 3A except that the data processing system 300 includes a signal converter. The data processing system 300 signal converter is configured to convert between electrical digital signals and optical digital signals, as described herein. The bridge interface 306 can include electrical connector elements and non-contact optical connectors 310. In some embodiments, the electrical connector elements can be conductive pads on a surface of a connector of the bridge interface 306. In some embodiments, the non-contact optical connectors 310 can include transparent windows that have a surface that is even with the surface of the connector of the bridge interface 306. The connector elements of the bridge interface 306 can be configured to couple to corresponding connector elements on an optical digital signal bridge 301, as described with reference to FIG. 3D.

Example Optical Digital Signal Bridge for a Data Processing System

FIG. 3D illustrates a perspective view of an example optical digital signal bridge 301 that mates with an example data processing system 300 having an optical digital signal bridge interface 306. The optical digital signal bridge 301 can be configured to receive an optical digital signal from the non-contact optical connectors 310 on the data processing system 300 and couple them to an optical digital signal link (not shown). Similarly, the optical digital signal bridge 301 can be configured to couple optical digital signals from the optical digital signal link to the data processing system 300 through corresponding non-contact optical connectors 310 on the optical digital signal bridge 301 and the bridge interface 306 of the data processing system 300. The optical digital signal bridge 301 has similar mounting features 303 as the optical digital signal adapter 301 described herein with reference to FIG. 3B.

The optical digital signal bridge 301 can include electrical connectors 308 that are configured to electrically couple to corresponding conductive elements on the bridge interface 306 of the data processing system 300. The electrical connectors 308 can have a plunger-type design wherein they are configured to recess into the bridge 301 when a force is applied and return to a default position when no force is applied. This can allow the electrical connectors 308 to remain electrically coupled to the bridge interface 306 during use.

The optical digital signal bridge 301 can include non-contact optical connectors 310 that are configured to optically couple optical digital signals between the bridge 301 and the data processing system 300. As described herein, the non-contact optical connectors 310 can include elements configured to collimate and/or focus optical signals for transmission across a gap. Furthermore, the non-contact optical connectors 310 can include transparent windows that have an exterior surface that is level with a surface of the connector interface 305. In this way, the interior optical components can be protected and the surface of the connector can be cleaned with relative ease.

Example Interface Elements

Figure 4A:
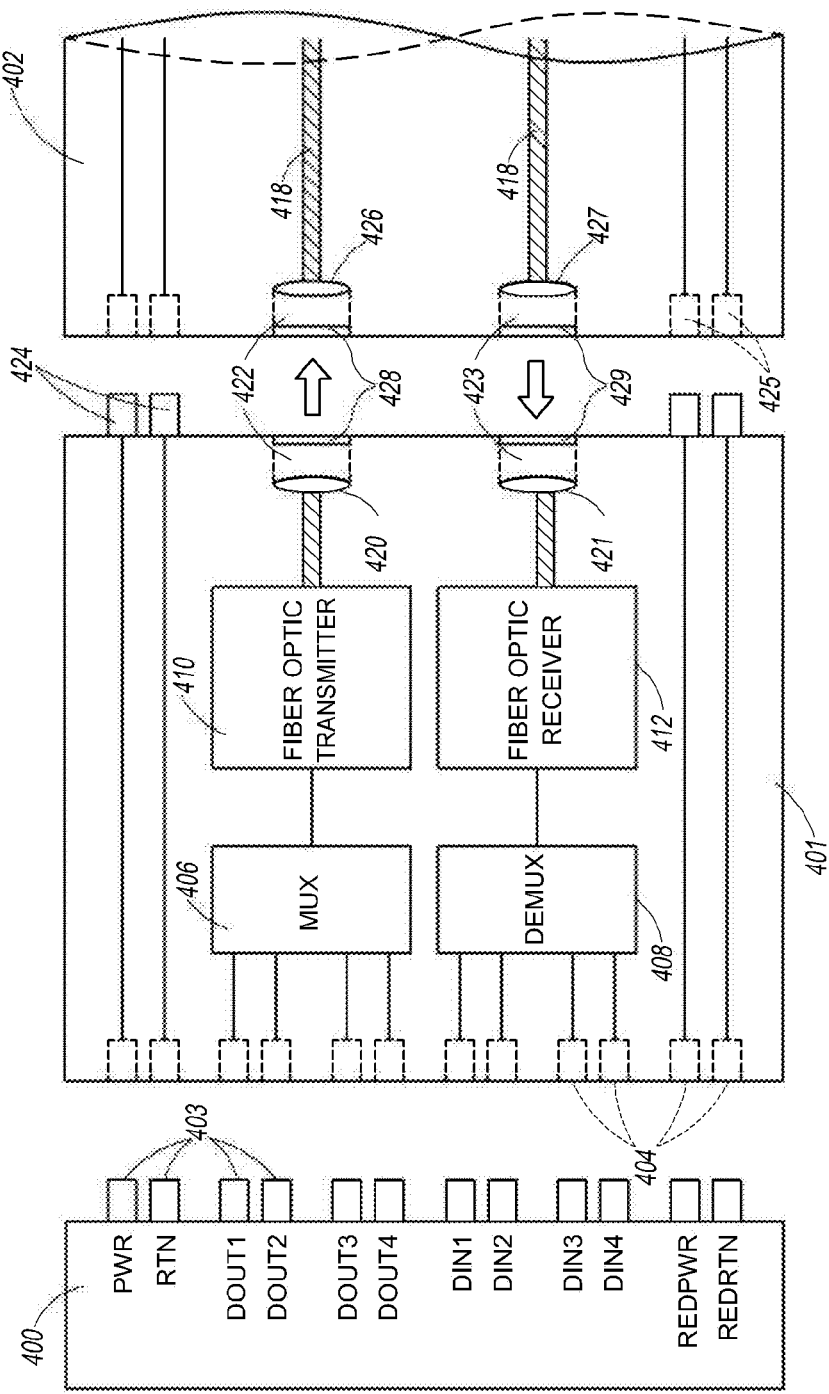
FIG. 4A illustrates a block diagram representing a local device electrical connector, an optical digital signal adapter, and an optical digital signal link according to some embodiments.

FIG. 4A illustrates a block diagram representing a local device electrical connector 400, an optical digital signal adapter 401, and an optical digital signal link 402 according to some embodiments. In some embodiments, the electrical connector 400 can be configured to couple to the adapter 401 which can be configured to convert between electrical digital signals and optical digital signals. The optical digital signal adapter 401 can be used when signal conversion is to be performed outside a local device such that the adapter 401 can be a separate component. The adapter 401 couples with the local device electrical connector 400 through compatible mating elements 403 and 404. The compatible mating elements 403 and 404 can be configured to couple power, return, redundant power, redundant return, digital output, and digital input lines between the adapter 401 and local device through the electrical connector 400. The configuration illustrated in FIG. 4A can be utilized where the local device is configured to transmit and/or receive electrical digital signals and the optical digital signal adapter can be used to convert between electrical digital signals and optical digital signals for use with an optical digital signal link of an intrapersonal data communication system.

Figure 4B:
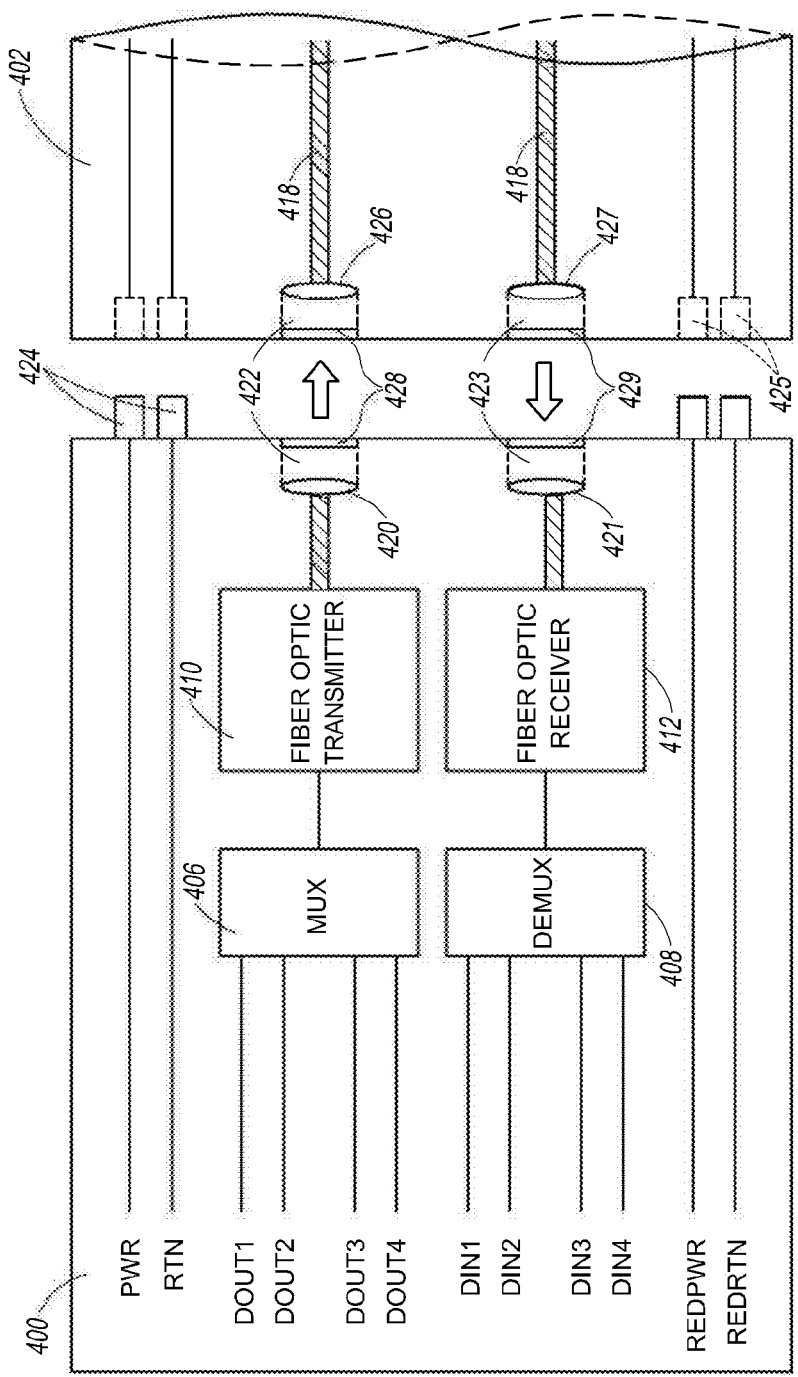
FIG. 4B illustrates a block diagram representing a local device having a signal converter within the local device, and an optical digital signal link according to some embodiments.

FIG. 4B illustrates a block diagram representing a local device having a signal converter 400 within the local device, and an optical digital signal link 402 according to some embodiments. The local device having the signal converter 400 can be configured to convert between electrical digital signals and optical digital signals and to couple with the optical digital signal link 402. The configuration illustrated in FIG. 4B can be utilized where the local device is configured to transmit and/or receive optical digital signals directly from an optical digital signal link of an intrapersonal data communication system.

Figure 4C:
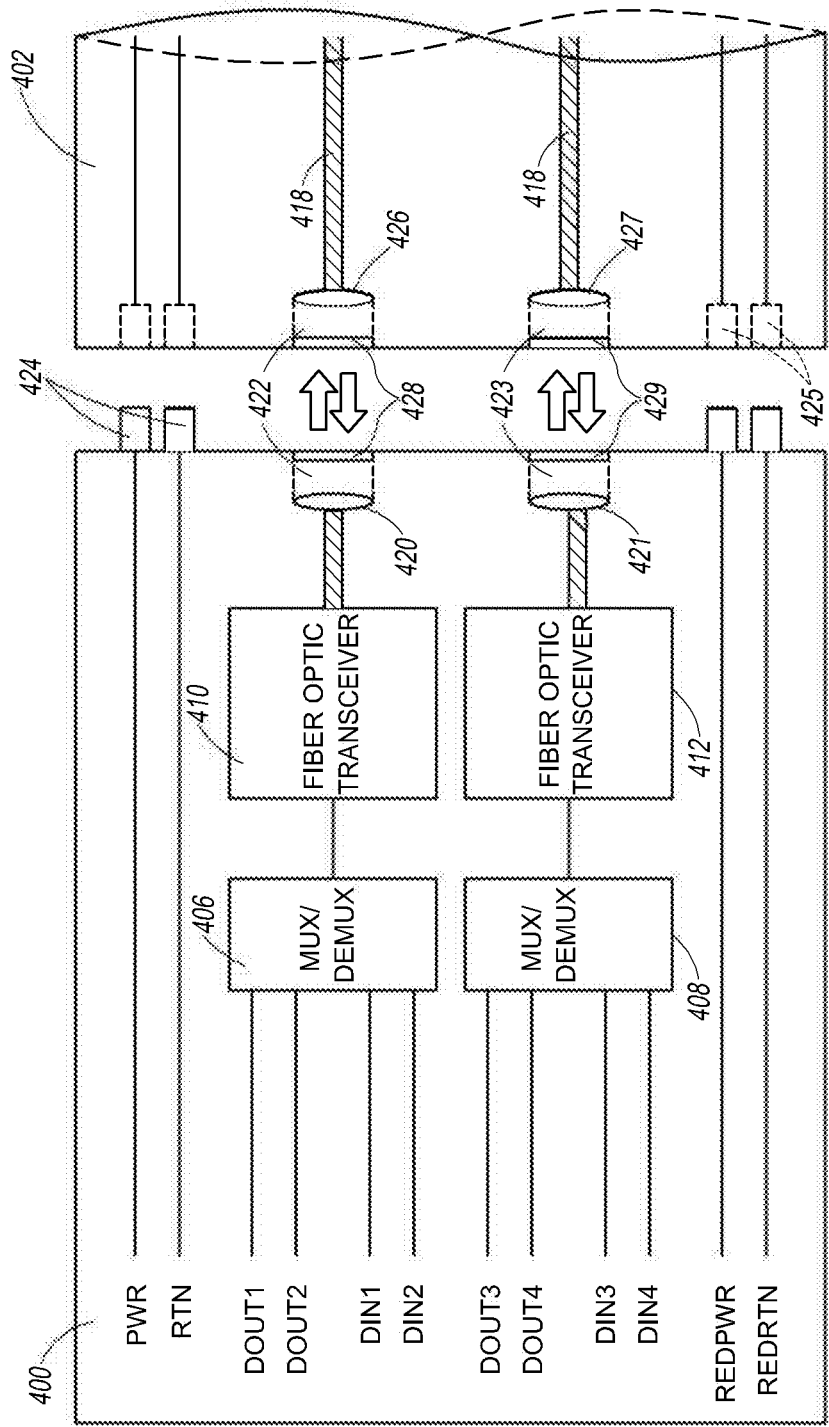
FIG. 4C illustrates a block diagram representing a local device having a signal converter within the local device, and a duplex/bi-directional optical digital signal link according to some embodiments.

FIG. 4C illustrates a block diagram representing a local device having a signal converter 400 within the local device, and a duplex/bi-directional optical digital signal link 402 according to some embodiments. The local device having the signal converter 400 can be configured to convert between electrical digital signals and optical digital signals and to couple with the optical digital signal link 402 and to perform bi-directional signal communication across a single optical waveguide 418. The configuration illustrated in FIG. 4C can be utilized where bi-directional communication is desirable and where the local device is configured to transmit and receive optical digital signals.

The configurations illustrated in FIGS. 4A-C have some similarities including digital signal lines; power and return lines; redundant power and return lines; connectors 424; fiber optic transmitters, receivers, and transceivers 410 and 412; multiplexors and demultiplexors 406 and 408; non-contact optical connectors 422 and 423; and optical fibers 418. In FIGS. 4A-C, electrical digital signals are represented by the lines labeled DOUTn or DINn, where n is a number such as 1, 2, 3, or 4. In FIGS. 4A-C, four each of electrical digital signal input and output lines are listed. In some embodiments, the number of electrical digital signal input lines is less than four and may be zero, or may be more than four. In some embodiments, the number of electrical digital signal output lines is less than four and may be zero, or may be more than four. For example, there can be a signal digital output line and no digital input lines. For example, there can be a plurality of digital output lines and no digital input lines. For example, there can be one or more digital input lines and no digital output lines. The references to PWR, RTN, REDPWR, and REDRTN lines in FIGS. 4A-C correspond to power, return, redundant power, and redundant return lines. In some embodiments, there are no redundant power and/or redundant return lines. In some embodiments, there are more redundant power and/or redundant return lines.

In some embodiments, the optical fiber link may be bi-directional or multimode, in which case the adapter 401 or local device interface 400 can include transmitter and receiver components coupled with suitably coated optical elements for separating and combining the transmitted and received optical signals.

In some embodiments, the digital output lines (DOUTn) can be passed through a multiplexor component 406 to multiplex the output electrical digital signals. In some embodiments, there is no multiplexor. The multiplexed electrical digital signal can be passed to a fiber optic transmitter 410. The fiber optic transmitter 410 can be configured to convert an electrical digital signal into a corresponding optical digital signal. The fiber optic transmitter 410 can convert electrical signals to optical signals using appropriate techniques, such as, for example, by outputting an optical signal proportional to the input electrical current. The fiber optic transmitter 410 can be any suitable component for converting electrical digital signals to optical digital signals, such as, for example, HXT4101A-DNT manufactured by GigOptix, Inc. of San Jose, Calif. The output of the fiber optic transmitter 410 is an optical digital signal 414 that can be coupled to a collimating lens 420. In some embodiments, the electrical digital signal can be converted to an optical digital signal by fiber optic transmitter 410 and subsequently passed through multiplexor component 406 configured to multiplex optical signals.

In some embodiments, an input optical digital signal passes through a focusing lens 421 configured to substantially focus a collimated optical signal onto a fiber optic receiver 412. The focused optical digital signal 416 can be substantially directed and focused onto a fiber optic receiver 412 configured to convert an optical digital signal into a corresponding electrical digital signal. The fiber optic receiver 412 can convert optical signals to electrical signals using any appropriate technique such as, for example, outputting an electrical current that is proportional to the input power of the optical signal. The fiber optic receiver can be any suitable component for converting optical digital signals to electrical digital signals, such as, for example HXR-4101A-DNT-T manufactured by GigOptix, Inc of San Jose, Calif. The converted electrical digital signal can be passed through a demultiplexor component 408 configured to demultiplex electrical digital signals. The demultiplexor component 408 can be configured to couple the electrical digital signals to the digital input lines (DINn). In some embodiments, there is no demultiplexor component 408. In some embodiments, the demultiplexor component 408 can be configured to receive the optical signal 416 and demultiplex the optical digital signal 416 before being converted into an electrical digital signal.

Figure 6A:
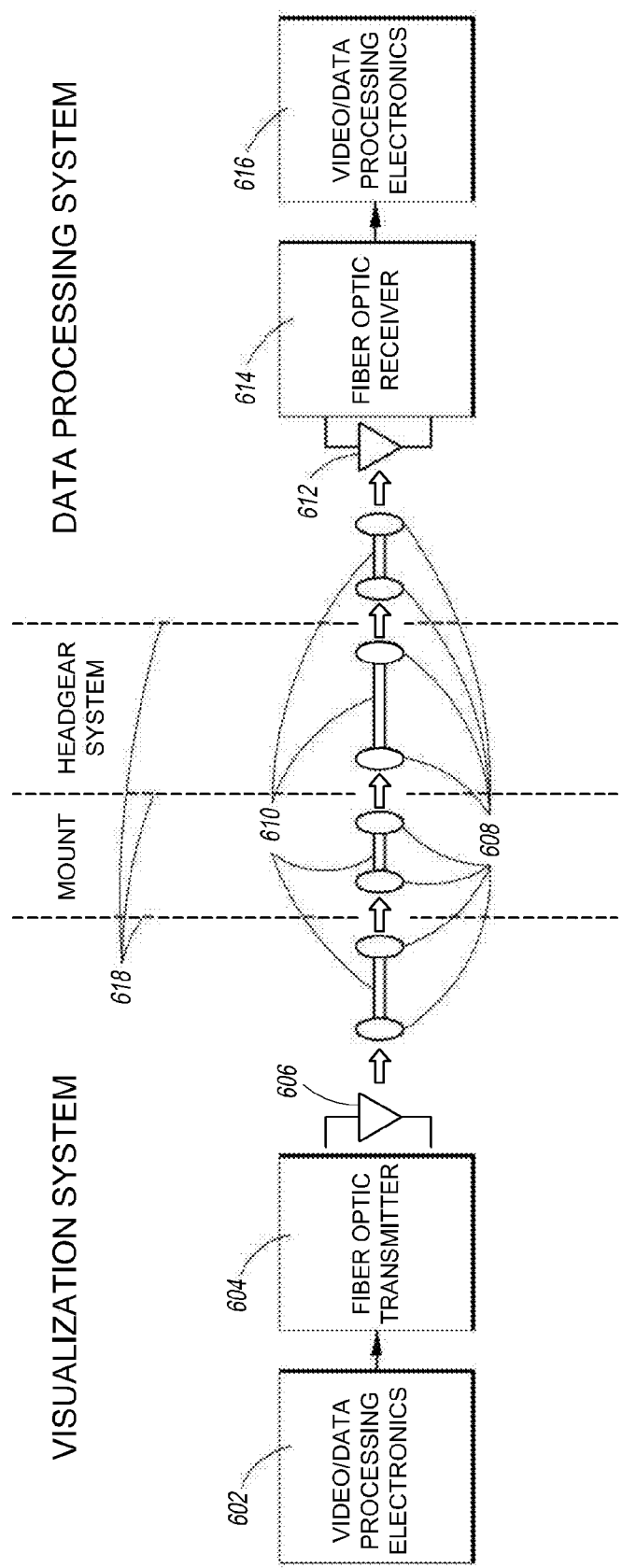
FIG. 6A illustrates a block diagram representing an example intrapersonal data communication system from a visualization system to a data processing system.
Figure 6B:
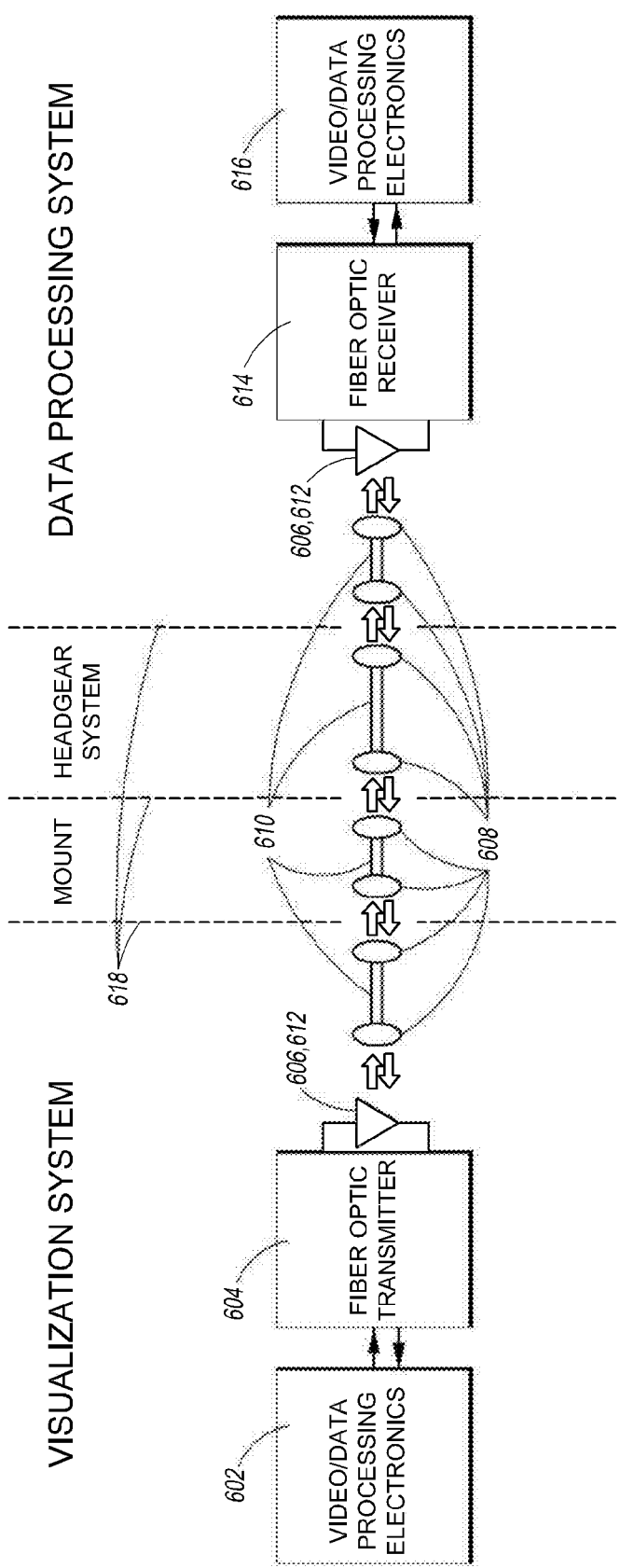
FIG. 6B illustrates a block diagram representing an example duplex/bi-directional intrapersonal data communication system between a visualization system and a data processing system.

In some embodiments, such as embodiments described with respect to FIGS. 4C and 6B, a single optical fiber carries both input and output optical digital signals utilizing suitable techniques such as, for example, wavelength division multiplexing. Output and input optical digital signals can be directed to suitable components for multiplexing, demultiplexing, and conversion to corresponding electrical digital signals.

Non-Contact Optical Connection to Optical Digital Signal Link

FIGS. 4A-C show a representation of a non-contact optical connection between optical digital signal link 402 and connector interface 400 or signal converter 401, respectively. Output optical digital signal 414 can be collimated by collimating lens 420. The collimated optical signal passes through an output gap 422 before passing through a focusing lens 426 and being coupled with optical fiber 418. Input optical digital signal passes through optical fiber 418 and can be coupled with collimating lens 427. The collimated optical signal passes through an input gap 423 before being focused by focusing lens 421. In some embodiments, the output and input gaps 422 and 423 can be about 1 mm between lens elements. In some embodiments, the gaps 422 and 423 may be greater than or equal to about 2 mm, less than or equal to about 1 mm, about 0.5 mm, or about 1.5 mm. In some embodiments, the gaps 422 and 423 can have differing distances between lens elements, such as, for example, there can be about 1.5 mm between lens elements 420 and 426 in output gap 422 and there can be about 0.8 mm between lens elements 421 and 427 in input gap 423. In some embodiments, the non-contact optical connection can include transparent windows 428 and 429 that are configured to have an exterior surface that is substantially aligned with an exterior surface of the adapter 401 or electrical connector 400. The transparent windows 428 and 429 can be configured to be substantially transmissive for wavelengths that correspond to wavelengths of light used in the fiber optics 418. The transparent windows 428 and 429 can be treated with coatings to make them more durable, scratch resistant, hydrophobic, polarized, filtered, and the like. The transparent windows 428 and 429 can provide a protective surface for the lens elements 420, 421, 426 and 427. The transparent windows 428 and 429 can provide a surface that is cleaned with relative ease to maintain optical coupling between components of the intrapersonal data communication system.

In some embodiments, the optical digital signal link 402 can be configured to connect to power and return lines through corresponding connector elements 424 and 425. In some embodiments, the optical digital signal link 402 can be configured to connect to redundant power and/or redundant return lines. In some embodiments, the optical digital signal link 402 can be configured to carry optical digital signals and not power and/or return lines.

Example Optical Signal Cables with an Optical Digital Signal Bridge

Figure 5:
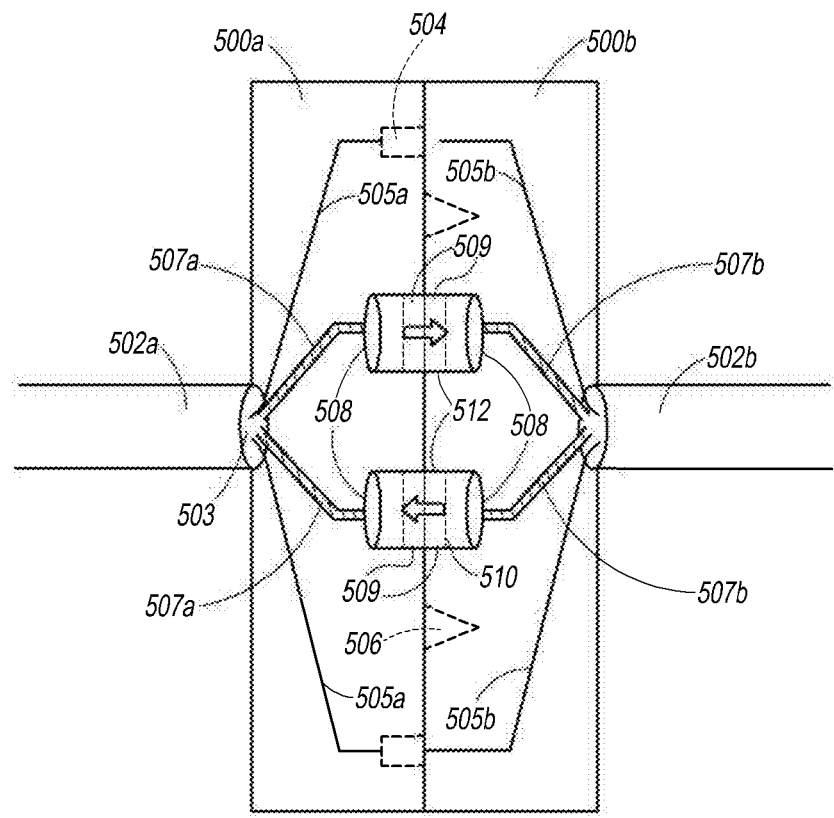
FIG. 5 illustrates a block diagram representing an optical digital signal bridge having a non-contact optical connector according to some embodiments.

FIG. 5 illustrates a block diagram representing an optical digital signal bridge 500a and 500b having a non-contact optical connector 512 according to some embodiments. The optical digital signal bridge formed by complementary bridge components 500a and 500b can be configured to optically and electrically couple two segments of an optical signal cable 502a and 502b. The non-contact optical connection includes non-contact connector assemblies 500a and 500b, input and output lines 503, connector pins 504, alignment mechanisms 506, and one or more non-contact optical connectors 512 including optical elements 508, transparent windows 509, and one or more input/output signal gaps 510. In some embodiments, the non-contact optical connectors 512 include a lens and a transparent window 509 (where "transparent" can mean that the transparent element is substantially transmissive to one or more frequencies of electromagnetic radiation used in the fiber optic signal cables), configured to abut or be adjacent to a transparent element of a complementary non-contact optical connector 512. The transparent windows 509 can have a planar surface that is exposed when the non-contact optical connectors are not connected. The planar surface can be useful to create a surface that is cleaned in a relatively easy manner and to establish a connection surface to facilitate aligning the non-contact optical connectors 512. The non-contact optical connectors 512 can be configured to maintain an optical connection when misaligned due to a lateral displacement and/or an angular misalignment. For example, the non-contact optical connection between signal cables 502a and 502b can be maintained where the non-contact optical connectors 512 are laterally displaced by less than or equal to about 5 mm, less than or equal to about 4 mm, less than or equal to about 3 mm, less than or equal to about 2 mm, less than or equal to about 1 mm, less than or equal to about 0.5 mm, and/or less than or equal to about 0.4 mm. The non-contact optical connection between signal cables 502a and 502b can be maintained where the non-contact optical connectors 512 are angularly misaligned by less than or equal to about 5 degrees, less than or equal to about 4 degrees, less than or equal to about 3 degrees, less than or equal to about 2 degrees, less than or equal to about 1 degrees, less than or equal to about 0.5 degrees, and/or less than or equal to about 0.4 degrees. Some example embodiments of non-contact optical connectors are described herein with reference to FIGS. 2C, 2D, 3C, 3D, and 12-14.

Optical Signal Cables

Optical signal cables 502a and 502b include input and output lines 503 including one or more optical fibers configured to carry digital optical signals. Input and output lines 503 can include wires configured to carry one or more power and return lines. Optical signal cables 502a and 502b can include shielding elements to reduce electromagnetic interference. For example, optical signal cables 502a and 502b can include foil shielding including a thin layer of aluminum attached to a polyester carrier as well as insulation to protect against mechanical stress and substantially prevent electromagnetic interference. As another example, optical signal cables 502a and 502b can include braid shielding including a woven mesh of bare or tinned copper wires. As another example, optical signal cables 502a and 502b can include both foil and braid shielding. Optical signal cables 502a and 502b can include insulation to provide, for example, mechanical durability, thermal stability, electrical insulation, or any combination of these.

Input and output lines 503 can include one or more optical fibers. The one or more optical fibers can be configured to carry optical digital signals along the optical signal cables 502a and 502b. Input and output lines 503 can include wires configured to carry power and return voltages and currents. Input and output lines 503 can include wires configured to carry redundant power and return voltages and currents.

Optical Digital Signal Bridges

Optical signal cables 502a and 502b can include complementary optical digital signal bridges 500a and 500b at corresponding proximal and/or distal ends. The optical digital signal bridges 500a and 500b can be coupled to the optical signal cables 502a and 502b respectively using any suitable coupling element, such as, for example, adhesives, clamps, retaining members, crimping members, solder, or any combination of these. Optical digital signal bridges 500a and 500b can include complementary electrical connector elements 504 configured to transmit power and return voltage and current between optical signal cables 502a and 502b. In some embodiments, optical digital signal bridges 500a and 500b can include alignment mechanisms 506. The optical digital signal bridges 500a and 500b can include one or more non-contact optical signal connectors 512 including lens elements 508, transparent windows 509, and input/output signal gaps 510. In some embodiments, optical digital signal bridges 500a and 500b do not include mating connector pins 504, particularly in embodiments where optical signal cables 502a and 502b do not include power and return wires. In some embodiments, optical digital signal bridges 500a and 500b do not include alignment mechanisms 506, particularly in embodiments where optical digital signal bridges 500a and 500b include mating connector pins 504 which can be configured to align optical digital signal bridges 500a and 500b. In some embodiments, optical digital signal bridges 500a and 500b can be a part of a headgear system, mount interface, and the like such that the cables 502a and 502b terminate at these structures so as to be integral to the associated structure or device.

Alignment mechanisms 506 can be configured to substantially align the one or more non-contact optical connectors 512. The alignment mechanisms 506 can include physical elements configured to substantially secure the non-contact connector assemblies 500a and 500b such that the non-contact optical connectors 512 are substantially aligned. The alignment mechanisms 506 can accomplish the substantial alignment utilizing any suitable technique such as, for example, mating physical elements such as one or more cones or pegs to one or more cone or peg receptacle elements, or locking mechanisms associated with a structure of which it is an integral part. Alignment mechanisms 506 can include locking elements to substantially secure the non-contact connector assemblies 500a and 500b in contact with one another.

Alignment mechanisms 506 can include mating elements that exert frictional forces on such that the non-contact connector assemblies 500a and 500b remain substantially aligned. The optical digital signal bridges 500a and 500b can be considered to be substantially aligned when the optical signal traverses the non-contact optical connectors 512 without substantial degradation in signal quality such that there is no significant loss of information across the connectors 512.

Non-Contact Optical Connectors

The optical digital signal bridges 500a and 500b include one or more non-contact optical connectors 512 configured to transmit optical signals across a gap without mating or interlocking components. A non-contact optical connector 512 includes lens elements 508, transparent windows 509, and an input/output signal gap 510. An optical signal emerging from an optical fiber encounters a lens element 508 configured to substantially collimate the optical signal. The collimated optical signal passes through a signal gap 510 and encounters a lens element 508 configured to substantially focus the optical signal and couple it to an optical fiber. Coupling the optical signal to the lens elements 508 can be accomplished through any suitable optical element or combination of elements, such as, for example, physical proximity, optical gels, adhesives, prisms, diffraction gratings, waveguides, mirrors, or any combination of these. In some embodiments, the signal gap 510 includes one or more transparent windows 509 having a planar exterior surface. The exterior surface can be the surface that is adjacent to or abuts with a complementary non-contact optical connector.

The one or more input/output signal gaps 510 can be about 1 mm between corresponding lens elements 508. In some embodiments, the signal gaps 510 can be about 2 mm long, between about 1 mm and 2 mm long, between about 0.5 mm and 3 mm long, less than or equal to about 0.5 mm long, or greater than or equal to 3 mm long.

The lens elements 508 can include any suitable material such as, for example, diamond, sapphire, glass, polymer/acrylic, polycarbonate, similar materials, or any combination of these. Materials such as diamond or sapphire may be advantageous because of their durability (e.g., their resistance to scratches or abrasions), optical quality, and cost-effective characteristics given the small size desired (e.g., small size requirements make it so that the difference in cost of these materials is acceptable given the other qualities they possess).

The combination of signal gap 510 and/or transparent windows 509 and lens elements 508 can be configured to facilitate maintenance of the optical connection between optical cables 502a and 502b. The lens elements 508 or transparent elements (illustrated in Appendix A) can be protected due at least in part to the transparent windows 509. In some embodiments, the transparent windows 509 form an exterior surface that is substantially co-planar with the connector with which it is associated. Thus, the transparent windows 509 can be easily cleaned by wiping or otherwise clearing debris or other contaminants from the planar surface of the transparent window 509, thereby keeping the optical connection intact. The lens elements 508 and/or transparent windows 509 can also be treated with coatings designed to increase their resistance to abrasions, scratches, condensation, signal loss, and the like. The output power of the optical signal can also be tuned to compensate for possible signal loss across the non-contact optical connectors 512. Because the signal is digital and not analog, a substantial loss of intensity of the optical signal across the non-contact optical connectors 512 may not necessarily result in a significant loss of information. Thus, the non-contact optical connection is robust and facilitates the maintenance of a signal across the system.

Example Communication System Interlink

FIG. 6A illustrates a block diagram representing an example intrapersonal data communication system from a visualization system to a data processing system. FIG. 6B illustrates a block diagram representing an example duplex/bi-directional intrapersonal data communication system between a visualization system and a data processing system. Within a visualization system, video processing electricals 602 produce an electrical digital signal which can be transmitted to a fiber optic transmitter 604. The fiber optic transmitter 604 can convert the electrical digital signal to an optical digital signal utilizing a radiation source 606 such as, for example, a VCSEL. The optical digital signal can be coupled to an optical fiber 610 through a suitable optical component 608, such as a lens. The optical fiber carries the optical digital signal until it reaches the mounting hardware securing the visualization system to the headgear system. The optical signal can be transmitted from the visualization system to the optical fiber 610 within the mounting hardware through a non-contact optical connector 618. Non-contact optical connector 618 includes a plurality of optical components 608 with a gap of air or other fluid between them. Similar non-contact optical connections can occur between the mounting hardware and the headgear system, and the headgear system and the data processing system. The optical digital signal can be coupled to a photodetector 612, such as a photodiode. The photodetector 612 can convert the optical signal into an electrical signal, which is translated into a corresponding electrical digital signal in a fiber optic receiver 614. The electrical digital signal can be communicated to the video processing electricals 616 housed by the data processing system.

In some embodiments, the fiber optic transmitter 604 and the radiation source 606 can be external to the visualization system and can be located, for example, in an adapter or signal converter, or in the mounting hardware, or in the headgear system. In some embodiments, the photodetector 612 and fiber optic receiver 614 are external to the data processing system and can be located, for example, in an adapter or signal converter, or in the mounting hardware, or in the headgear system.

In some embodiments, the video processing electricals include one or more hardware processors, memory, and/or other such components for processing video or image information, processing location information, displaying video or images, displaying images and textual information, displaying video and textual information with graphical overlays, or the like. For example, the video processing electricals of the visualization system can be capable of displaying a video feed of real time thermal information with objects of interest distinguished using a graphical overlay provided by the data processing system and textual information communicated from the data processing system. In another example, the video processing electricals of the visualization system can be configured to display real-time video corresponding to an image-intensified view, combined image intensified and thermal, or other combined/fused multi-sensor view of a scene with a portion of that video being overlaid with other alphanumeric or icon data, or a map with the location of persons or objects of interest being indicated on said map as provided by the data processing system. In another example, the visualization system can be configured to display a real-time video feed of a telescopic view of a scene with textual information relating to distances to objects of interest as provided by the data processing system overlaid on the video feed. The visualization system and data processing system can be configured to display other such information to the user and the capabilities of the system are not limited or completely described by the examples provided above.

Power and Bandwidth

The communication represented by the block diagrams in FIGS. 6A and 6B can be accomplished consuming less than or equal to about 500 mW of electrical power at real-time video data rates, and can be lower in other operational situations. In some embodiments, real-time video data rates can be sustained consuming less than or equal to about 200 mW, less than or equal to about 100 mW, or less than or equal to about 50 mW. The power can be provided by a power source within the data processing system, or the visualization system, or by an external power source.

The bandwidth between the visualization system and the data processing system can be less than or equal to about 10 Gbps enabling real-time (i.e., no or low-latency) high-resolution video processing. In some situations the bandwidth can be reduced to a few kbps in modes where system synchronization or sensor status information is being provided to the data processor rather than real-time video from the visualization system. The bandwidth can be tuned to consume lower power by selective video window sampling, reduced data update rate, very low latency JPEG compression of video, or other techniques to reduce power consumption of the fiber optic transmitter and receiver components 604 and 614, respectively, as well as reducing data processor power draw, while still meeting operational needs of the user. In some embodiments, less than or equal to about 50 mW of electrical power to the communication system can enable the system to provide less than or equal to about 2 Gbps of bandwidth. For example, the HXT4101A-DNT fiber optic transmitter provided by GigOptix, Inc, is capable of 14 Gbps communication, but will provide about 2 Gbps when supplied with about 50 mW of electrical power. In some embodiments, it may be advantageous to move to operational modes that lower the bandwidth requirement of the system to reduce power because lower power enables the overall system to operate for longer periods of time on battery power. Reducing the power provided to the system may reduce the available bandwidth to the communication system but still may be sufficient for the communication needs of the system. For example, in embodiments where between about 20 mW and 30 mW is provided to the communication system, about 1 Gb/s to 2 Gb/s throughput can be achieved which can be sufficient for real time processing and display of information and selectively windowed video plus other data sources.

The power delivered to the communication system can be adjusted to account for signal strength across the communication system. Optical signal strength can be affected by loss of signal across non-contact optical connectors. In some embodiments, the power supplied to the communication system can be adjusted to account for signal strength. For example, if information is lost over the communication system, power to the fiber optic transmitter, the fiber optic receiver, or both can be increased such that the amount of information lost over the communication path due to signal loss is reduced to acceptable levels. In another example, if the loss of information is already below acceptable levels the power provided to the fiber optic transmitter, the fiber optic receiver, or both can be reduced until the loss of information is approximately at or below acceptable levels. In some embodiments, the data processing system, the visualization system, or both are configured to determine the amount of information loss over the communication system. The power output to the communication system can be altered according to the analysis provided by the visualization system, the data processing system, or both. In some embodiments, the amount of power provided to the communication system is determined by the user. In some embodiments, the amount of power provided to the communication system is determined by an external parameter or input.

The power delivered to the communication system can be adjusted according to power management parameters. For example, the communication system can be commanded to enter a low power consumption mode whereby the amount of power consumed by the system is reduced. The communication system can be commanded to enter a high power consumption mode whereby the amount of power is increased. The communication system can be commanded to enter into a specific mode whereby the power consumed is within a defined range. The command to enter a power consumption mode can be made by a user, an external communication command delivered to the communication system, as a result of conditions being met within the system, or any combination of these.

The power delivered to the communication system can be adjusted according to bandwidth parameters. In some embodiments, the available bandwidth across the intrapersonal data communication system corresponds to the power delivered to the system. The power can be adjusted to account for differing bandwidth desires. For example, during instances where the quantity of information to be passed over the communication link exceeds a threshold, the power provided to the system may be increased. Similarly, in instances where the quantity of information to be passed does not exceed a threshold, the power provided to the system may be reduced. In some embodiments, the power provided to the system may be scaled according to a desired bandwidth. The desired bandwidth may be input by the user, may be determined by a program internal to the communication system, may be set by a command from an external communication, or any combination of these.

Example Intrapersonal Data Communication Methods

Figure 7:
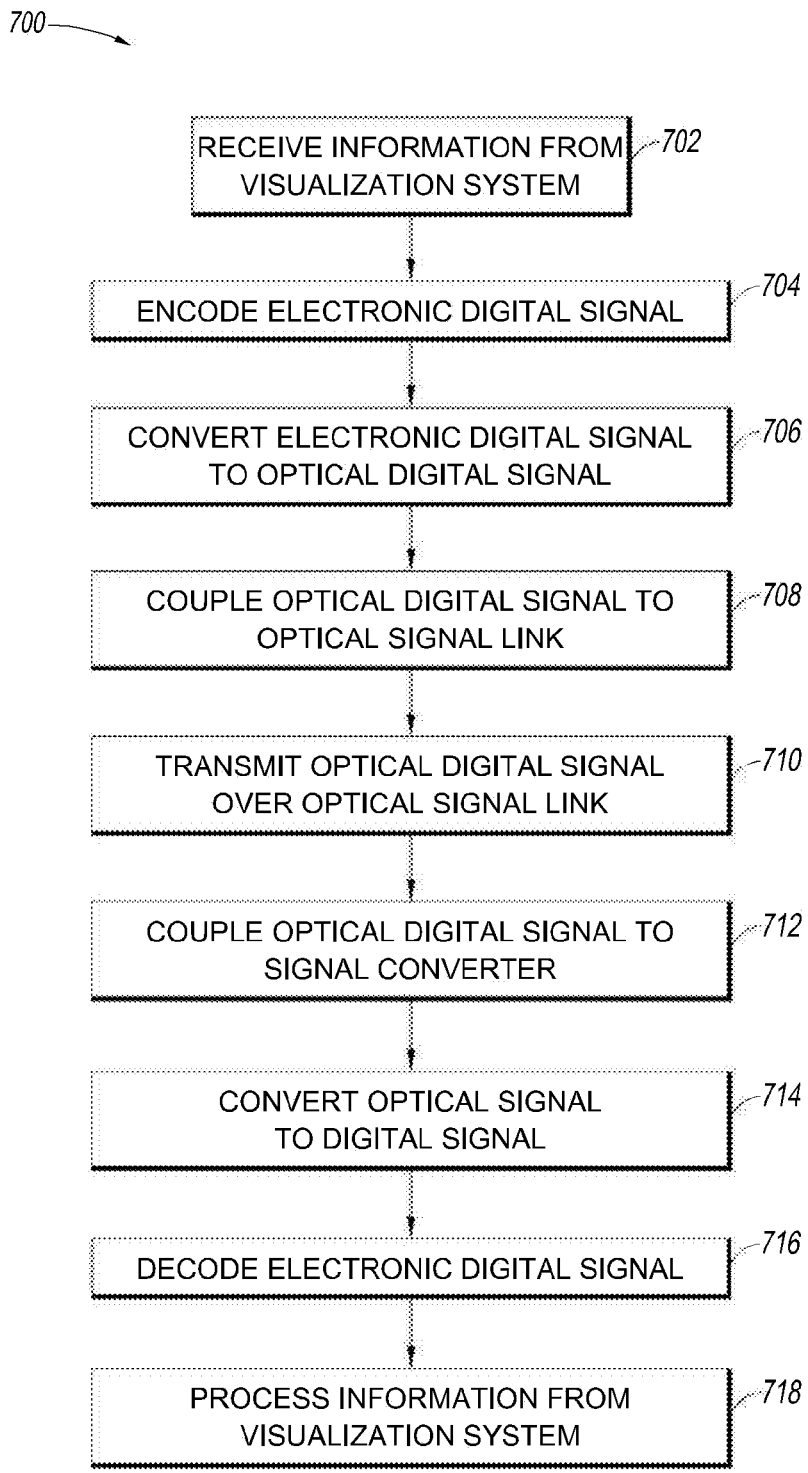
FIG. 7 illustrates a flow chart of an example method of transmitting information from a visualization system to a data processing system.

FIG. 7 illustrates a flow chart of an example method 700 of transmitting information from a visualization system to a data processing system. The method 700 includes receiving information from a visualization system as stated in operational block 702. Information from the visualization system can include information such as, for example, thermal image information, a thermal video feed, image intensified information, telescopic visual information, visualization system line of sight pointing information, system status information, simulated visual information, video information from a camera, or any combination of these.

Information provided by the visualization system is encoded into an electrical digital signal in operational block 704. The step of encoding the information can include processes such as, for example, converting analog information into digital information, compressing digital information such as video or image data, encapsulating information within appropriate digital packets, modifying digital information to conform to a specific I/O protocol, multiplexing multiple digital signals into a single digital signal, or any combination of these.

Operational block 706 indicates that the electrical digital information can be converted into an optical digital signal.

Converting an electrical digital signal can include processes such as, for example, producing an intensity of radiation in proportion to the input current or voltage of the electrical signal; producing a first intensity of radiation when the input electrical signal exceeds a threshold, and a second intensity of radiation when it does not; converting multiple electrical digital signals into multiple optical signals and multiplexing the optical signals using a technique such as wavelength division multiplexing; or any combination of these. The conversion of electrical digital information to optical digital information can be performed within the visualization or data processing systems as described herein in relation to FIGS. 4B and 4C, or some embodiments as described herein in relation to FIGS. 6A and 6B, or within a component such as an adapter or signal converter as described herein in relation to FIGS. 4A and 6A.

Optical digital information can be coupled to an optical digital signal link in operational block 708. Coupling the optical signal to the optical digital signal link can be accomplished through any appropriate optical element, such as, for example, physically contacting an optical fiber to the radiation source, utilizing one or more lenses to focus the optical signal into an optical fiber or waveguide, utilizing an optical gel or similar substance to optically couple the radiation source to the waveguide or optical fiber, or any combination of these. Coupling the radiation source to a waveguide or optical fiber can be accomplished using a non-contact optical connection such as those described herein in relation to FIG. 4A, 4B, 4C or 5.

The optical signal can be transmitted over an optical digital signal link in operational block 710. Transmission across an optical digital signal link can include transmitting the optical signal across one or more optical digital signal bridges having non-contact optical connectors. In some embodiments, one or more optical digital signal bridges can be traversed between a visualization system and a data processing system. The optical digital signal bridges can be similar to those described herein with reference to FIG. 4A, 4B, 4C or 5.

Operational block 712 indicates that the optical signal can be coupled to a signal converter or optical digital signal adapter. The signal converter can be configured to convert an optical digital signal into an electrical digital signal. The signal converter can be a separate component, as described herein in relation to FIG. 4A, or can be integral to a visualization system or data processing system, as described herein in relation to FIGS. 4B and 4C. The signal converter can include a fiber optic receiver and associated electricals. Coupling the optical signal to the signal converter can be accomplished by any appropriate technique, such as those described herein.

The optical signal can be converted into an electrical digital signal in operational block 714. Converting an optical digital signal into an electrical digital signal can include processes such as, for example, detecting a quantity of radiation from an optical fiber or waveguide and producing an electrical voltage or current in proportion to the quantity of radiation, producing one electrical voltage or current if the detected radiation exceeds a threshold and a second electrical voltage or current if it does not, demultiplexing a multiplexed optical signal, or any combination of these. The optical digital signal can then be transmitted across an optical signal cable.

The electrical digital signal can be decoded in operational block 716. Decoding the electrical signal can include processes such as, for example, demultiplexing the electrical digital signal, converting digital information into analog information, decompressing digital information such as video or image data, compressing digital information, interpreting encapsulated information within digital packets, modifying digital information to conform to a specific I/O protocol, or any combination of these.

Information can be processed by a data processing system in operational block 718. Processing information from the visualization system can include, for example, locating objects of interest within image or video information, calculating temperatures ranges within an infrared image or video feed, visually enhancing the imagery for redisplay to the user or transmission, processing video and other data from the visualization system with data from other external sensors to determine respective pointing positions, analyzing the information for distances to objects or persons, calculating the position and orientation of the visualization system, or any combination of these. The data processing system can include one or more hardware processors and memory. The data processing system can include a power source. The data processing system can be configured to process information from, for example, one or more visualization systems, external communications systems, external video sensors, external system line of sight sensor data, GPS systems, external system synchronization signals, environmental information from sensors, user input, user commands, or any combination of these.

Example Intrapersonal Data Communication System Components

Figure 8:
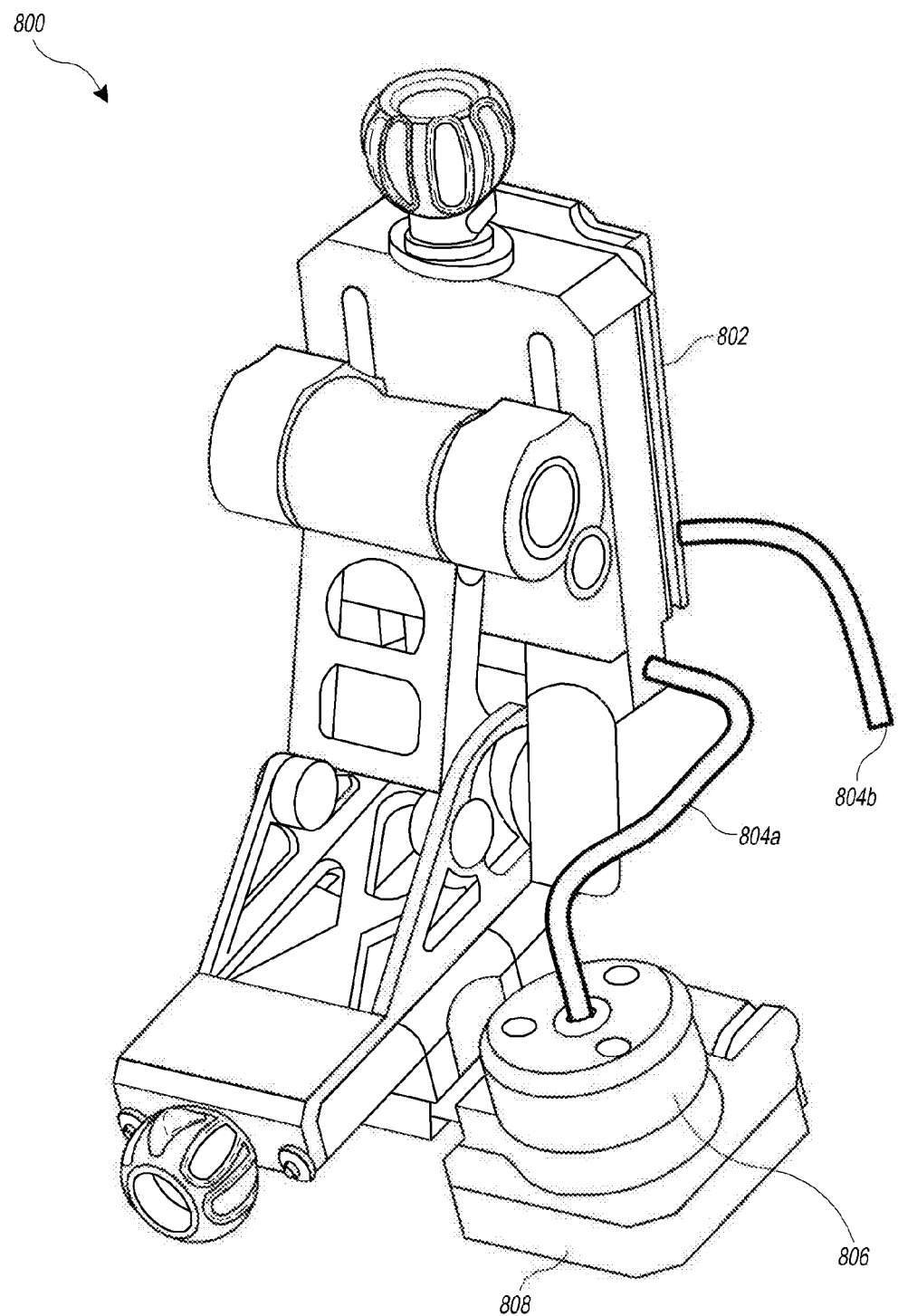
FIG. 8 illustrates a perspective view of an example of mounting hardware and an optical digital signal link routing within the mounting hardware.

FIG. 8 illustrates mounting hardware 800 configured to secure a visualization system to a headgear system according to some embodiments. For example, the mounting hardware 800 can connect a thermal imaging goggle or multi-sensor imaging goggle to a helmet, a night-vision camera to a hat, and so forth. The mounting hardware includes a non-contact optical connector 802, optical digital signal links 804*a* and 804*b*, an optical digital signal bridge 806, and a connector interface 808.

The non-contact optical connection 802 can be configured to transmit an optical digital signal from optical digital signal link 804*a* to optical digital signal link 804*b*. In some embodiments, the non-contact optical connection 802 connects at least one power and one return line between optical digital signal links 804*a* and 804*b*. The non-contact optical connector 802 can be similar to those connectors described herein with reference to FIGS. 4A, 4B, 4C, and 5.

Optical digital signal bridge 806 can be configured to transmit an optical digital signal from a visualization system to cable 804*a*. The optical digital signal bridge 806 can be configured to mate with the mounting hardware 800 or can be an integral part of the mounting hardware 800. The optical digital signal bridge 806 can be attached to the mounting hardware 800 by any appropriate connector such as, for example, adhesion, magnets, screws, bolts, rivets, or any combination of these. In some embodiments, the optical digital signal bridge 806 is instead an optical digital signal adapter where the visualization system is configured to send and receive electrical digital signals.

The connector interface 808 can be configured to releasably couple with the corresponding connector on the visualization system. The connector interface 808 can be integrally formed with the mounting hardware 800 or can be a separate component. The connector interface can be attached to the mounting hardware 800 by any appropriate technique, such as one or more of those described herein.

Example Intrapersonal Data Communication System in a Headgear System

Figure 9:
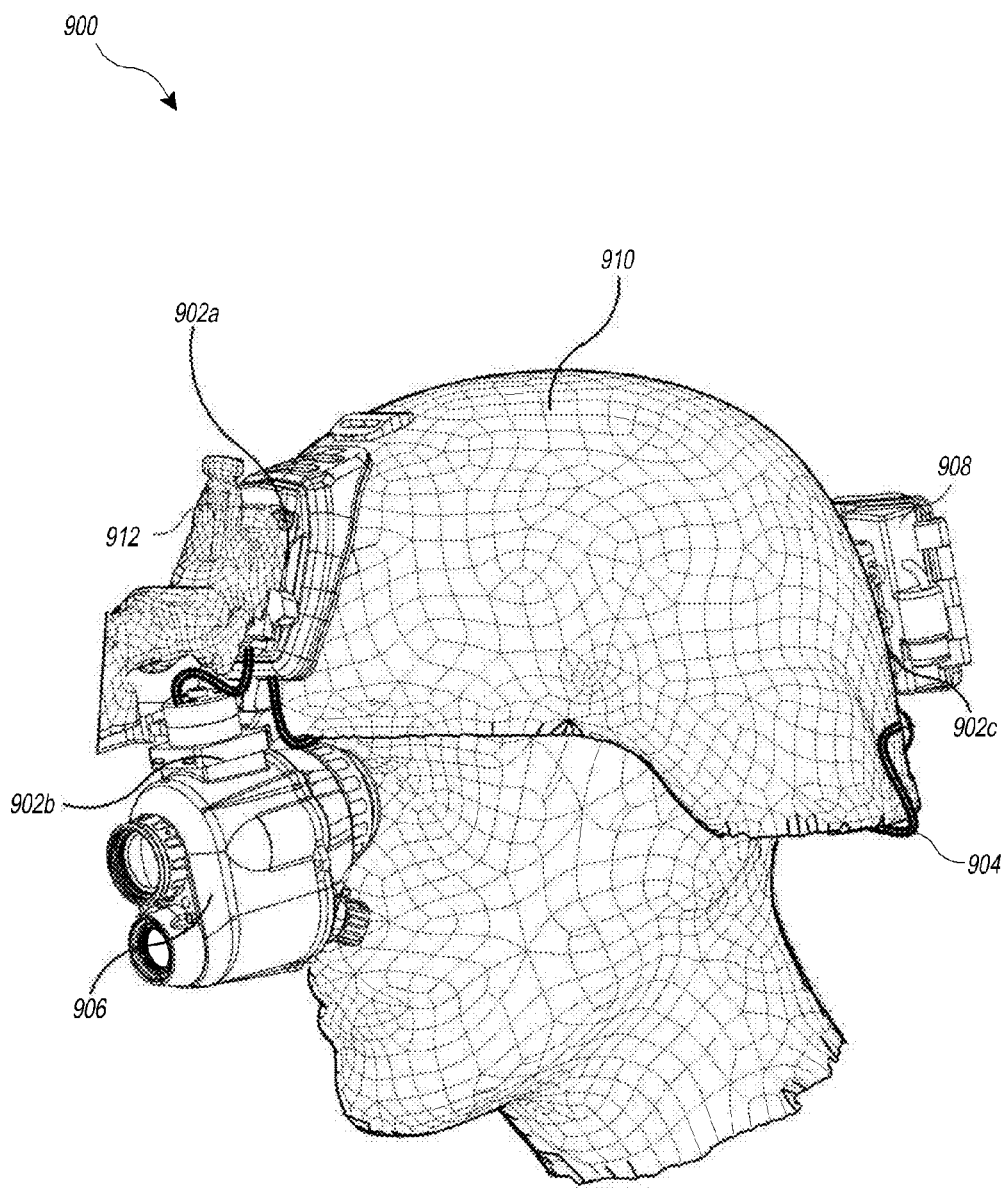
FIG. 9 illustrates a perspective view of an example intrapersonal data communication system mounted on a helmet with a visualization system and a data processing system.

FIG. 9 illustrates a perspective view of an example intrapersonal data communication system 900 mounted on a helmet 910 with a visualization system 906 and a data processing system 908. The system 900 can include a mounting bracket 912, optical digital signal link 904, and optical digital signal bridges or adapters 902a, 902b, and 902c. The visualization system 906 can include a thermal imaging camera, ultraviolet (UV) camera, visible band camera, near infrared (NIR) camera, short wave infrared (SWIR) camera, display, image intensifier tube based sensor mounted to the headgear system or incorporated in a goggle for use during the day or at night, EBAPS, telescopic goggle, or the like. The data processing system 908 can include items such as, for example, a battery pack, a data/image computation module, external sensor interfaces, external communication system, or any combination of these.

The optical digital signal bridge 902a connects a segment of the optical digital signal link 904 in the mount bracket 912 to a segment of the optical digital signal link 904 in the helmet 910. The optical digital signal bridge or adapter 902b connects the segment of the optical digital signal link 904 in the mount bracket 912 to the visualization system 906. The optical digital signal bridge or adapter 902c connects the segment of the optical digital signal link 904 in the helmet 910 to the data processing system 908. The optical digital signal bridges or adapters 902a-c can include one or more optical fibers. The optical digital signal bridges or adapters 902a-c can include one or more power and return lines. The optical digital signal link 904 can be located between the exterior shell of the helmet 910 and the user's skull, between the exterior shell and inner padding of the helmet 910, it can be located along a periphery of the helmet 910, or along an exterior of the helmet 910.

Example Method of Manufacturing an Intrapersonal Data Communication System

Figure 10:
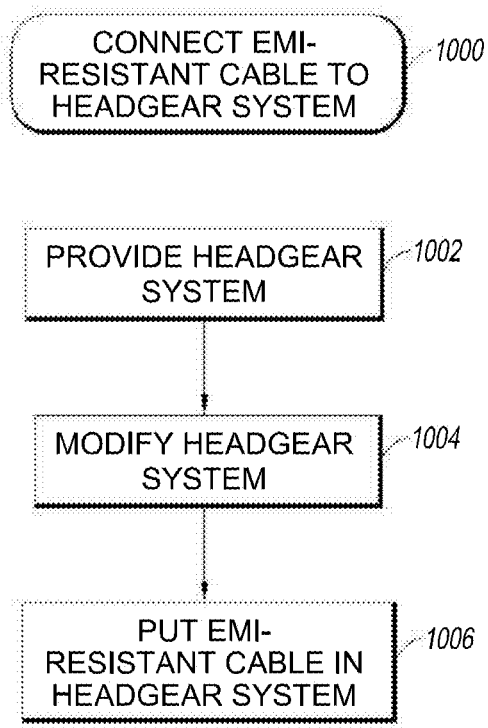
FIG. 10 illustrates a flow chart of an example method of preparing a headgear system for being fitted with an intrapersonal data communication system.

FIG. 10 illustrates a flow chart of an example method 1000 of preparing a headgear system for being fitted with an intrapersonal data communication system that includes an EMI-resistant optical signal cable. A headgear system is provided in operational block 1002. A headgear system can include items such as, for example, a helmet, cap, eyewear system with ear stems with resilient member, hat, head band, or any combination of these. The headgear system is modified in operational block 1004. Modifying the headgear system can include processes such as, for example, clipping on retainer members for supporting an cable; forming a route from the visualization system to the data processing system for the cable; creating a hole in the headgear system for the cable to pass through; mounting a clip or bracket onto the headgear system for the visualization system, the data processing system, or both; or any combination of these. Operational block 1006 includes putting the interference-resistant cable in the headgear system. This step can include processes such as, for example, pushing the cable into a narrow cavity where the cable can be secured in place by a friction fit retainer; placing the cable into clipping members; using adhesives to secure the cable to the interior of the headgear system; passing the cable through a tube integrated into the headgear system during the step in operational block 1004; pulling the cable through a hole created in the headgear system; or any combination of these.

Figure 11:
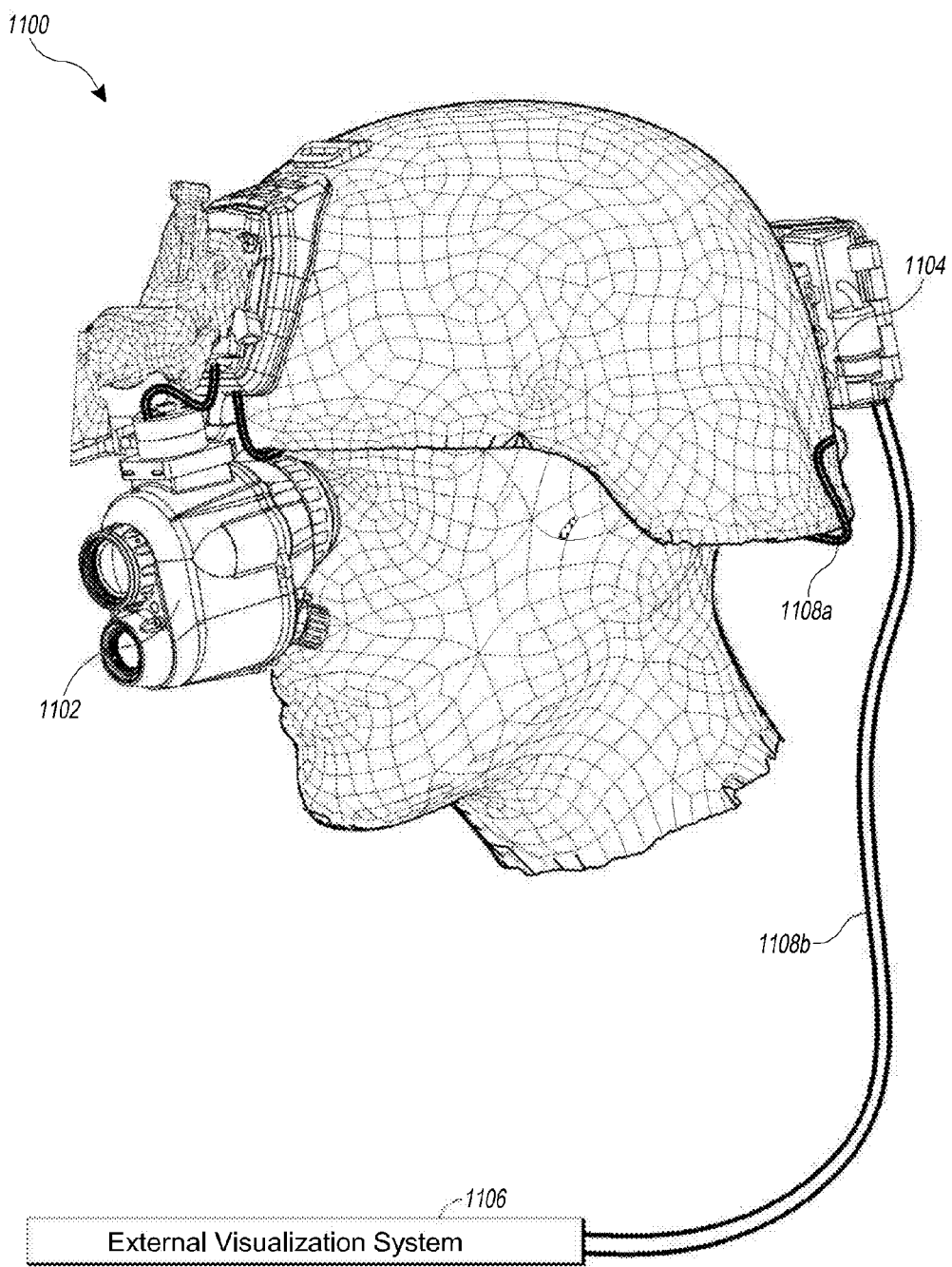
FIG. 11 illustrates an example intrapersonal data communication system incorporating a plurality of visualization systems, with at least one visualization system external to the headgear system.

Example Intrapersonal Data Communication System Including an External Visualization System FIG. 11 is a representation of some embodiments of an intrapersonal data communication system including a visualization system 1106 external to the headgear system 1100. A first visualization system 1102 can be provided that can be configured to communicate with a data processing system 1104 via an optical digital signal link 1108a according to the descriptions set forth herein. A second visualization system 1106 can be configured to communicate with the data processing system 1104 via an optical digital signal link 1108b according to the descriptions set forth herein. Optical digital signal bridges or adapters can be configured to connect the optical digital signals between the components as described herein. In some embodiments, the second visualization system 1106 can be connected to the data processing system by a suitable short-range, low-power, and/or high-bandwidth wireless link.

The second visualization system 1106 can include items such as, for example, a firearm, thermal imaging sight, CMOS video sight, multi-imaging sensor weapon sight, digital magnetic compass, laser pointer, rangefinder, GPS, synchronization signal generation, flashlight, command from user controls, a wireless communication system, or any combination of these. The second visualization system 1106 can be external to the headgear system. Information from the second visualization system 1106 can be combined with information from the data processing system 1104, first visualization system 1102, and data processing system derived video images; and the combined data can be relayed to the first visualization system 1102 to display to the user. In some embodiments, the information from the second visualization system 1106 can include information such as, for example, position and orientation of the visualization system line of sight (LOS), angular rates of the LOS, system synchronization signals, system operational state and environmental data, ballistics related data, or any combination of these.

Example Helmet Mount with Non-Contact Optical Connectors

Figure 12:
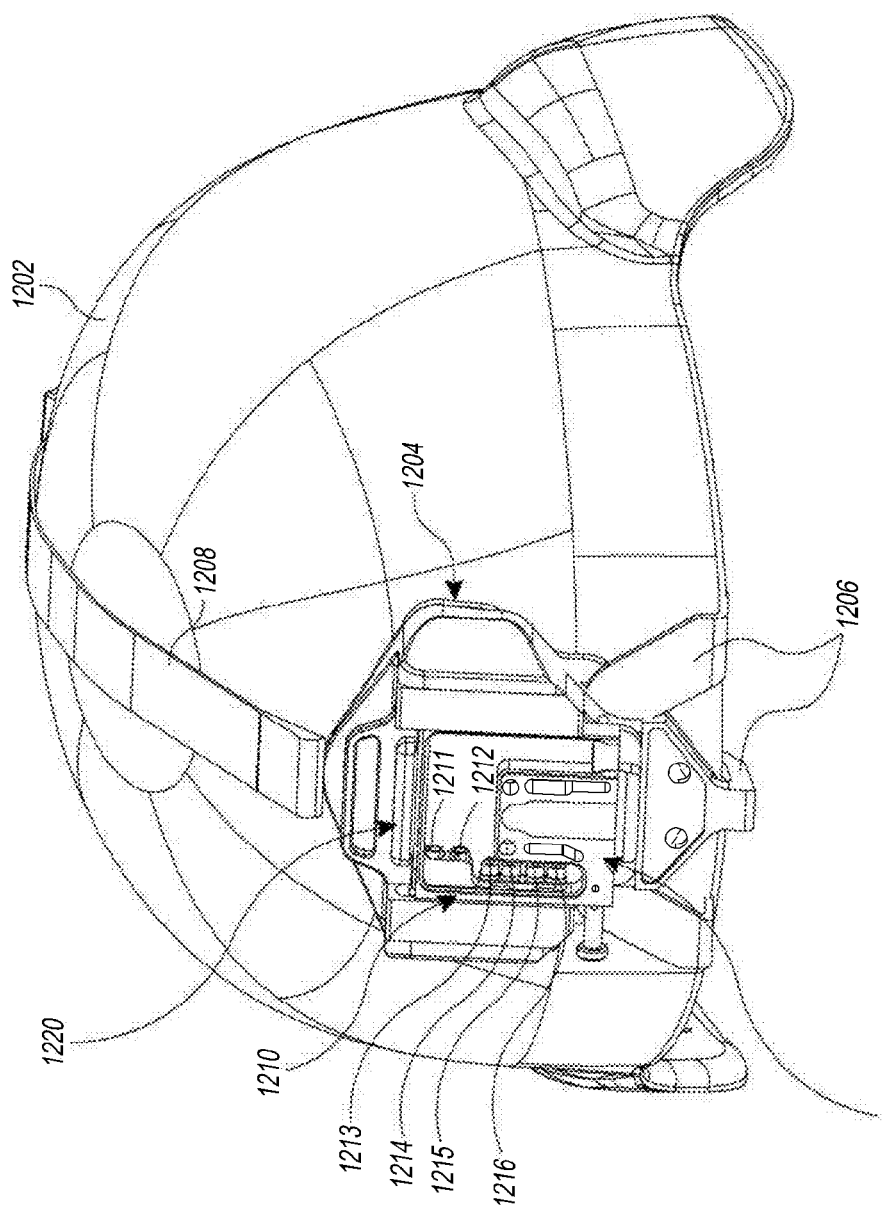
FIG. 12 illustrates a perspective view of an example embodiment of a helmet mount incorporating electrical and optical signal connectors.

FIG. 12 illustrates a perspective view of an example embodiment of a helmet mount 1204 incorporating optical and electrical connectors 1210 on a helmet 1202. The helmet mount 1204 can be secured to the helmet using a hook system 1206 and a strap 1208 which pulls the helmet mount 1204 so that the hook system 1206 applies a force on the helmet 1202 which substantially secures the helmet mount 1204 in place on the helmet 1202. The helmet mount can include features 1220 configured to mate to a corresponding mount for a visualization system (not shown), such as a night vision goggle, such that the mount for the visualization system can be secured to the helmet 1202 through the interface of the features 1220 on the helmet mount 1204 and features on the visualization system mount.

The helmet mount 1204 includes optical and electrical connectors 1210 configured to mate to corresponding optical and electrical connectors on the visualization system mount. When the visualization system is mounted to the helmet 1202 using the helmet mount 1204, the visualization system can send and/or receive optical digital signals through the optical connectors 1211 and 1212 that couple the optical signals to a fiber optic link that connects devices on an intrapersonal data communication system (not shown) on the helmet 1202. Furthermore, the visualization system can send and/or receive electrical power and/or electrical signals through the electrical connectors 1213, 1214, 1215, and 1216 that electrically couple the visualization system to electrical lines on the intrapersonal data communication system on the helmet 1202.

Figure 13:
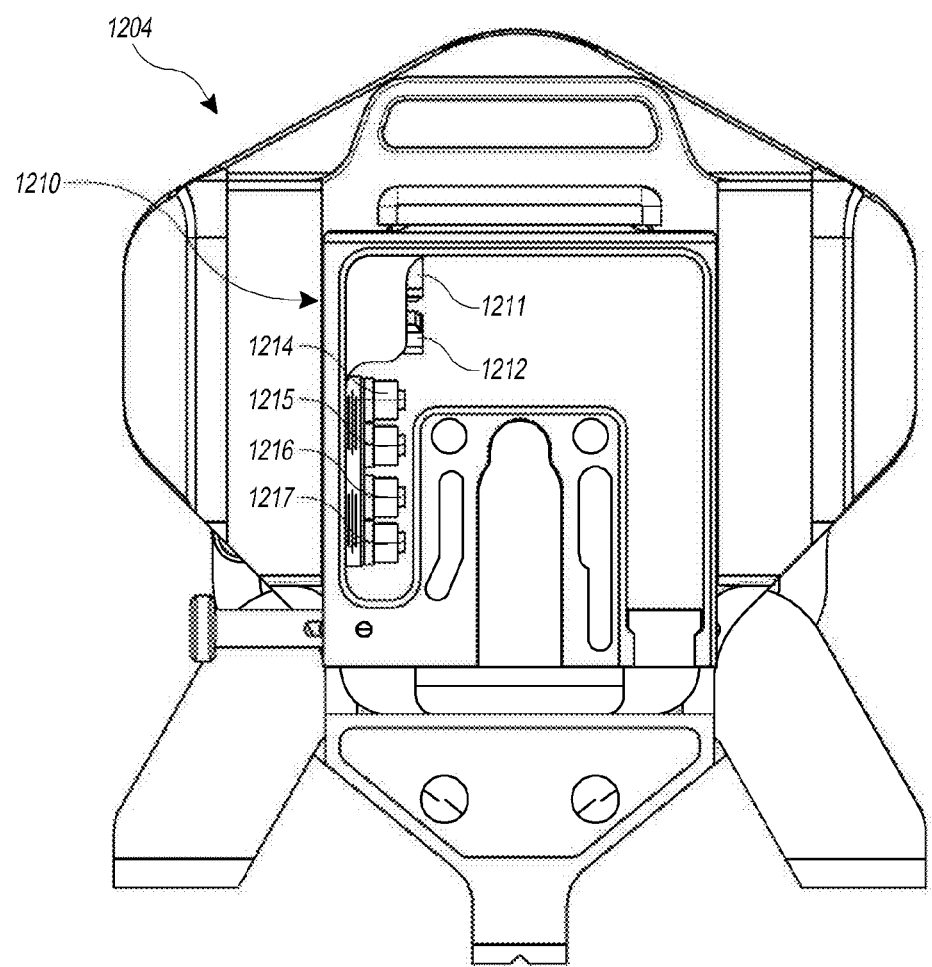
FIG. 13 illustrates the example helmet mount from the illustration in FIG. 12 to show the electrical and optical signal connectors.

FIG. 13 illustrates the example helmet mount 1204 from FIG. 12 to show the optical and electrical connectors 1210. The optical connectors 1211 and 1212 can be non-contact optical connectors, as described herein. For example, the optical connectors 1211 and 1212 can include a lens system configured to collimate (or focus) optical signals exiting (or entering) an optical fiber and a transparent window configured to provide a surface that protects the fiber optic and lens system and is compatible with a corresponding surface on a non-contact optical connector on the visualization system mount. The electrical connectors 1213-1216 can be any suitable electrical connector configured to transmit electrical power and/or electrical signals. For example, the electrical connectors 1213-1216 can comprise a spring-mounted plunger that electrically couples to a conductive surface on the visualization system mount.

Figure 14:
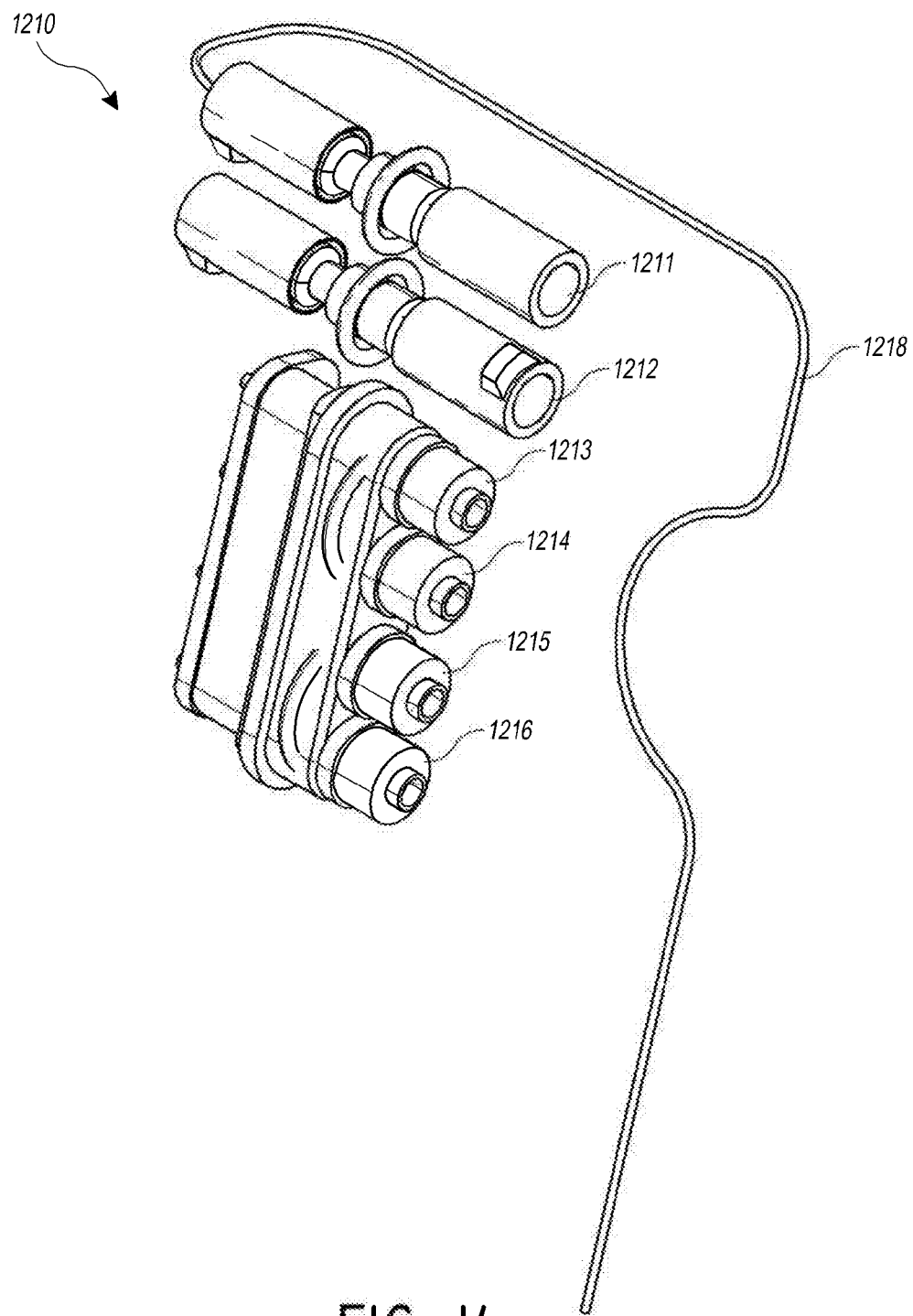
FIG. 14 illustrates the electrical and optical signal connectors from the example helmet mount illustrated in FIG. 12.

FIG. 14 illustrates the optical and electrical connectors 1210 from the example helmet mount 1204 in FIG. 12. A fiber optic cable 1218 is also illustrated to show an example of routing an optical signal from the non-contact optical connector 1211 through the helmet mount 1204. The fiber optic cable 1218 can be part of the intrapersonal data communication system that connects one or more local devices on the helmet 1202. Similarly, another fiber optic cable (not shown) can connect the non-contact optical connector 1212 to the intrapersonal data communication system. Furthermore, the electrical connectors 1213-1216 can be coupled to electrical lines, such as wires, that connect to other local devices and/or to the intrapersonal data communication system.

Example Optical Signal Connectors with Fiber Optic Cables Abutting a Transparent Window As described herein with reference to FIG. 1C, it may be desirable to use a fiber optic cable comprising a plurality of optical fibers tightly packed into a bundle to decrease the bending radius and to increase resistance to (1) cable failure due at least in part to optical fiber breakage and/or (2) signal diminution or loss when a fiber optic cable is bent or breaks. However, such fiber optic cables can have an optical diameter that is much larger than typical multimode optical fibers (e.g., compare the optical diameter of about 1 mm of the SCHOTT G2 fiber optic cable with a 200 um diameter for a typical multimode optical fiber). The increase in optical diameter can make collimating and/or focusing the output optical signal difficult for transmission across a non-contact connector gap as shown, for example, in FIGS. 4A-4C, 5, 17A and 17B. Signal can be lost across gaps where optical signals are to be transferred from one portion of an optical digital signal link to another portion where the transfer occurs through directing, focusing, and/or collimating the optical signal from a first portion of the fiber optic cable onto another portion of the fiber optic cable.

Figure 15A:
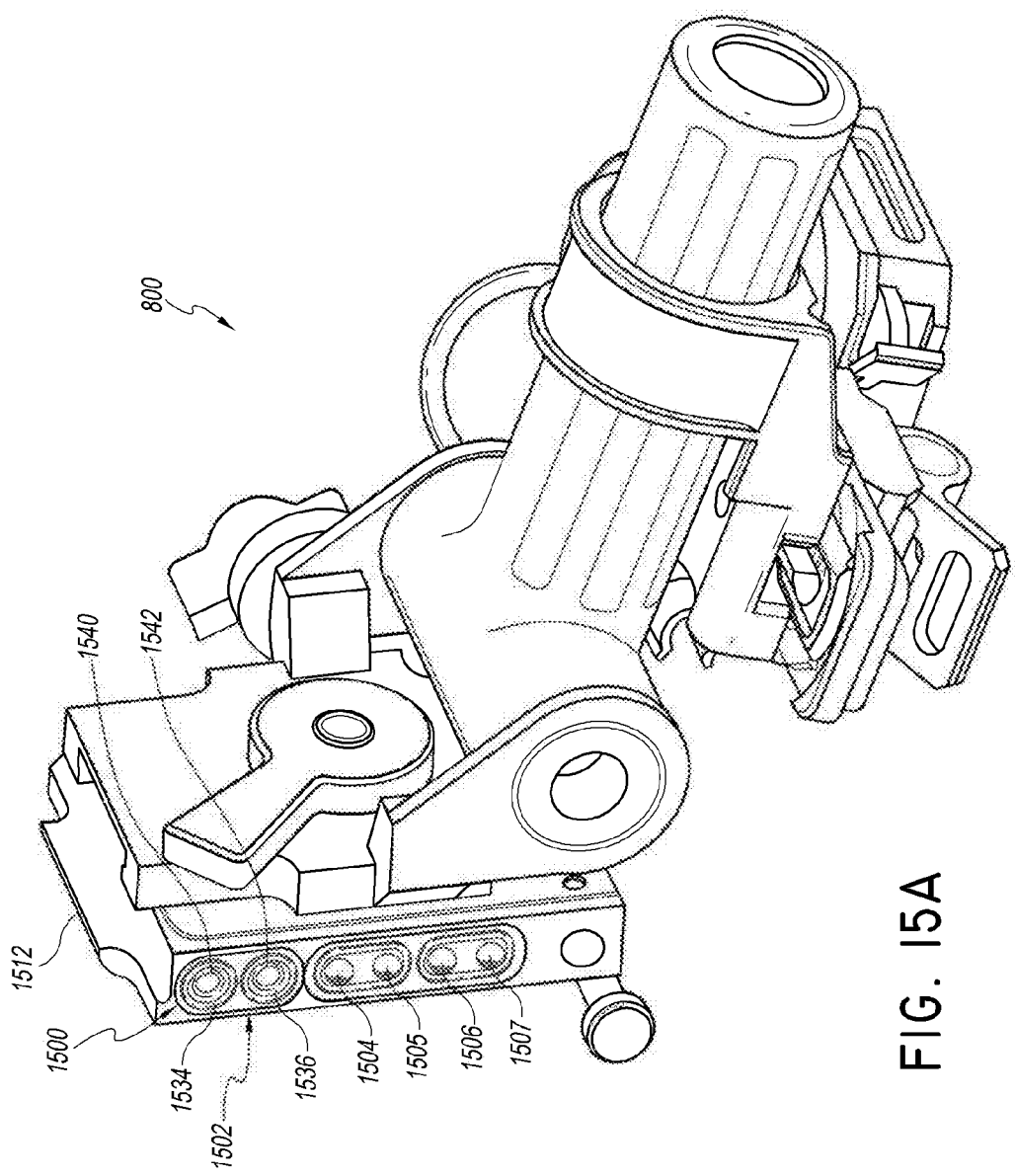
FIG. 15A illustrates a perspective view of another example embodiment of mounting hardware incorporating optical signal connectors.

FIG. 15A illustrates a perspective view of another example embodiment of mounting hardware incorporating optical signal connectors. The mounting hardware 800 in FIG. 15A is designed to temporarily, semi-permanently, or permanently engage a helmet mount, such as the helmet mount 1204 shown in FIGS. 12 and 13. The mounting hardware 800 may contain a tab 1512 that is configured to engage features 1220 of the helmet mount 1204, to secure the mounting hardware 800 to the helmet mount 1204. When engaged, portions of the mounting hardware 800 may line up and engage portions of the helmet mount 1204. Specifically, optical connectors 1211, 1212 may substantially line up with optical connectors 1500, 1502. Additionally, the electrical connectors 1213-1216 may substantially line up with electrical connectors 1504-1507. Optical connectors 1504-1507 may comprise transparent windows 1534, 1536, which are surrounded by seals 1540, 1542.

When the mounting hardware 800 engages the helmet mount 1204, the seals 1540, 1542 may come into contact with corresponding surfaces on the helmet mount 1204 creating a substantially sealed connection. This connection is configured to reduce or prevent dust, dirt, debris, and other materials, from becoming lodged between the transparent windows 1534, 1536 and the complementary optical connectors 1211, 1212, which could diminish or prevent signal transmittance across the non-contact optical connectors.

Figure 15B:
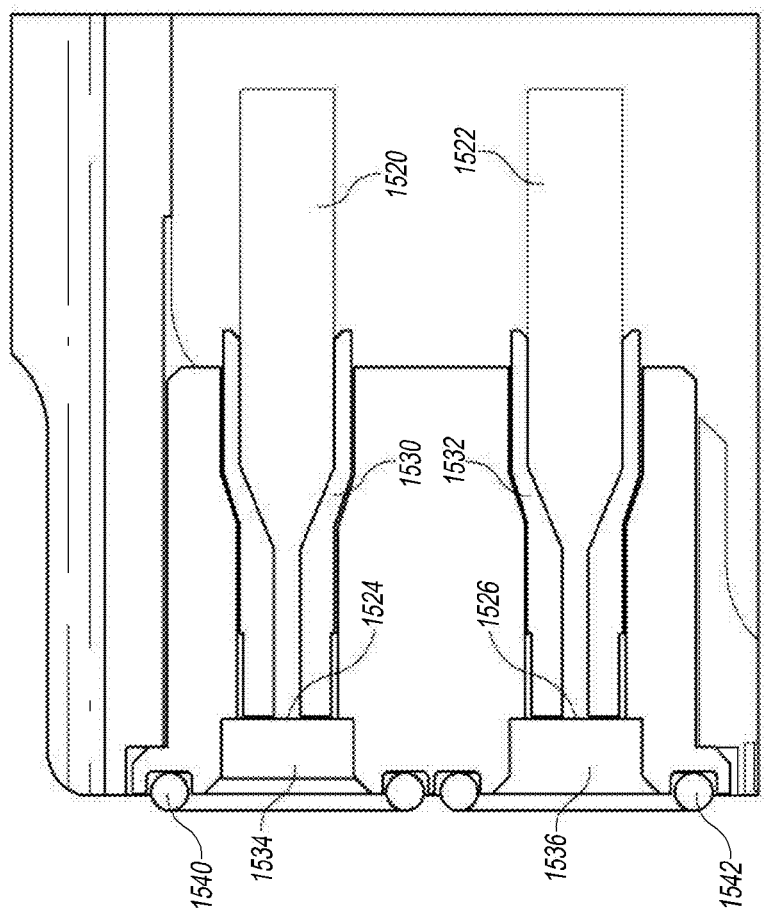
FIG. 15B illustrates a cross-section view of the helmet mount illustrated in FIG. 15A showing the fiber optic cables abutting the transparent window at the optical signal connector.

FIG. 15B illustrates a cross-section view of the helmet mount illustrated in FIG. 15A showing fiber optic cables 1520, 1522 abutting transparent windows 1534, 1536 at optical signal connectors 1500, 1502. In some embodiments, the two fiber optic cables 1520, 1522 shown in FIG. 15B are generally of equal diameter, each measuring at least about 100 μm and/or less than or equal to about 2 mm, at least about 150 μm and/or less than or equal to about 1 mm, or at least about 200 μm and/or less than about 500 μm. The ends 1524, 1526 of fiber cables 1520, 1522 may be compressed using cable compressors 1530, 1532, reducing their diameter. Reducing the diameters of cables 1520, 1522 may help to concentrate the signal at the ends of the cables, decreasing signal losses. As shown, the ends of the cables 1524, 1526 substantially abut the transparent windows 1534, 1536. The transparent windows 1534, 1536 may then be coupled adjacent optical connectors 1211, 1212. The optical connectors 1211, 1212 are coupled to optical digital signal link 114. The distance between the fiber optic cable ends 1524, 1526 and the ends of the optical digital signal link 114 may measure at least about 250 μm and/or less than or equal to about 6 mm, at least about 0.5 mm and/or less than or equal to about 5 mm, or between about 1 mm and 4 mm. In one embodiment, the distance between the transparent windows 1534, 1536 and fiber optic cable ends 1524, 1526 is reduced or minimized to decrease or minimize the distance between the fiber optic cable ends 1534, 1536 and the ends of the optical digital signal link 114. Such a configuration may advantageously decrease signal loss between the visualization system 110 and the data processing system 112.

Example Mount Interface with 90 Degree Turning Optical Element

Figure 16A:
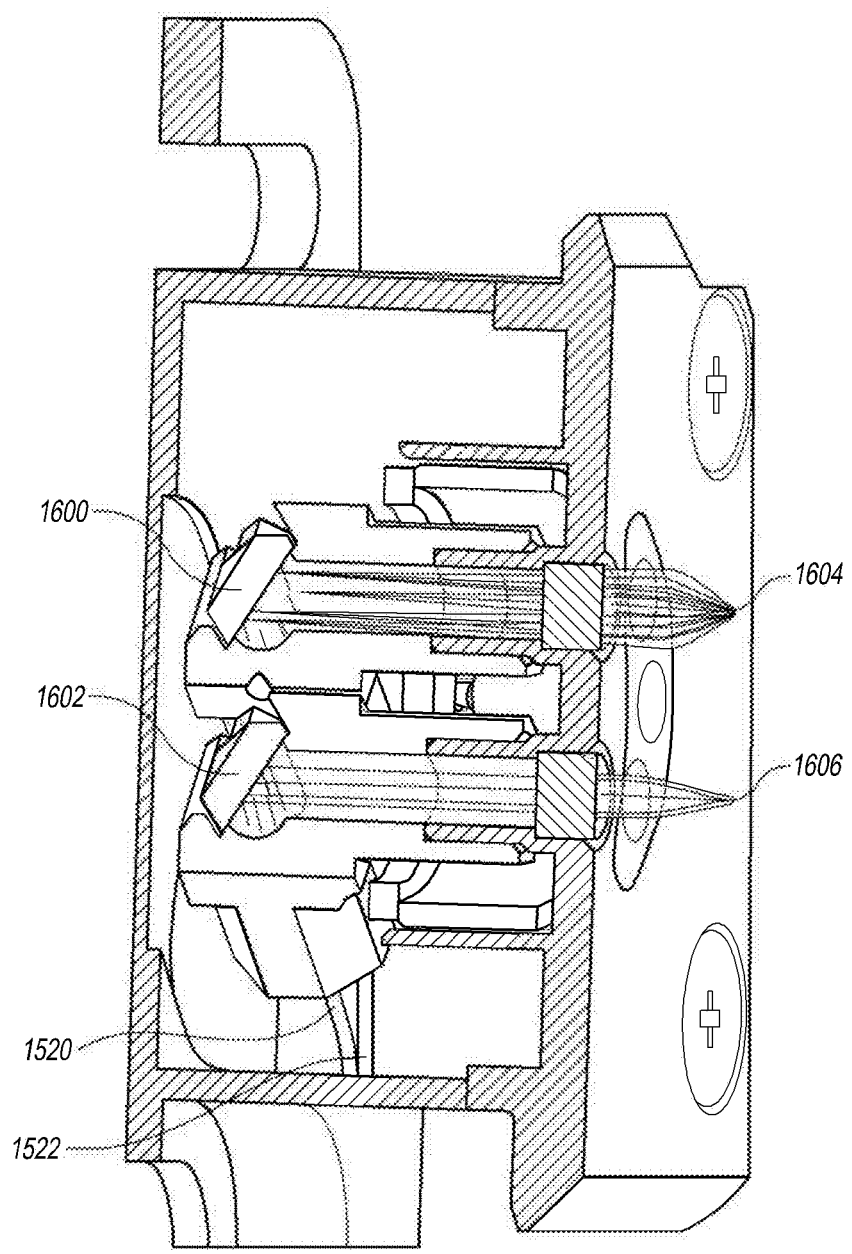
FIG. 16A illustrates a cross-section view of an example mount interface for a battery pack wherein the mount interface incorporates a 90 degree turning optical element to direct an optical signal to a fiber optic cable.

FIG. 16A illustrates a cross-section view of an example mount interface for a battery pack wherein the mount interface incorporates a 90 degree turning optical element 1600, 1602 to direct an optical signal to a fiber optic cable. The 90 degree turning optical elements 1600, 1602 can be used to transmit the optical signal from lenses 1604, 1606 to an optical digital signal link 114 via a 90 degree turn. Fiber optic cables 1520, 1522 that comprise a single, approximately 200 μm cable, may not be able to bend at a radius less than approximately 25 mm without risk of at least decreased signal strength and/or cable breakage. In such cases, it may be advantageous to use the 90 degree turning optical element, in order to facilitate a relatively tight bend in a compact and mobile environment. By making a 90 degree turn in a compact environment, a portion of the optical signal path may be better protected from exterior forces that could damage the cable.

As shown, the turning optical elements 1600, 1602 are mounted in a portion of the helmet mount 1204. Lenses 1604, 1606 are mounted in-line with the optical signal and help to collimate and/or focus the optical signal. Once the signal is transmitted to the turning optical elements 1600, 1602, the signal is redirected in a direction substantially perpendicular to its previous direction. After the signal is redirected, it is transmitted to optical digital signal links 114, which are coupled to the turning optical elements 1600, 1602.

Figure 16B:
FIG. 16B illustrates an example 90 degree turning optical element for use in the example mount interface of FIG. 16A.
Figure 16B:
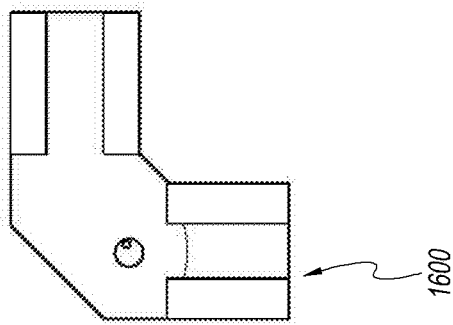

FIG. 16B illustrates an example 90 degree turning optical element 1600 for use in the example mount interface of FIG. 16A. One embodiment of a 90 degree turning optical element 1600 is shown adjacent to a United States dime. As shown, the overall size of this embodiment of the turning optical element may be relatively small. For example, in some embodiments an optical signal can be directed along a path that is orthogonal to its incoming path in a space that is smaller than a dime. However, other embodiments may be of other sizes including being larger or smaller than the illustrated embodiment, or of a similar size as the illustrated embodiment but with different relative proportions. The 90 degree turning optical element may comprise an internal 45 degree mirror which may facilitate redirecting a signal by 90 degrees. Other embodiments may include variations of this element, including, but not limited to: angles other than 90 degrees such as 22.5 degrees, 45 degrees, or any other angle in between 0 and 180 degrees inclusive; using an element that comprises multiple surfaces and/or multiple angles within a single unit; an element wherein the resulting bend angle is dependent on another factor or is otherwise variable; prisms that may be able to separate different wavelengths of a signal into discrete paths; and/or a unit that may facilitate filtering wavelengths in order to restrict some signals but transmit others.

Figure 16C:
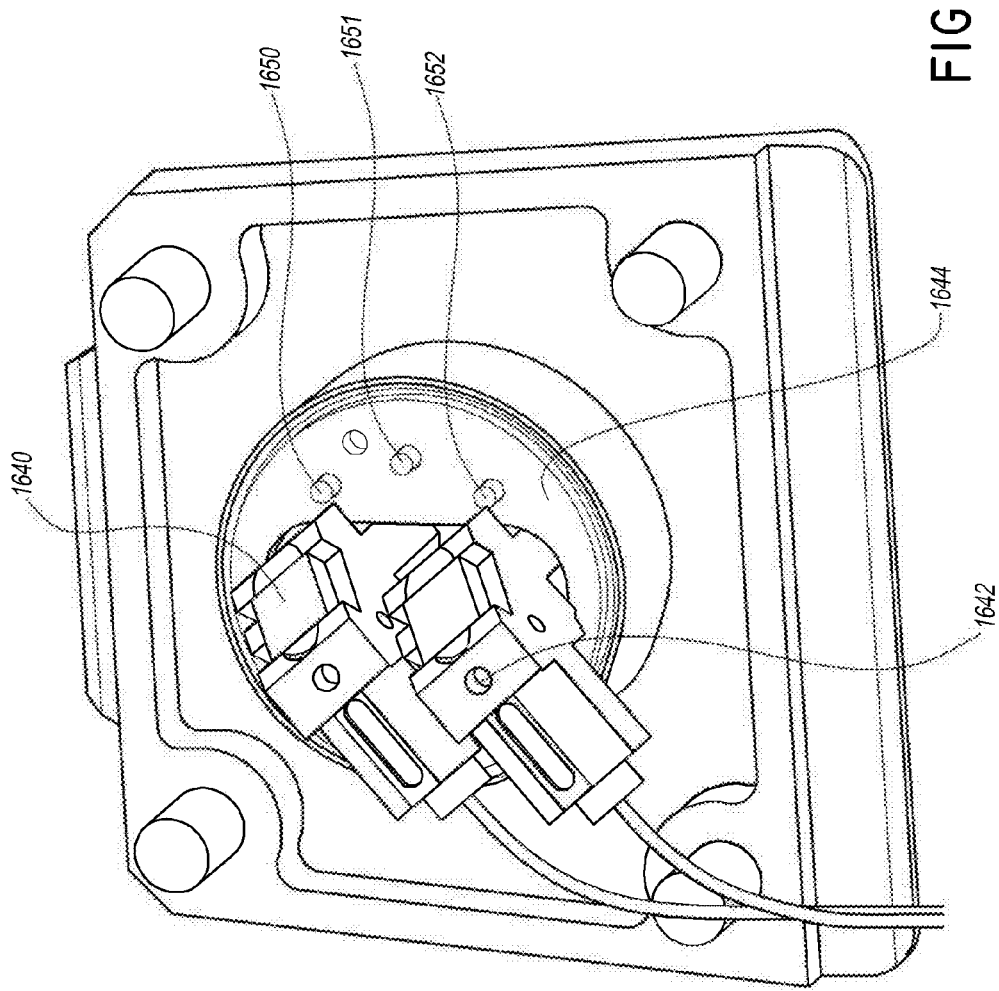
FIG. 16C illustrates a perspective view of the 90 degree turning optical element in use with an optical digital signal bridge, an example of which is illustrated in FIG. 3D.

FIG. 16C illustrates a perspective view of the 90 degree turning optical element 1640, 1642 in use with an optical digital signal bridge, an example of which is illustrated in FIG. 3D. As shown, the optical digital signal adapter 301 shown in FIG. 3D may comprise elements shown in FIG. 16C. In one embodiment, the elements shown in FIG. 16C are mounted on the backside of the optical digital signal adapter 301. The 90 degree turning optical elements 1640, 1642 engage the mounting plate 1644 in such a way that a portion of the turning elements 1640, 1642 substantially line up with the non-contact optical connectors 310. Electrical connectors 1650, 1651, 1652 are also illustrated in FIG. 16C and may connect or substantially line up with electrical connectors 308.

One embodiment may position an optical digital signal adapter 301 adjacent a helmet at the rear of the helmet in such a way that the backside of the signal adapter 301 will be in close proximity to a surface of the helmet. It may be advantageous to use 90 degree turning optical element in this embodiment since the space between the signal adapter 301 and the helmet may be limited. Furthermore, because there may limited protective covering guarding the elements shown in FIG. 16C, a 90 degree turning optical element may allow for the digital optical signal link 114 to be redirected in a compact space, reducing the likelihood that the signal link 114 will be exposed to exterior forces that could damage the cable.

Fiber Optic Cable Having a Relatively Tight Bending Radius

Figure 17A:
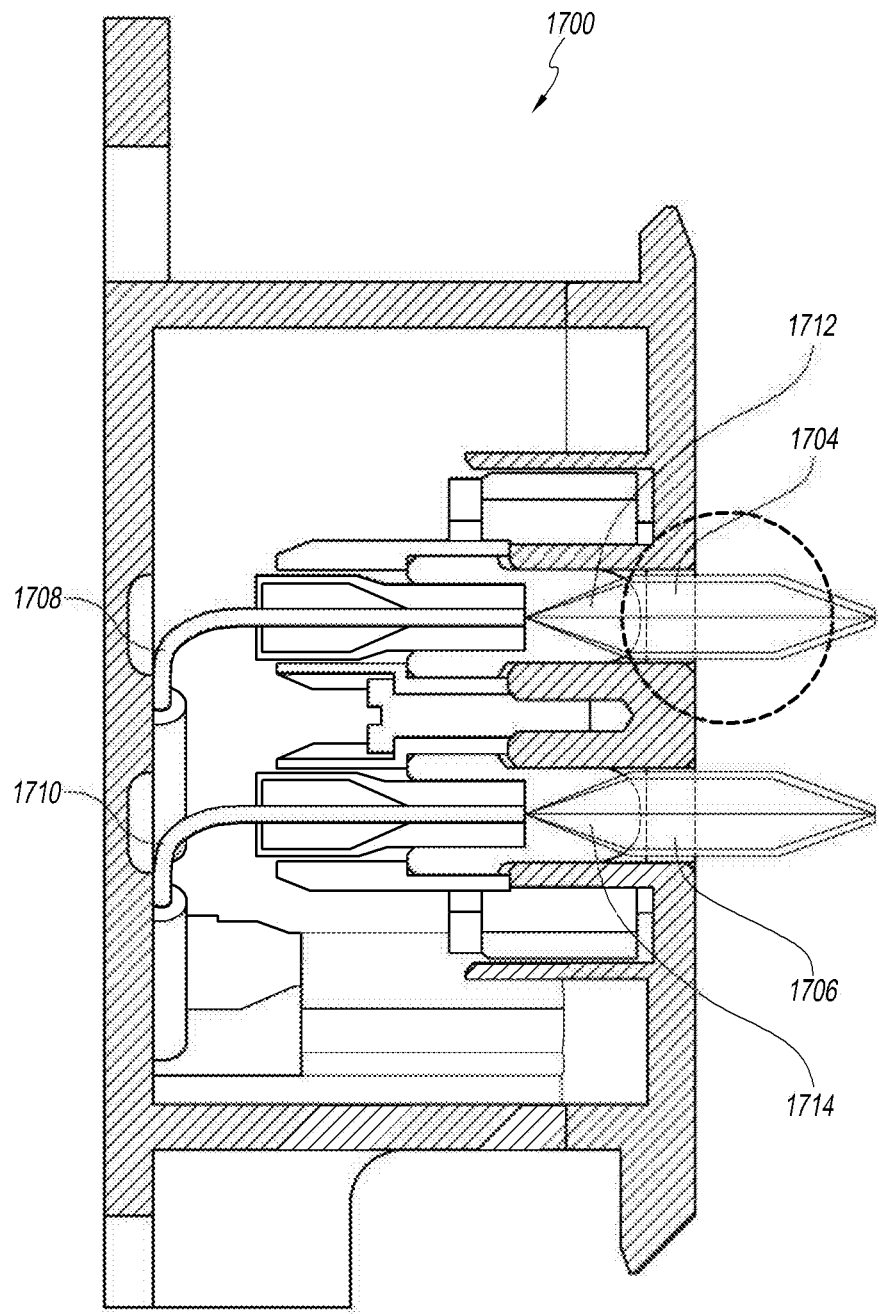
FIG. 17A illustrates a cross-section view of an example optical digital signal bridge having a fiber optic cable capable of being bent in a tight radius while maintaining a sufficient signal.

FIG. 17A illustrates a cross-section view of an example optical digital signal bridge 1700 having a fiber optic cable capable of being bent in a tight radius while maintaining a sufficient signal. One embodiment of a portion of the helmet mount 1204 is shown in FIG. 17A. Here, the helmet mount 1204 comprises an optical digital signal bridge 1700. The optical digital signal bridge 1700 comprises a transparent window 1704, a lens 1712 to help collimate and/or focus the optical signal, and an optical digital signal link 1708. In this embodiment, the transparent windows 1704, 1706 abut or are adjacent a complementary transparent window (not shown). The lens may be configured to collimate and/or focus the optical signal transmitted between the transparent windows 1704, 1706 and the end of the optical digital signal links 1708, 1710. The end of the signal links 1708, 1710 may be temporarily, semi-permanently, or permanently coupled to a portion of the helmet mount 1204.

In one embodiment, the diameter of the optical digital signal link 1708, 1710 may be at least about 30 μm and/or less than or equal to about 2 mm, at least about 500 μm and/or less than or equal to about 1.5 mm, or approximately 1 mm. In one embodiment, the optical digital signal link 1708, 1710 comprises a plurality of smaller fiber optic cables relatively tightly grouped together. In this embodiment the signal link 1708, 1710 that comprises a plurality of smaller fiber cables may be advantageous because it may be bent in a relatively tight radius. For example, a digital optical signal link 1708, 1710 that comprises a plurality of smaller fiber optic cables may be capable of being bent at a radius of as low as approximately 5 mm while maintaining sufficient signal strength. A tight bend radius may be advantageous in applications that benefit from the optical signal being redirected in a compact space (within a portion of the helmet mount 1204), since it may be helpful for the signal link 1708, 1710 to bend inside of the housing mount 1204 in order to reduce or minimize exposure to outside forces that may damage the cable. This same goal may also be achieved using a 90 degree turning optical element, as described above. However, using a digital optical signal link 1708, 1710 that can be bent at a relatively tight bend radius may provide advantages in different scenarios. For instance, it may be beneficial to use a relatively tightly bent digital optical signal link because it would simplify alignment, simplify installation, reduce cost, or any combination of these when compared to embodiments employing the 90 degree turning optical element. Additionally, there may be applications where the signal link would fit better physically than a turning element. Cost of production and installation, physical space and geometry limitations, reliability, flexibility, and versatility can all be considered when determining which embodiment is appropriate.

Figure 17B:
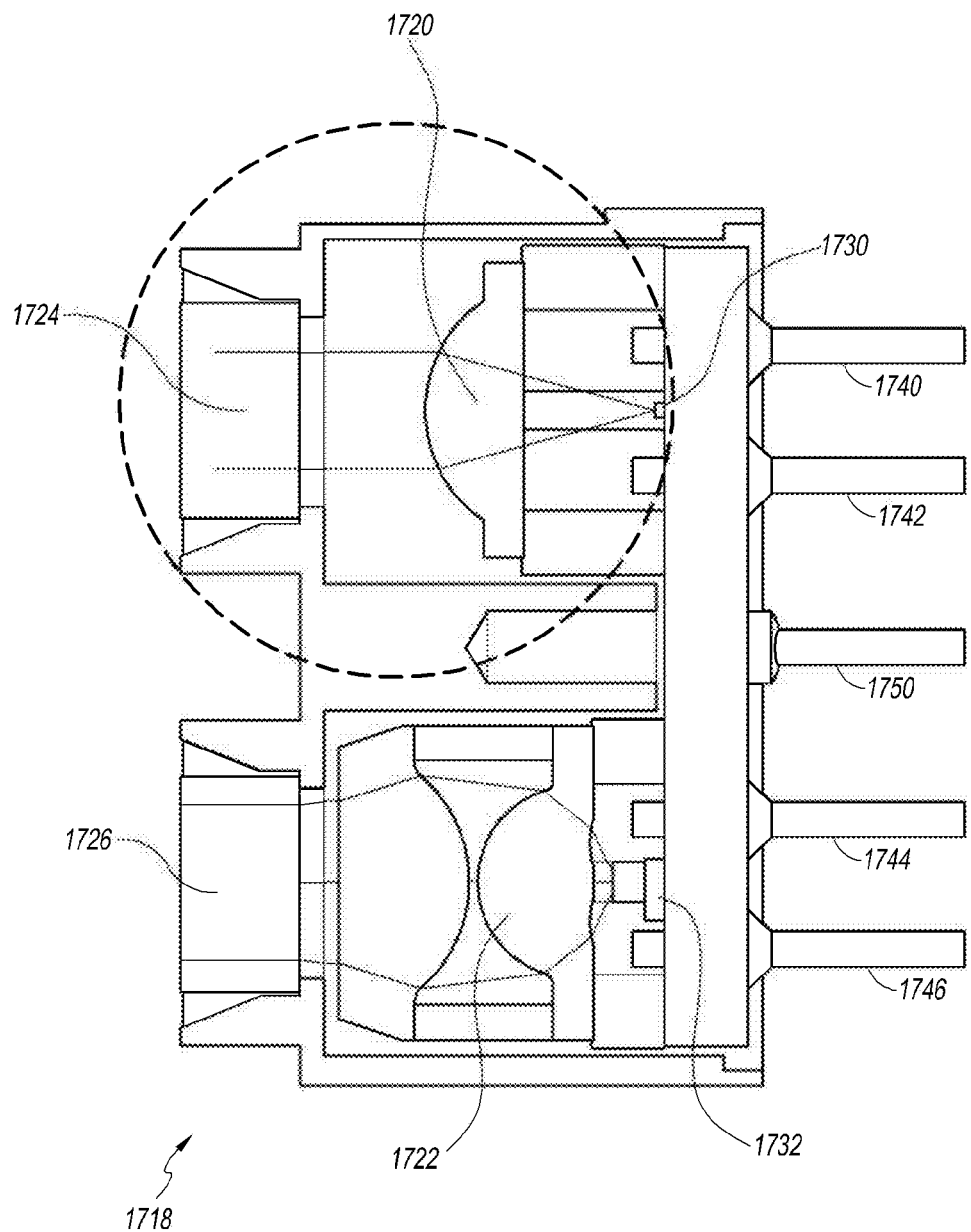
FIG. 17B illustrates a complementary optical digital signal connector on a local device coupled to the example digital signal bridge illustrated in FIG. 17A.

FIG. 17B illustrates a complementary optical digital signal connector 1718 on a local device coupled to the example digital signal bridge 1700 illustrated in FIG. 17A. As shown in this embodiment, an optical digital signal connector 1718 may comprise a transparent window 1724 and a lens 1720 configured to collimate an optical signal being emitted from a transmitter 1730. When the complementary optical digital signal connector 1718 is engaged with the digital signal bridge 1700, the transparent windows 1704, 1706 may substantially abut or be adjacent to complementary transparent windows 1724, 1726. In one embodiment, a signal may be transmitted from a transmitter 1730, through a first lens 1720 where the signal is collimated, through a first transparent window 1724, through a second transparent window 1704, through a second lens 1712 where the optical signal is focused, and finally through an optical digital signal link 1708. In another embodiment, a signal may be transmitted from an optical digital signal link 1710, through a first lens 1714 where it is collimated, through a first transparent window 1706, through a second transparent window 1726, through a second lens 1722 where it is focused at or about a receiver 1732. Signals send by the transmitter 1730 or received by the receiver 1732 may be communicated to other parts of the system via electrical connections 1740, 1742,

1744, 1746. The optical digital signal connector may be powered at least in part by a power supply 1750. In addition to the paths an optical signal may take, the optical signal may traverse a gap between the first and second transparent windows if a gap is present. The distance between the optical digital signal link 1708, 1710 and the transmitter 1730 or receiver 1732 may measure at least about 250 μm and/or less than or equal to about 6 mm, at least about 0.5 mm and/or less than or equal to about 5 mm, or between about 1 mm and 4 mm. In one embodiment, the distance between the first transparent window 1704 and the second transparent window 1724 is reduced or minimized to decrease or minimize the distance between the optical digital signal links 1708, 1710 and the transmitter 1730 and receiver 1732.

Figures 17C, 17D:
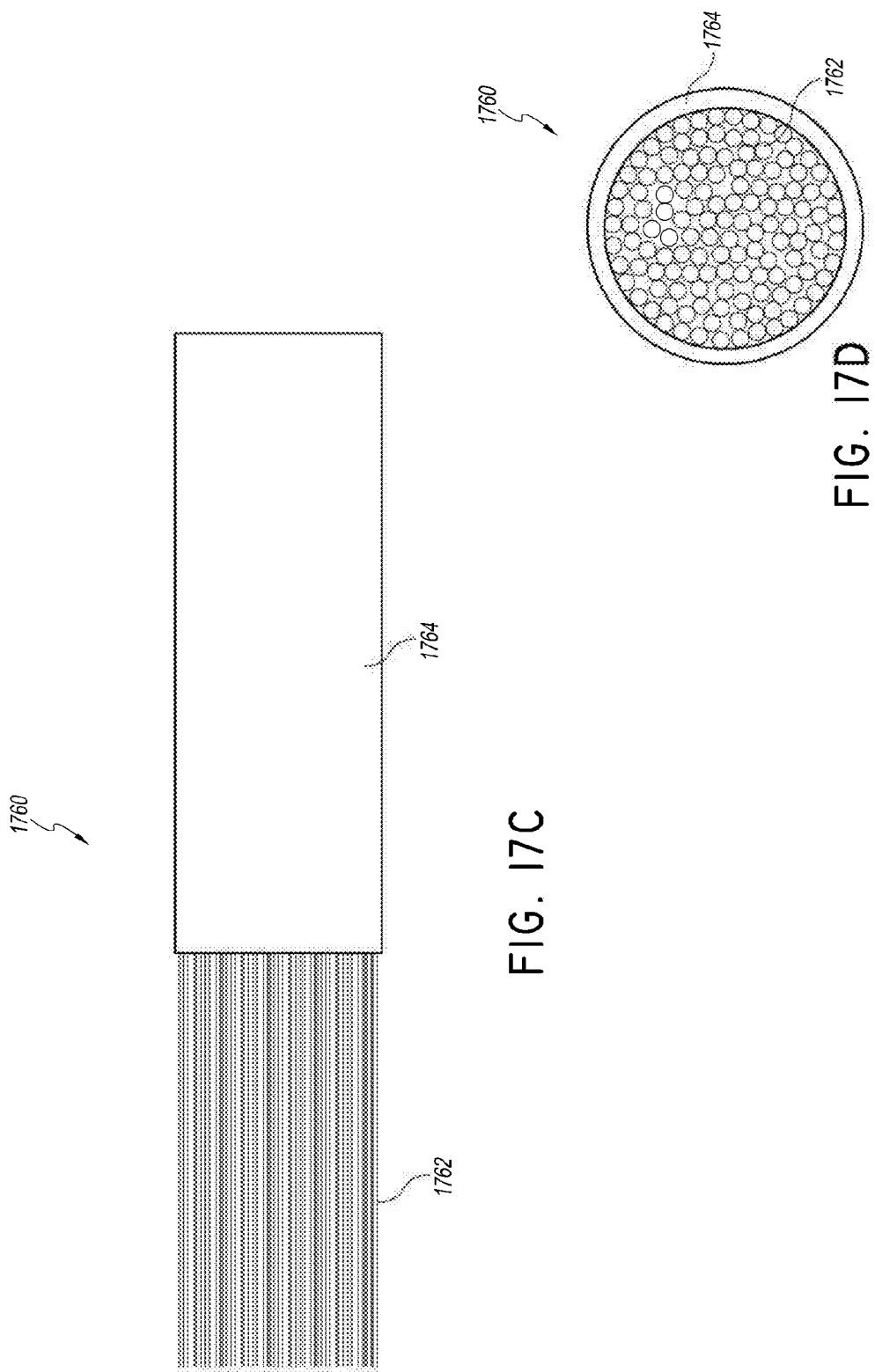
FIG. 17C illustrates a top view of an example fiber optic cable comprising a plurality of optical fibers in close proximity surrounded by a jacket wherein the fiber optic cable is capable of being bent in a relatively tight radius while maintaining sufficient signal across the cable.
FIG. 17D illustrates a front view of the example fiber optic cable illustrated in FIG. 17C.

FIG. 17C illustrates a top view of an example fiber optic cable 1760 comprising a plurality of optical fibers in close proximity surrounded by a jacket 1764 wherein the fiber optic cable 1760 is capable of being bent in a relatively tight radius while maintaining sufficient signal across the cable. A fiber optic cable 1760 that comprises a plurality of smaller fiber cables 1762 can be advantageous in a rugged environment because if one cable becomes damaged and unusable, a signal may still be transmitted through the remaining cables with relatively little decrease in signal strength. The bundle of cables 1760 acts as a multimode optical fiber and may be capable of transmitting a wide range of wavelength signals with adequate and relatively consistent transmission rates, as compared to other cables. In one embodiment, the transmittance rate, as measured from the visualization system 110 to the data processing system 112, may be at least about 500 Mbps and/or less than or equal to about 10 Gbps, at least about 1 Gbps and/or less than or equal to about 5 Gbps, or at least about 2 Gbps and/or less than or equal to about 4 Gbps. Additionally, as an illustrative example, the signal link 114 may have a divergence angle of between about 16 and about 30 degrees, which may be used to calculate the signal losses across the gap between portions of the optical digital signal link. For example, in some embodiments where there is about a 4 mm gap between the ends of the fiber bundles, a signal loss of about 94% may be experienced. The signal loss across the gap can be reduced by decreasing the distance between the elements and/or increasing a radius of a receiving fiber and/or reducing a radius of a transmitting fiber.

In general, the problem with decreased signal strength when a fiber optic cable is bent too far could theoretically be solved by increasing the power output. However, this may be disadvantageous in some implementations. First, the fiber cable may be used to transmit digital optical data as part of an intrapersonal data communication system. This system likely depends on a mobile power source and increasing the power output of the optical signal would very likely shorten the usable life of the power source and thus the overall performance of the system. Second, increasing the power output of the system may be harmful to the user. A fiber optic cable could inadvertently come loose from its connector. If the system does not have a fail-safe, to stop transmitting optical data when a connection becomes dislodged, the user may be harmed if the optical output of a fiber optic cable is inadvertently directed into the user's eyes. A system that uses a low power output may not require a fail-safe mode in order to protect the safety of the user in the event of a malfunctioning fiber cable.

FIG. 17D illustrates a front view of the example fiber optic cable 1760 illustrated in FIG. 17C. As shown, the end-view of a fiber optic cable 1760 comprises a plurality of smaller fibers 1762 that are relatively tightly packed and surrounded by a fairly robust jacket 1764. In one embodiment, the diameter of a single fiber cable 1762 of the plurality may measure at least about 10 μm and/or less than or equal to about 250 μm, at least about 20 μm and/or less than or equal to about 70 μm, or about 33 μm. In another embodiment, the diameter of the fiber optic cable 1760 (which comprises a plurality of smaller fibers 1762) may be at least about 30 μm and/or less than or equal to about 2 mm, at least about 500 μm and/or less than or equal to about 1.5 mm, or approximately 1 mm. In yet another embodiment, fiber optic cable 1760 (which comprises a plurality of smaller fibers 1762) may comprise less than or equal to about 2000 single fibers, less than or equal to about 1000 single fibers, or less than or equal to approximately 500 single fibers. In still another embodiment, the fiber optic cable 1760 comprises about 380 single fibers.

Example Embodiments

The following is a numbered list of example embodiments that are within the scope of this disclosure. The example embodiments that are listed should in no way be interpreted as limiting the scope of the embodiments. Various features of the example embodiments that are listed can be removed, added, or combined to form additional embodiments, which are part of this disclosure:

1. An intrapersonal data communication system for providing an optical digital signal link between two or more local devices, the system comprising:
   a first optical digital signal adapter having a first local device electrical data interface and a first optical data interface, wherein the first local device electrical data interface is configured to electrically connect to a first electrical data connector of a first local device, wherein the first optical data interface comprises a first optical transceiver configured to send and receive optical digital signals, and wherein the first optical digital signal adapter is configured to convert between electrical digital signals and optical digital signals;
   a non-contact optical connector configured to couple optical digital signals between the first optical data interface of the first optical digital signal adapter and a first end of the optical digital signal link across a gap;
   a second optical digital signal adapter having a second local device electrical data interface and a second optical data interface, wherein the second local device electrical data interface is configured to electrically connect to a second electrical data connector of a second local device, wherein the second optical data interface comprises a second optical transceiver configured to send and receive optical digital signals, and wherein the second optical digital signal adapter is configured to convert between electrical digital signals and optical digital signals; and
   a guide path configured to direct the optical digital signal link between the non-contact optical connector and the second optical data interface.

2. The system of embodiment 1, wherein the guide path is configured to direct the optical digital signal link entirely within a region near a body of a user of the intrapersonal communication system.

3. The system of embodiment 2, wherein the first local device comprises a visualization system configured to display information to the user.

4. The system of embodiment 2, wherein the first local device comprises a visualization system configured to generate information and display it to the user.

5. The system of embodiment 3, wherein the visualization system comprises an image sensor.

6. The system of embodiment 5, wherein the image sensor is configured to convert radiation within at least one of the ultraviolet, visible, near infrared, and short-wave infrared bands to electrical signals.

7. The system of embodiment 5, wherein the image sensor is configured to convert radiation having a wavelength between about 0.3 and 1.7 microns to electrical signals.

8. The system of embodiment 5, wherein the image sensor comprises a thermal imaging sensor.

9. The system of embodiment 5, wherein the image sensor comprises a multi-imaging sensor.

10. The system of embodiment 3, wherein the visualization system comprises a night-vision goggle.

11. The system of embodiment 10, wherein the night-vision goggle comprises an image intensifier tube.

12. The system of embodiment 10, wherein the night-vision goggle comprises an EBAPS.

13. The system of embodiment 5, wherein the second local device comprises a data processing system configured to analyze data obtained by the image sensor of the visualization system.

14. The system of embodiment 5, wherein the second local device comprises a data processing system configured to analyze data communicated to the data processing system from external sources.

15. The system of embodiment 1, wherein the second local device comprises a battery configured to provide electrical power to the intrapersonal communication system.

16. The system of embodiment 15, wherein the battery is configured to provide electrical power to the first local device.

17. The system of embodiment 1, further comprising a second non-contact optical connector configured to couple optical digital signals between the second optical data interface of the second optical digital signal adapter and a second end of the optical digital signal link across a second gap, wherein the second end of the optical digital signal link is opposite the first end.

18. The system of embodiment 1, further comprising a controller configured to direct electrical power to the first optical transceiver.

19. The system of embodiment 18, wherein the controller is configured to direct less than or equal to about 50 mW of electrical power to the first optical transceiver.

20. The system of embodiment 18, wherein the controller is configured to direct less than or equal to about 25 mW of electrical power to the first optical transceiver.

21. The system of embodiment 1, wherein the first optical transceiver is configured to operate at a transmission rate that is less than or equal to about 10 Gbps.

22. The system of embodiment 1, wherein the optical digital signal link comprises:
a radiation shield comprising an elongate tube having a metallic material layer;
one or more optical fibers disposed within the elongate tube with axes substantially parallel to an elongate axis of the shielding member; and
one or more insulated wires disposed within the elongate tube with axes substantially parallel to the elongate axis of the shielding member configured to transmit an electrical signal.

23. The system of embodiment 1, wherein the guide path is at least partially disposed within a helmet configured to be worn on a human head, the helmet comprising an inner padding connected to an exterior shell.

24. The system of embodiment 23, wherein the exterior shell comprises reinforced fibers.

25. The system of embodiment 24, wherein the reinforced fibers are aramid synthetic fibers selected from the group consisting of Kevlar® and Twaron®.

26. The system of embodiment 23, wherein the inner padding comprises high density foam.

27. The system of embodiment 26, wherein the high density foam is selected from the group consisting of expanded polystyrene, high density polyethylene, expanded polypropylene, and vinyl nitril.

28. The system of embodiment 1, wherein the guide path comprises retaining members configured to substantially secure the optical digital signal link to a piece of headgear.

29. The system of embodiment 1, wherein the guide path comprises an elongate tube configured to permit the optical digital signal link to fit within the elongate tube.

30. The system of embodiment 23, wherein the guide path comprises a path between an interior portion of the exterior shell and a portion of the inner padding adjacent to the interior portion of the exterior shell.

31. The system of embodiment 3, wherein the first optical digital signal adapter is disposed within a housing separate from the visualization system.

32. The system of embodiment 13, wherein the second optical digital signal adapter is disposed within a housing separate from the data processing system.

33. The system of embodiment 1, wherein:
the first optical digital signal adapter further comprises a visualization receiver, the visualization receiver configured to produce an output electrical voltage or current corresponding to an input level of radiation;
the first optical digital signal adapter is further configured to convert a processing output optical digital signal to a visualization input electrical digital signal.

34. The system of embodiment 1, wherein the optical digital signal link is less than or equal to 1 m in length.

35. The system of embodiment 1, wherein the optical digital signal link is less than or equal to 30 cm in length.

36. The system of embodiment 1, further comprising a mount interface configured to substantially secure the first local device to a headgear system.

37. The system of embodiment 36, wherein the mount interface is releasably attached to the headgear system with fasteners.

38. The system of embodiment 1, wherein the first optical transceiver comprises a transmitter and a receiver.

39. The system of embodiment 38, wherein the transmitter comprises a vertical cavity surface emitting laser.

40. The system of embodiment 38, wherein the receiver comprises a photodiode.

41. The system of embodiment 38, wherein the transmitter and the receiver are spatially separated.

42. A connector having a system signal converter, the connector comprising:
a system surface of the connector configured to releasably mate with a complementary connector on a local device,
a plurality of system connector pins disposed on the system surface, the plurality of connector pins comprising:
a system power connector pin configured to transmit an electrical voltage,
a system return connector pin configured to transmit an electrical voltage, and
a digital signal output pin configured to transmit a system output electrical digital signal;
a system signal converter disposed within the connector, the system signal converter comprising:

a radiation source electrically coupled to a controller, the controller configured to control an output level of radiation from the radiation source corresponding to a transmitter input signal;

a link surface of the connector configured to releasably mate with a complementary connector on an optical digital signal link;

a plurality of connector pins disposed on the link surface, the plurality of connector pins comprising:
- a link power connector pin electrically coupled with the system power connector pin, the link power connector pin configured to transmit an electrical voltage, and
- a link return connector pin electrically coupled with the system return connector pin, the link return connector pin configured to transmit an electrical voltage; and a collimator configured to substantially collimate the radiation output, wherein the collimator is disposed within a cavity having a depth of between about 0.25 mm and about 1 mm from the link surface of the connector.

43. The connector of embodiment 42, wherein the plurality of connector pins further comprise a second digital signal output pin configured to transmit a second system output electrical digital signal.

44. The connector of embodiment 43 further comprising a multiplexor configured to create an output multiplexed digital signal from the system output electrical digital signal and the second system output electrical digital signal, wherein the transmitter input signal is the output multiplexed digital signal.

45. The connector of embodiment 42, further comprising:
a lens configured to focus a link input optical digital signal onto a fiber optic receiver, the fiber optic receiver configured to produce a system input electrical digital signal, the fiber optic receiver comprising:
- a photodetector configured to produce an electrical current corresponding to the link input optical digital signal,
- a transimpedance amplifier configured to convert the electrical current produced by the photodector to an electrical voltage, and
- a limiting amplifier configured to limit the electrical voltage to a limiting range of voltages;

wherein the lens is disposed within a cavity extending between about 0.25 mm and 1 mm from the link surface of the connector towards the interior of the connector.

46. The connector of embodiment 45 further comprising a demultiplexor configured to create a first and second output demultiplexed digital signal from the system input electrical digital signal.

47. A optical digital signal bridge comprising:
a first portion of an optical digital signal cable, the optical digital signal cable comprising:
- an elongate tube comprising an insulating layer and a radiation shield,
- a power line configured to transmit an electrical voltage or current, the power line disposed within the elongate tube,
- a return line configured to transmit an electrical voltage or current, the return line disposed within the elongate tube, and
- an optical fiber configured to transmit an optical digital signal, the optical fiber disposed within the elongate tube;

a first surface of a first connector interface wherein the proximal end of the first portion of the optical signal cable is coupled to the first surface of the first connector interface;

a second surface of the first connector interface, the second surface comprising:
- a plurality of connector pins disposed on the second surface, the plurality of connector pins comprising a power connector pin and a return connector pin,
- a cavity, and
- a guide configured to align a second connector interface with the first connector interface; and a collimator configured to collimate radiation from the optical fiber, the collimator being disposed within the cavity between about 0.25 mm and 1 mm from the second surface;

wherein the power line is electrically coupled to the power connector pin, the return line is electrically coupled to the return connector pin, and the optical fiber is optically coupled to the collimator.

48. The optical digital signal bridge of embodiment 47, wherein:
the optical digital signal cable further comprises:
- a redundant power line configured to transmit an electrical voltage or current, the redundant power line disposed within the elongate tube,
- a redundant return line configured to transmit an electrical voltage or current, the redundant return line disposed within the elongate tube, and
- a second optical fiber configured to transmit a second optical digital signal, the second optical fiber disposed within the elongate tube;

the second surface further comprises a second cavity;
the plurality of connector pins further comprises a redundant power connector pin and a redundant return connector pin;
the optical digital signal bridge further comprises a second collimator for collimating radiation from the second optical fiber, the second collimator being disposed within the second cavity between about 0.25 mm and 1 mm from the second surface; and
the redundant power line is electrically coupled to the redundant power connector pin, the redundant return line is electrically coupled to the redundant return connector pin, and the second optical fiber is optically coupled to the second collimator.

49. A method for transmitting information between two or more local devices, the method comprising:
receiving information from a first local device;
encoding the information received from the first local device into a first electrical digital signal;
converting the first electrical digital signal to a first optical digital signal;
coupling the first optical digital signal to an optical digital signal link;
transmitting the first optical digital signal over the optical digital signal link;
coupling the first optical digital signal to a signal converter;
converting the first optical digital signal to a second electrical digital signal
wherein the second electrical digital signal contains substantially the same information as the first electrical digital signal;
decoding the second electrical digital signal; and
processing the decoded information from the first local device in a second local device, wherein:
the transmission of the information between the first and second local devices consumes less than or equal to about 500 mW of power from a power source, and
the rate of transmission of the information is less than or equal to about 10 Gb/s.

50. The method of embodiment 49, further comprising relaying the information across a non-contact optical connector wherein the non-contact optical connector comprises a collimator for collimating the optical digital signal and a gap between the collimator and a surface of the non-contact optical connector.

51. The method of embodiment 49, wherein the information comprises uncompressed video data.

52. The method of embodiment 49, wherein the information comprises compressed video data.

53. The method of embodiment 49, wherein the information comprises thermal data.

54. The method of embodiment 49, wherein the information comprises multi-imaging sensor video data.

55. A method for connecting an interference-resistant cable to a headgear system, the method comprising:
provproviding a headgear system comprising a visualization system and a data processing system;
modifying the headgear system such that a path is created between the visualization system and the data processing system for the interference-resistant cable; and
putting the interference-resistant cable in the headgear system to create a communication link between the visualization system and the data processing system.

56. The method of embodiment 55, wherein the interference-resistant cable comprises:
an elongate tube comprising a metallic layer and an insulation layer; and
an optical fiber disposed within the elongate tube.

57. The method of embodiment 55, wherein the headgear system comprises a helmet comprising an exterior shell connected to an inner padding.

58. The method of embodiment 55, wherein modifying the headgear system comprises creating a path from the visualization system to the data processing system, the path being disposed between the exterior shell and the inner padding.

CONCLUSION

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments. As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z each to be present.

Depending on the embodiment, certain acts, events, or functions of any of the processes or algorithms described herein can be performed in a different sequence, may be added, merged, or left out altogether. Thus, in certain embodiments, not all described acts or events are necessary for the practice of the processes. Moreover, in certain embodiments, acts or events may be performed concurrently, e.g., through multi-threaded processing, interrupt processing, or via multiple processors or processor cores, rather than sequentially.

It should be appreciated that in the above description of embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim require more features than are expressly recited in that claim. Moreover, any components, features, or steps illustrated and/or described in a particular embodiment herein can be applied to or used with any other embodiment(s). Thus, it is intended that the scope of the inventions herein disclosed should not be limited by the particular embodiments described above, but should be determined only by a fair reading of the claims that follow.

What is claimed is:

1. Mounting hardware for a visualization system, the mounting hardware configured to engage with a helmet mount to secure the mounting hardware to a helmet and adjustably position the visualization system in front of an eye of a user wearing the helmet, the mounting hardware comprising:
a mounting plate configured to abut the helmet mount when engaged with the helmet mount;
an optical connector comprising a cavity in the mounting plate and a transparent window within the cavity;
a fiber optic cable at least partially contained within the mounting plate, the fiber optic cable having an end that is adjacent to the transparent window in the cavity of the optical connector such that an optical signal transmitted through the fiber optic cable passes through the transparent window;
an electrical connector on an exterior surface of the mounting plate; and
an electrical cable at least partially contained within the mounting plate, the electrical cable electrically coupled to the electrical connector,
wherein, when engaged with the helmet mount, the optical connector is aligned with a corresponding optical connector on the helmet mount and the electrical connector is aligned with a corresponding electrical connector on the helmet mount, and
wherein the fiber optic cable has a first cross-section at a first distance from the optical connector and a second cross-section at a second distance from the optical connector, the second distance being closer to the optical connector than the first distance and the second cross-section being smaller than the first cross-section.

2. The mounting hardware of claim 1, wherein the end of the fiber optic cable is between 0.25 mm and 6 mm from an end of an optical digital signal link in the helmet mount.

3. The mounting hardware of claim 1, wherein the end of the fiber optic cable abuts the transparent window.

4. The mounting hardware of claim 1, wherein the end of the fiber optic cable is compressed to decrease the cross-section of the fiber optic cable.

5. The mounting hardware of claim 1, wherein the first cross-section has a diameter that is between 1 mm and 2 mm.

6. The mounting hardware of claim 1, wherein the optical connector further comprises a seal which contacts a corresponding seal on the helmet mount when engaged with the helmet mount, wherein the contact between the mounting hardware seal and the helmet mount seal substantially prevents material from becoming lodged between the corresponding optical connectors.

7. The mount interface of claim 1, wherein the fiber optic cable is configured to be bent at a radius between 2 mm and 20 mm and maintain integrity of data contained in the optical digital signal.

8. The mounting hardware of claim 1, wherein the fiber optic cable comprises a multistrand fiber optic cable grouped tightly together and surrounded by a jacket, wherein each of the component multistrand fiber optic cables has a cross-section with a diameter that is less than 0.2 mm, and wherein a diameter of a cross-section of the fiber optic cable is less than 2 mm.

9. A mount interface coupled to a headgear system, the mount interface configured to engage with mounting hardware to secure a local device to the headgear system, the mount interface comprising:
 a mounting plate configured to abut with a corresponding surface on the mounting hardware to secure the mounting hardware to the headgear system;
 an optical connector comprising a cavity in the mounting plate and a transparent window within the cavity;
 a fiber optic cable at least partially contained within the mounting plate, the fiber optic cable configured to transmit an optical signal;
 a redirection element contained within the mounting plate, the redirection element configured to redirect a path of the optical signal leaving an end of the fiber optic cable to the transparent window or to redirect a path of an optical signal transmitted through the transparent window to the end of the fiber optic cable;
 an electrical connector on an exterior surface of the mounting plate; and
 an electrical cable at least partially contained within the mounting plate, the electrical cable electrically coupled to the electrical connector,
 wherein, when engaged with the mounting hardware, the optical connector is aligned with a corresponding optical connector on the mounting hardware and the electrical connector is aligned with a corresponding electrical connector on the mounting hardware.

10. The mount interface of claim 9, wherein the local device is a battery pack.

11. The mount interface of claim 9, wherein the redirection element redirects the path of the optical signal at an angle between least 22.5 degrees and 180 degrees.

12. The mount interface of claim 11, wherein the redirection element redirects the path of the optical signal to be orthogonal to an incoming path.

13. The mount interface of claim 9, wherein the redirection element comprises a mirror.

14. The mount interface of claim 9, wherein the redirection element comprises a prism.

15. The mount interface of claim 9, wherein the fiber optic cable is configured to be bent at a radius between 2 mm and 20 mm and maintain integrity of data contained in the optical digital signal.

16. The mounting hardware of claim 9, wherein the fiber optic cable comprises a multistrand fiber optic cable grouped tightly together and surrounded by a jacket, wherein each of the component multistrand fiber optic cables has a cross-section with a diameter that is less than 0.2 mm, and wherein a diameter of a cross-section of the fiber optic cable is less than 2 mm.

17. An optical digital signal bridge for use in a headgear system to direct optical digital signals from a local device to a fiber optic bundle, the optical digital signal bridge comprising:
 a housing;
 a cavity in the housing;
 a transparent window within the cavity;
 an optical element within the cavity, the optical element having an optical power greater than 0; and
 a fiber optic bundle comprising a multistrand fiber optic cable grouped tightly together and surrounded by a jacket, wherein each of the component multistrand fiber optic cables has a cross-section with a diameter that is less than 0.2 mm, and wherein a diameter of a cross-section of the fiber optic cable is less than 2 mm;
 wherein the optical element is configured to focus an optical digital signal onto an end of the fiber optic bundle, and
 wherein a path of the fiber optic bundle within the housing changes direction by about 90 degrees, the fiber optic bundle having a bend radius of curvature of between 2 mm and 20 mm.

18. The optical digital signal bridge of claim 17, wherein the fiber optic bundle is configured to be bent at a radius between 2 mm and 20 mm and maintain integrity of data contained in the optical digital signal.

19. The optical digital signal bridge of claim 17, wherein the fiber optic bundle is configured to provide a transmittance rate of up to 5 Gbps.

20. The optical digital signal bridge of claim 17, wherein the local device is a battery pack.

* * * * *